(12) United States Patent
Fisher et al.

(10) Patent No.: US 9,412,041 B1
(45) Date of Patent: Aug. 9, 2016

(54) RETINAL APPARATUS AND METHODS

(75) Inventors: Dimitry Fisher, San Diego, CA (US); Eugene M. Izhikevich, San Diego, CA (US); Marius Buibas, San Diego, CA (US); Botond Szatmary, San Diego, CA (US)

(73) Assignee: Brain Corporation, San Diego, CA (US)

(*) Notice: Subject to any disclaimer, the term of this patent is extended or adjusted under 35 U.S.C. 154(b) by 1033 days.

(21) Appl. No.: 13/539,142

(22) Filed: Jun. 29, 2012

(51) Int. Cl.
*G06K 9/00* (2006.01)
*G06K 9/60* (2006.01)
*G06N 3/063* (2006.01)

(52) U.S. Cl.
CPC ............... *G06K 9/605* (2013.01); *G06N 3/063* (2013.01)

(58) Field of Classification Search
CPC .............................. G06N 3/063; G06K 9/605
USPC ........................................................... 348/62
See application file for complete search history.

(56) References Cited

U.S. PATENT DOCUMENTS

| | | |
|---|---|---|
| 5,063,603 A | 11/1991 | Burt |
| 5,138,447 A | 8/1992 | Shen |
| 5,216,752 A | 6/1993 | Tam |
| 5,216,757 A | 6/1993 | Dorkin |
| 5,271,535 A | 12/1993 | Fridman et al. |
| 5,272,535 A | 12/1993 | Elabd |
| 5,355,435 A | 10/1994 | DeYong |
| 5,638,359 A | 6/1997 | Peltola |
| 5,652,594 A | 7/1997 | Costas |
| 5,673,367 A | 9/1997 | Buckley |
| 5,875,108 A | 2/1999 | Hoffberg |
| 5,997,539 A | 12/1999 | Errico et al. |
| 6,009,418 A | 12/1999 | Cooper |
| 6,014,653 A | 1/2000 | Thaler |
| 6,035,389 A | 3/2000 | Grochowski |

(Continued)

FOREIGN PATENT DOCUMENTS

| CN | 102226740 | 10/2011 |
|---|---|---|
| EP | 1089436 A2 | 4/2001 |

(Continued)

OTHER PUBLICATIONS

Masquelier, Timothee. 'Relative spike time coding and STDP-based orientation selectivity in the early visual system in natural continuous and saccadic vision: a computational model.' Journal of computational neuroscience 32.3 (2012): 425-441.*

(Continued)

*Primary Examiner* — Jeffery Williams
(74) *Attorney, Agent, or Firm* — Gazdzinski & Associates, PC

(57) ABSTRACT

Artificial retina may be implemented. A retinal apparatus may comprise an input pixel layer, hidden photoreceptive layer, an output neuron layer, and/or other components. Individual cones of the photoreceptive layer may be configured to receive input stimulus from one or more cones within the cone circle of confusion. The cone dynamic may be described using a diffusive state equation characterized by two variables configured to represent membrane voltage and current. Diffusive horizontal coupling of neighboring cones may effectuate non-separable spatiotemporal response that is configured to respond to contrast reversing and/or coherent moving stimulus. The photoreceptive layer high-pass filtered output may facilitate contrast detection by suppressing time-invariant component of the input and reducing sensitivity of the retina to the static inputs.

23 Claims, 24 Drawing Sheets

(56) References Cited

U.S. PATENT DOCUMENTS

| | | |
|---|---|---|
| 6,169,981 B1 | 1/2001 | Werbos |
| 6,418,424 B1 | 7/2002 | Hoffberg |
| 6,458,157 B1 | 10/2002 | Suaning |
| 6,509,854 B1 | 1/2003 | Morita |
| 6,532,454 B1 | 3/2003 | Werbos |
| 6,545,705 B1 | 4/2003 | Sigel |
| 6,545,708 B1 | 4/2003 | Tamayama |
| 6,546,291 B2 | 4/2003 | Merfeld |
| 6,581,046 B1 | 6/2003 | Ahissar |
| 6,601,049 B1 | 7/2003 | Cooper |
| 6,625,317 B1 | 9/2003 | Gaffin |
| 6,917,925 B2 | 7/2005 | Berenji et al. |
| 7,054,850 B2 | 5/2006 | Matsugu |
| 7,565,203 B2 | 7/2009 | Greenberg et al. |
| 7,580,907 B1 | 8/2009 | Rhodes |
| 7,639,886 B1 | 12/2009 | Rastogi |
| 7,653,255 B2 | 1/2010 | Rastogi |
| 7,737,933 B2 | 6/2010 | Yamano |
| 7,765,029 B2 | 7/2010 | Fleischer et al. |
| 7,849,030 B2 | 12/2010 | Ellingsworth |
| 8,000,967 B2 | 8/2011 | Taleb |
| 8,015,130 B2 | 9/2011 | Matsugu |
| 8,103,602 B2 | 1/2012 | Izhikevich |
| 8,154,436 B2 | 4/2012 | Szajnowski |
| 8,160,354 B2 | 4/2012 | Paquier |
| 8,200,593 B2 | 6/2012 | Guillen |
| 8,281,997 B2 | 10/2012 | Moran et al. |
| 8,311,965 B2 | 11/2012 | Breitwisch |
| 8,315,305 B2 | 11/2012 | Petre |
| 8,346,692 B2 | 1/2013 | Rouat et al. |
| 8,390,707 B2 | 3/2013 | Yamashita |
| 8,416,847 B2 | 4/2013 | Roman |
| 8,467,623 B2 | 6/2013 | Izhikevich |
| 8,515,160 B1 | 8/2013 | Khosla et al. |
| 8,583,286 B2 | 11/2013 | Fleischer et al. |
| 8,655,815 B2 | 2/2014 | Palmer et al. |
| 8,712,939 B2 | 4/2014 | Szatmary et al. |
| 8,712,941 B2 | 4/2014 | Izhikevich et al. |
| 8,719,199 B2 | 5/2014 | Izhikevich et al. |
| 8,725,658 B2 | 5/2014 | Izhikevich et al. |
| 8,725,662 B2 | 5/2014 | Izhikevich et al. |
| 8,756,183 B1 | 6/2014 | Daily et al. |
| 8,775,341 B1 | 7/2014 | Commons |
| 8,793,205 B1 | 7/2014 | Fisher et al. |
| 8,817,094 B1* | 8/2014 | Brown ............... H04N 7/188 348/143 |
| 8,943,008 B2 | 1/2015 | Ponulak et al. |
| 8,972,315 B2 | 3/2015 | Szatmary et al. |
| 8,977,582 B2 | 3/2015 | Richert |
| 8,983,216 B2 | 3/2015 | Izhikevich et al. |
| 8,990,133 B1 | 3/2015 | Ponulak et al. |
| 8,996,177 B2 | 3/2015 | Coenen |
| 2002/0038294 A1 | 3/2002 | Matsugu |
| 2003/0050903 A1 | 3/2003 | Liaw |
| 2003/0216919 A1 | 11/2003 | Roushar |
| 2003/0222987 A1 | 12/2003 | Karazuba |
| 2004/0054964 A1 | 3/2004 | Bozdagi |
| 2004/0064609 A1 | 4/2004 | Sanma et al. |
| 2004/0066363 A1 | 4/2004 | Yamano et al. |
| 2004/0136439 A1 | 7/2004 | Dewberry |
| 2004/0170330 A1 | 9/2004 | Fogg |
| 2004/0193670 A1 | 9/2004 | Langan |
| 2004/0220082 A1 | 11/2004 | Surmeier et al. |
| 2005/0015351 A1 | 1/2005 | Nugent |
| 2005/0036649 A1 | 2/2005 | Yokono |
| 2005/0096539 A1 | 5/2005 | Leibig |
| 2005/0261803 A1 | 11/2005 | Seth et al. |
| 2005/0271289 A1 | 12/2005 | Rastogi |
| 2005/0283450 A1 | 12/2005 | Matsugu |
| 2006/0094001 A1 | 5/2006 | Torre |
| 2006/0129728 A1 | 6/2006 | Hampel |
| 2006/0161218 A1 | 7/2006 | Danilov |
| 2007/0022068 A1 | 1/2007 | Linsker |
| 2007/0176643 A1 | 8/2007 | Nugent |
| 2007/0208678 A1 | 9/2007 | Matsugu |
| 2008/0024345 A1 | 1/2008 | Watson |
| 2008/0100482 A1 | 5/2008 | Lazar |
| 2008/0162391 A1 | 7/2008 | Izhikevich |
| 2008/0174700 A1 | 7/2008 | Takaba |
| 2008/0199072 A1 | 8/2008 | Kondo |
| 2008/0201282 A1 | 8/2008 | Garcia et al. |
| 2008/0237446 A1 | 10/2008 | Oshikubo |
| 2008/0316362 A1* | 12/2008 | Qiu ............... H04N 19/159 348/607 |
| 2009/0043722 A1 | 2/2009 | Nugent |
| 2009/0043777 A1 | 2/2009 | Wyler et al. |
| 2009/0287624 A1 | 11/2009 | Rouat |
| 2010/0036457 A1 | 2/2010 | Sarpeshkar |
| 2010/0081958 A1 | 4/2010 | She |
| 2010/0086171 A1 | 4/2010 | Lapstun |
| 2010/0100482 A1 | 4/2010 | Hardt |
| 2010/0166320 A1 | 7/2010 | Paquier |
| 2010/0198765 A1 | 8/2010 | Fiorillo |
| 2010/0225824 A1 | 9/2010 | Lazar |
| 2010/0235310 A1 | 9/2010 | Gage |
| 2010/0299296 A1 | 11/2010 | Modha |
| 2011/0016071 A1 | 1/2011 | Guillen |
| 2011/0119214 A1 | 5/2011 | Breitwisch |
| 2011/0119215 A1 | 5/2011 | Elmegreen |
| 2011/0134242 A1 | 6/2011 | Loubser |
| 2011/0137843 A1 | 6/2011 | Poon |
| 2011/0160741 A1 | 6/2011 | Asano |
| 2011/0184556 A1 | 7/2011 | Seth et al. |
| 2011/0206122 A1 | 8/2011 | Lu |
| 2011/0235698 A1 | 9/2011 | Petre et al. |
| 2012/0011090 A1 | 1/2012 | Tang |
| 2012/0011093 A1 | 1/2012 | Aparin et al. |
| 2012/0036099 A1 | 2/2012 | Venkatraman et al. |
| 2012/0083982 A1 | 4/2012 | Bonefas |
| 2012/0084240 A1 | 4/2012 | Esser |
| 2012/0109863 A1 | 5/2012 | Esser et al. |
| 2012/0109866 A1 | 5/2012 | Modha |
| 2012/0117012 A1 | 5/2012 | Szatmary et al. |
| 2012/0303091 A1 | 11/2012 | Izhikevich |
| 2012/0308076 A1 | 12/2012 | Piekniewski |
| 2012/0308136 A1 | 12/2012 | Izhikevich |
| 2012/0330872 A1 | 12/2012 | Esser et al. |
| 2013/0019325 A1 | 1/2013 | Deisseroth et al. |
| 2013/0046716 A1 | 2/2013 | Chan et al. |
| 2013/0073080 A1 | 3/2013 | Ponulak |
| 2013/0073484 A1 | 3/2013 | Izhikevich |
| 2013/0073491 A1 | 3/2013 | Izhikevich |
| 2013/0073492 A1 | 3/2013 | Izhikevich |
| 2013/0073493 A1 | 3/2013 | Modha |
| 2013/0073495 A1 | 3/2013 | Izhikevich |
| 2013/0073496 A1 | 3/2013 | Szatmary |
| 2013/0073498 A1 | 3/2013 | Izhikevich |
| 2013/0073499 A1 | 3/2013 | Izhikevich |
| 2013/0073500 A1 | 3/2013 | Szatmary |
| 2013/0103626 A1 | 4/2013 | Hunzinger |
| 2013/0117212 A1 | 5/2013 | Hunzinger et al. |
| 2013/0151450 A1 | 6/2013 | Ponulak |
| 2013/0204814 A1 | 8/2013 | Hunzinger et al. |
| 2013/0204820 A1 | 8/2013 | Hunzinger et al. |
| 2013/0218821 A1 | 8/2013 | Szatmary |
| 2013/0251278 A1 | 9/2013 | Izhikevich |
| 2013/0297539 A1 | 11/2013 | Piekniewski |
| 2013/0297541 A1 | 11/2013 | Piekniewski |
| 2013/0297542 A1 | 11/2013 | Piekniewski |
| 2013/0304683 A1 | 11/2013 | Lo |
| 2013/0325766 A1 | 12/2013 | Petre |
| 2013/0325768 A1 | 12/2013 | Sinyavskiy |
| 2013/0325773 A1 | 12/2013 | Sinyavskiy |
| 2013/0325774 A1 | 12/2013 | Sinyavskiy |
| 2013/0325775 A1 | 12/2013 | Sinyavskiy |
| 2013/0325777 A1 | 12/2013 | Petre |
| 2014/0012788 A1 | 1/2014 | Piekniewski |
| 2014/0016858 A1 | 1/2014 | Richert |
| 2014/0025613 A1 | 1/2014 | Ponulak |
| 2014/0032458 A1 | 1/2014 | Sinyavskiy |
| 2014/0032459 A1 | 1/2014 | Sinyavskiy |
| 2014/0052679 A1 | 2/2014 | Sinyavskiy |
| 2014/0064609 A1 | 3/2014 | Petre |
| 2014/0089232 A1 | 3/2014 | Buibas et al. |

(56) References Cited

U.S. PATENT DOCUMENTS

| | | |
|---|---|---|
| 2014/0122397 A1 | 5/2014 | Richert |
| 2014/0122398 A1 | 5/2014 | Richert |
| 2014/0122399 A1 | 5/2014 | Szatmary |
| 2014/0122400 A1 | 5/2014 | Szatmary et al. |
| 2014/0156574 A1 | 6/2014 | Piekniewski |
| 2014/0193066 A1 | 7/2014 | Richert |
| 2014/0222739 A1 | 8/2014 | Ponulak |
| 2014/0310220 A1 | 10/2014 | Chang et al. |
| 2014/0379623 A1 | 12/2014 | Piekniewski |
| 2015/0005937 A1 | 1/2015 | Ponulak |
| 2015/0120626 A1 | 4/2015 | Gupta et al. |

FOREIGN PATENT DOCUMENTS

| | | |
|---|---|---|
| JP | 4087423 | 3/1992 |
| RU | 2108612 | 10/1998 |
| RU | 2406105 C2 | 12/2010 |
| RU | 2424561 C2 | 7/2011 |
| WO | 2008083335 | 7/2008 |
| WO | 2008132066 A1 | 11/2008 |

OTHER PUBLICATIONS

Paugam-Moisy et al. 'Computing with spiking neuron networks.' Handbook of Natural Computing, 40 p. Springer, Heidelberg (2009).

Lazar et al. 'Consistent recovery of sensory stimuli encoded with MIMO neural circuits.' Computational intelligence and neuroscience (2010): 2.

Lazar et al. 'Multichannel time encoding with integrate-and-fire neurons.' Neurocomputing 65 (2005): 401-407.

Cessac et al. 'Overview of facts and issues about neural coding by spikes.' Journal of Physiology, Paris 104.1 (2010): 5.

Wang 'The time dimension for scene analysis.' Neural Networks, IEEE Transactions on 16.6 (2005): 1401-1426.

Masquelier, Timothee. 'Relative spike time coding and STOP-based orientation selectivity in the early visual system in natural continuous and saccadic vision: a computational model.' Journal of computational neuroscience 32.3 (2012): 425-441.

Gollisch et al. 'Rapid neural coding in the retina with relative spike latencies.' Science 319.5866 (2008): 11 08-1111.

Dorval et al. 'Probability distributions of the logarithm of inter-spike intervals yield accurate entropy estimates from small datasets.' Journal of neuroscience methods 173.1 (2008): 129.

Sato et al., 'Pulse interval and width modulation for video transmission.' Cable Television, IEEE Transactions on 4 (1978): 165-173.

Lazar et al. 'A video time encoding machine', in Proceedings of the 15th IEEE International Conference on Image Processing (ICIP '08}, 2008, pp. 717-720.

Gluck, Stimulus Generalization and Representation in Adaptive Network Models of Category Learning [online], 1991 [retrieved on Aug. 24, 2013]. Retrieved from the Internet:<URL:http://www.google.com/url?sa=t&rct=j&q=Giuck+%22STIMULUS+G ENERALIZATION+AND+REPRESENTATIO N=I N+ADAPTIVE+N ETWORK+MODELS+OF+CATEGORY+LEARN I NG%22+ 1991.

Froemke et al., Temporal modulation of spike-timing-dependent plasticity, Frontiers in Synaptic Neuroscience, vol. 2, Article 19, pp. 1-16 [online] Jun. 2010 [retrieved on Dec. 16, 2013]. Retrieved from the internet: <frontiersin.org>.

Berkes et al., Slow feature analysis yields a rich repertoire of complex cell properties. Journal of Vision (2005) vol. 5 (6).

Field et al., Information Processing in the Primate Retina: Circuitry and Coding. Annual Review of Neuroscience, 2007, 30(1), 1-30.

Fiete et al. Spike-Time-Dependent Plasticity and Heterosynaptic Competition Organize Networks to Produce Long Scale-Free Sequences of Neural Activity. Neuron 65, Feb. 25, 2010, pp. 563-576.

Foldiak, Learning invariance from transformation sequences. Neural Computation, 1991, 3(2), 194-200.

Gerstner et al., (1996) A neuronal learning rule for sub-millisecond temporal coding. Nature vol. 383 (6595) pp. 76-78.

Hopfield, (1995) Pattern recognition computation using action potential timing for stimulus representation. Nature 376: 33-36.

Izhikevich et al., (2009) Polychronous Wavefront Computations. International Journal of Bifurcation and Chaos, 19:1733-1739.

Izhikevich, (2004) Which Model to Use for Cortical Spiking Neurons? IEEE Transactions on Neural Networks, 15:1063-1070.

Izhikevich, (2007) Dynamical Systems in Neuroscience: The Geometry of Excitability and Bursting, The MIT Press, 2007.

Janowitz et al., Excitability changes that complement Hebbian learning. Network, Computation in Neural Systems, 2006, 17 (1), 31-41.

Knoblauch et al. Memory Capacities for Synaptic and Structural Plasticity, Neural Computation 2009, pp. 1-45.

Masquelier et al., Learning to recognize objects using waves of spikes and Spike Timing-Dependent Plasticity. Neural Networks (IJCNN), The 2010 International Joint Conference on DOI—10.1109/IJCNN. 2010.5596934 (2010) pp. 1-8.

Meister, Multineuronal codes in retinal signaling. Proceedings of the National Academy of sciences. 1996, 93, 609-614.

Meister et al., The neural code of the retina, Neuron. 1999, 22, 435-450.

Oster et al., A Spike-Based Saccadic Recognition System. ISCAS 2007. IEEE International Symposium on Circuits and Systems, 2009, pp. 3083-3086.

Rekeczky et al., "Cellular Multiadaptive Analogic Architecture: A Computational Framework for UAV Applications." May 2004.

Revow et al., 1996, Using Generative Models for Handwritten Digit Recognition, IEEE Trans. on Pattern Analysis and Machine Intelligence, 18, No. 6, Jun. 1996.

Sanchez, Efficient Simulation Scheme for Spiking Neural Networks, Doctoral Thesis, Universita di Granada Mar. 28, 2008, pp. 1-104.

Schnitzer et al., Multineuronal Firing Patterns in the Signal from Eye to Brain Neuron, 2003, 37, 499-511.

Serrano-Gotarredona et al, "On Real-Time: AER 2-D Convolutions Hardware for Neuromorphic Spike-based Cortical Processing", Jul. 2008.

Szatmary et al., (2010) Spike-Timing Theory of Working Memory. PLoS Computational Biology, 6(8): e1000879

Thomas et al., 2004, Realistic Modeling of Simple and Complex Cell Tuning in the HMAX Model, and Implications for Invariant Object Recognition in Cortex, Al Memo 2004-017 Jul. 2004

Thorpe, Ultra-Rapid Scene Categorization with a Wave of Spikes. In H.H. Bulthoff et al. (eds.), Biologically Motivated Computer Vision, Lecture Notes in Computer Science, 2002, 2525, pp. 1-15, Springer-Verlag, Berlin.

Thorpe et al., (2001). Spike-based strategies for rapid processing. Neural Networks 14, pp. 715-725.

Thorpe et al., (2004). SpikeNet: real-time visual processing with one spike per neuron. Neurocomputing, 58-60, pp. 857-864.

Van Rullen et al., Rate Coding versus temporal order coding: What the Retinal ganglion cells tell the visual cortex. Neural computation, 2001, 13, 1255-1283.

Van Rullen et al., (2003). Is perception discrete or continuous? Trends in Cognitive Sciences 7(5), pp. 207-213.

Van Rullen et al., (2005). Spike times make sense. Trends in Neurosciences 28(1).

Wallis et al., A model of invariant object recognition in the visual system. Progress in Neurobiology. 1997, 51, 167-194.

Wiskott et al., Slow feature analysis: Unsupervised learning of invariances Neural Computation, 2002, 14, (4), 715-770.

Zarandy et al., "Bi-i: A Standalone Ultra High Speed Cellular Vision System", Jun. 2005.

Bohte, "Spiking Nueral Networks" Doctorate at the University of Leiden, Holland, Mar. 5, 2003, pp. 1-133 [retrieved on Nov. 14, 2012]. Retrieved from the internet: <URL: http://homepages.cwi.nl/-sbohte/publication/phdthesis.pdf>.

Brette et al., Brian: a simple and flexible simulator for spiking neural networks, The Neuromorphic Engineer, Jul. 1, 2009, pp. 1-4, doi: 10.2417/1200906.1659.

Cuntz et al., "One Rule to Grow Them All: A General Theory of Neuronal Branching and Its Paractical Application" PLOS Computational Biology, 6 (8), Published Aug. 5, 2010.

(56) References Cited

OTHER PUBLICATIONS

Davison et al., PyNN: a common interface for neuronal network simulators, Frontiers in Neuroinformatics, Jan. 2009, pp. 1-10, vol. 2, Article 11.

Djurfeldt, Mikael, The Connection-set Algebra: a formalism for the representation of connectivity structure in neuronal network models, implementations in Python and C++, and their use in simulators BMC Neuroscience Jul. 18, 2011 p. 1 12(Suppl 1):P80.

Fidjeland et al., Accelerated Simulation of Spiking Neural Networks Using GPUs [online], 2010 [retrieved on Jun. 15, 2013], Retrieved from the Internet: URL:http://ieeexplore.ieee.org/xpls/abs_all.jsp?arnumber=5596678&tag=1.

Floreano et al., "Neuroevolution: from architectures to learning" Evol. Intel. Jan. 2008 1:47-62, [retrieved Dec. 30, 2013] [retrieved online from URL:<http://inforscience.epfl.ch/record/112676/files/FloreanoDuerrMattiussi2008.pdf>.

Gewaltig et al., NEST (Neural Simulation Tool), Scholarpedia, 2007, pp. 1-15, 2( 4 ): 1430, doi: 1 0.4249/scholarpedia.1430.

Gleeson et al., ) NeuroML: A Language for Describing Data Driven Models of Neurons and Networks with a High Degree of Biological Detail, PLoS Computational Biology, Jun. 2010, pp. 1-19 vol. 6 Issue 6.

Goodman et al., Brian: a simulator for spiking neural networks in Python, Frontiers in Neuroinformatics, Nov. 2008, pp. 1-10, vol. 2, Article 5.

Gorchetchnikov et al., NineML: declarative, mathematically-explicit descriptions of spiking neuronal networks, Frontiers in Neuroinformatics, Conference Abstract: 4th INCF Congress of Neuroinformatics, doi: 1 0.3389/conf.fninf.2011.08.00098.

Graham, Lyle J., The Surf-Hippo Reference Manual, http://www.neurophys.biomedicale.univparis5. fr/graham/surf-hippo-files/Surf-Hippo%20Reference%20Manual.pdf, Mar. 2002, pp. 1-128.

Izhikevich, "Polychronization: Computation with Spikes", Neural Computation, 25, 2006, 18, 245-282.

Izhikevich, "Simple Model of Spiking Neurons", IEEE Transactions on Neural Networks, vol. 14, No. 6, Nov. 2003, pp. 1569-1572.

Izhikevich, "Relating STDP to BCM", Neural Computation 15, 1511-1523 (2003).

Karbowski et al., "Multispikes and Synchronization in a Large Neural Network with Temporal Delays", Neural Computation 12, 1573-1606 (2000).

Khotanzad, "Classification of invariant image representations using a neural network" IEEF. Transactions on Acoustics, Speech, and Signal Processing, vol. 38, No. 6, Jun. 1990, pp. 1028-1038 [online], [retrieved on Dec. 10, 2013]. Retrieved from the Internet <URL: http://www-ee.uta.edu/eeweb/IP/Courses/SPR/Reference/Khotanzad.pdf>.

Laurent, "The Neural Network Query Language (NNQL) Reference" [retrieved on Nov. 12, 2013]. Retrieved from the Internet: URL:http://nnql.org/nnql.org.

Laurent, "Issue 1—nnql—Refactor Nucleus into its own file—Neural Network Query Language" [retrieved on Nov. 12, 2013]. Retrieved from the Internet: URL:https://code.google.com/p/nnql/issues/detail?id=1.

Nichols, A Reconfigurable Computing Architecture for Implementing Artificial Neural Networks on FPGA, Master's Thesis, The University of Guelph, 2003, pp. 1-235.

Pavlidis et al. Spiking neural network training using evolutionary algorithms. In: Proceedings 2005 IEEE International Joint Conference on Neural Networks, 2005. IJCNN'05, vol. 4, pp. 2190-2194 Publication Date Jul. 31, 2005 [online] [Retrieved on Dec. 10, 2013] Retrieved from the Internet <URL: http://citeseerx.ist.psu.edu/viewdoc/download?doi=10.1.1.5.4346&rep=rep1&type=pdf.

Paugam-Moisy et al., "Computing with spiking neuron networks" G. Rozenberg T. Back, J. Kok (Eds.), Handbook of Natural Computing, Springer-Verlag (2010) [retrieved Dec. 30, 2013], [retrieved online from link.springer.com].

Schemmel et al., Implementing synaptic plasticity in a VLSI spiking neural network model in Proceedings of the 2006 International Joint Conference on Neural Networks (IJCNN'06), IEEE Press (2006) Jul. 16-21, 2006, pp. 1-6 [online], [retrieved on Dec. 10, 2013]. Retrieved from the Internet <URL: http://www.kip.uni-heidelberg.de/veroeffentlichungen/download.cgi/4620/ps/1774.pdf>.

Simulink® model [online], [Retrieved on Dec. 10, 2013] Retrieved from <URL: http://www.mathworks.com/products/simulink/index.html>.

Sinyavskiy et al. "Reinforcement learning of a spiking neural network in the task of control of an agent in a virtual discrete environment" Rus. J. Nonlin. Dyn., 2011, vol. 7, No. 4 (Mobile Robots), pp. 859-875, chapters 1-8 (Russian Article with English Abstract).

Sjostrom J., W. Gerstner. Spike-Timing Dependent Plasticity. Scholarpedia, [Online], 2010, 5(2), 1362.

Szatmary et al., "Spike-timing Theory of Working Memory" PLoS Computational Biology, vol. 6, Issue 8, Aug. 19, 2010 [retrieved on Dec. 30, 2013]. Retrieved from the Internet: <URL: http://www.ploscompbiol.org/article/info%3Adoi%2F10.1371%2Fjournal.pcbi.1000879#>.

Brette, et al., "Simulation of Networks of Spiking Neurons: A Review of Tools and Strategies", Received Nov. 29, 2006, Revised Apr. 2, 2007, Accepted Apr. 12, 2007, Springer Science, 50 pages.

Bush, Daniel, "STDP, Rate-coded Hebbian Learning and Auto-Associative Network Models of the Hippocampus", Sep. 2008, University of Sussex, pp. 1-109.

Chistiakova, Marina, and Maxim Volgushev. "Heterosynaptic plasticity in the neocortex." Experimental brain research 199.3-4 (2009): 377-390.

Glackin, C.; Maguire, L.; McDaid, L., Feature extraction from spectra-temporal signals using dynamic synapses, recurrency, and lateral inhibition, Neural Networks (IJCNN), The 2010 International Joint Conference on DOI: 10.1109/IJCNN.2010.5596818 Publication Year: 2010, pp. 1-6.

Itti, Laurent, and Christof Koch. "Computational modelling of visual attention." Nature reviews neuroscience 2.3 (2001): pp. 194-203.

Izhikevich E.M., "Neural Excitability, Spiking and Bursting", Neurosciences Institute, Received Jun. 9, 1999, Revised Oct. 25, 1999, 1171-1266, 96 pages.

Kling-Petersen, PhD, "Sun and HPC: From Systems to PetaScale" Sun Microsystems, no date, 31 pages.

Knoblauch, Andreas, Gunther Palm, and Friedrich T. Sommer. "Memory capacities for synaptic and structural plasticity." Neural Computation 22.2 (2010): 289-341.

Leydesdorff, Loet and Stephen Bensman, Classification and Powerlaws: The Logarithmic Transformation (2006), Journal of the American Society for Information Science and Technology (forthcoming).

Li, Zhaoping. "A saliency map in primary visual cortex." Trends in cognitive sciences 6.1 (2002): 9-16.

Markram, Henry, et al. "Regulation of synaptic efficacy by coincidence of postsynaptic APs and EPSPs." Science 275.5297 (1997): 213-215.

Martinez-Perez, et al., "Automatic Activity Estimation Based on Object Behavior Signature", 2010, 10 pages.

Matsugu, et al., "Convolutional Spiking Neural Network for Robust Object Detection with Population Code Using Structured Pulse Packets", 2004, 39-55, 17 pages.

Medini, C.; Subramaniyam, S.; Nair, B.; Diwakar, S., Modeling cerebellar granular layer excitability and combinatorial computation with spikes, Bio-Inspired Computing: Theories and Applications (BIC-TA), 2010 IEEE Fifth International Conference on DOI: 10.1109/BICTA.201 0.5645274, Publication Year: 2010, pp. 1495-1503.

Meinhardt, Hans, and Alfred Gierer. "Pattern formation by local self-activation and lateral inhibition." Bioessays 22.8 (2000): 753-760.

Niv, et al., Evolution of Reinforcement Learning in Uncertain Environments: A Simple Explanation for Complex Foraging Behaviors, International Society for Adaptive Behavior, 2002, vol. 10(1), pp. 5-24.

Ostojic, Srdjan, Nicolas Brunel, From Spiking Neuron Models to Linear-Nonlinear Models, Jan. 2011,vol. 7, Issue 1, e1001056.

Ramachandran, et al., "The Perception of Phantom Limbs", The D.O. Hebb Lecture, Center for Brain and Cognition, University of California, 1998, 121, 1603-1630, 28 pages.

(56) References Cited

OTHER PUBLICATIONS

Ruan, Chengmei; Qingxiang Wu; Lijuan Fan; Zhiqiang Zhuo; Xiaowei Wang, Competitive behaviors of a spiking neural network with spike timing dependent plasticity. Biomedical Engineering and Informatics (BMEI), 2012 5th International Conference on DOI: 10.11 09/BME1.2012.6513088 Publication Year: 2012, pp. 1015-1019.
Stringer, et al., "Invariant Object Recognition in the Visual System with Novel Views of 3D Objects", 2002, 2585-2596, 12 pages.
Swiercz, Waldemar, et al. "A new synaptic plasticity rule for networks of spiking neurons." Neural Networks, IEEE Transactions on 17.1 (2006) 94-105.
Voutsas, K.; Adamy, J., A Biologically Inspired Spiking Neural Network for Sound Source Lateralization Neural Networks, IEEE Transactions on vol. 18, Issue: 6 DOI: 10.11 09/TNN.2007.899623, Publication Year: 2007, pp. 1785-1799.
Wade, J.J.; McDaid, L.J.; Santos, J.A.; Sayers, H.M., SWAT: A Spiking Neural Network Training Algorithm for Classification Problems, Neural Networks, IEEE Transactions on vol. 21, Issue: 11 DOI: 10.11 09/TNN-2010.2074212, Publication Year: 2010, pp. 1817-1830.
Wennekers, T., Analysis of spatia-temporal patterns in associative networks of spiking neurons Artificial Neural Networks, 1999. ICANN 99. Ninth International Conference on (Conf. Publ. No. 470) vol. 1 DOI: 10.1049/cp:19991116 Publication Year: 1999, pp. 245-250, vol. 1.
Wu, QingXiang et al., Edge Detection Based on Spiking Neural Network Model, ICIC 2007, LNAI 4682, pp. 26-34, 2007, Springer-Verlag, Berlin Heidelberg.
Wu, QingXiang, et al. "Remembering Key Features of Visual Images based on Spike Timing Dependent Plasticity of Spiking Neurons." Image and Signal Processing, 2009. CISP '09. $2^{ND}$ International Congress on. IEEE. 2009.
Simei Gomes Wysoski et al., "Fast and adaptive network of spiking neurons for multi-view visual pattern recognition," Neurocomputing, vol. 71, Issues Aug. 13-15, 2008, pp. 2563-2575, ISSN 0925-2312, http://dx.doi.org/10.1016/j.neucom.2007.12.038.
A Neural Network for Ego-motion Estimation from Optical Flow, by Branka, Published 1995.
Aleksandrov (1968), Stochastic optimization, Engineering Cybernetics, 5, 11-16.
Amari (1998), Why natural gradient?, Acoustics. Speech and Signal Processing, (pp. 1213-1216). Seattle, WA, USA.
Baras, D. et al. "Reinforcement learning, spike-time-dependent plasticity, and the BCM rule." Neural Computation vol. 19 No. 8 (2007): pp. 2245-2279.
Bartlett et al., (2000) "A Biologically Plausible and Locally Optimal Learning Algorithm for Spiking Neurons" Retrieved from http://arp.anu.edu.au/ftp/papers/jon/brains,pdf.
Baxter et al., (2000), Direct gradient-based reinforcement learning, in Proceedings of the International Symposium on Circuits and Systems, (pp. III-271-274).
Bennett, M.R., (1999), The early history of the synapse: from Plato to Sherrington. Brain Res. Boll., 50(2): 95-118.
Bertsekas, Dimitri P., and Dimitri P. Bertsekas. Dynamic programming and optimal control. vol. 1. No. 2. Belmont, MA: Athena Scientific, 1995.
Bertsekas, Dimitri P., "Approximate dynamic programming." (2011).
Blais B.S., et al., "BCM Theory," Scholarpedia, 2008, vol. 3 (3), 13 pages.
Bohte et al., (2000), Spike Prop: backpropagation for networks of spiking neurons, In Proceedings of ESANN'2000, (pp. 419-424).
Bohte et al., "A Computational Theory of Spike-Timing Dependent Plasticity: Achieving Robust Neural Responses via Conditional Entropy Minimization" 2004.
Booij(2005). A Gradient Descent Rule for Spiking Neurons Emitting Multiple Spikes. Information Processing Letters n. 6. v.95, 552-558.
Breiman et al., "Random Forests" 33pgs, Jan. 2001.
Capel, "Random Forests and ferns" LPAC, Jan. 1, 2012, 40 pgs.

Christo Panchev, "Temporal Processing in a Spiking Model of the Visual System", S. Kollias et al. (Eds.): ICANN 2006, Part 1, LNCS 4131, Springer-Verlag, Berlin, 2006, pp. 750-759.
Dan Y., et al., "Spike Timing-dependent Plasticity of Neural Circuits," Neuron, 2004, vol. 44 (1), pp. 23-30.
de Queiroz, M. et al. "Reinforcement learning of a simple control task using the spike response model." Neurocomputing vol. 70 No. 1 (2006): pp. 14-20.
El-Laithy (2011), A reinforcement learning framework for spiking networks with dynamic synapses, Comput Intell Neurosci.
Fletcher (1987), Practical methods of optimization, New York, NY: Wiley-Interscience.
Florian (2005), A reinforcement learning algorithm for spiking neural networks SYNASC '05 Proceedings of the Seventh International Symposium on Symbolic and Numeric Algorithms for Scientific Computing.
Fremaux. N. et al., "Functional Requirements for Reward-Modulated Spike-Timing-Dependent Plasticity", The Journal of Neuroscience, Oct. 6, 2010, 30 (40)13326-13337.
Fu (2005) Stochastic Gradient Estimation, Technical Research Report.
Fu (2008), What You Should Know About Simulation and Derivatives Naval Research Logistics, vol. 55, No. 8, 723-736.
Fyfe et al., (2007), Reinforcement Learning Reward Functions for Unsupervised Learning, ISNN '07 Proceedings of the 4th international symposium on Neural Networks: Advances in Neural Networks.
Gerstner (2002), Spiking neuron models: single neurons, populations, plasticity, Cambridge, U.K.: Cambridge University Press.
Glynn (1995), Likelihood ratio gradient estimation for regenerative stochastic recursion Advances in Applied Probability 27.4. 1019-1053.
Govindhasamy, James J., Sean F. McLoone, and George W. Irwin. "Sequential learning for adaptive critic design: An industrial control application." Machine Learning for Signal Processing, 2005 IEEE Workshop on. IEEE, 2005.
Hagras, Hani, et al., "Evolving Spiking Neural Network Controllers for Autonomous Robots", IEEE 2004.
Hanselmann T., et al., "Continuous-time Adaptive Critics," IEEE Transactions on Neural Networks, 2007, vol. 18 (3), pp. 631-647.
Ho, "Random Decision Forests" Int'l Conf. Document Analysis and Recognition, 1995, 5 pgs.
Huang, Fall Detection Using Modular Neural Networks with Back-projected Optical Flow, Published 2007.
In search of the artificial retina [online]. Vision Systems Design. Apr. 1, 2007.
Izhikevic, F. (2007), Solving the Distal Reward Problem through Linkage of STDP and Dopamine Signaling, Cerebral Cortex, vol. 17, 2443-2452.
Izhikevich, Eugene M., Dynamical systems in neuroscience: chapters 1 and 2, MIT press, 2007.
Kaelbling, Leslie, et al., "Reinforcement Learning: A Survey" Journal of Artificial Intelligence Research, 4 (1996), pp: 237-285.
Kalal et al. Online learning of robust object detectors during unstable tracking published on 3rd On-line Learning for Computer Vision Workshop 2009, Kyoto, Japan, IEEE CS.
Kasabov, "Evolving Spiking Neural Networks for Spatio-and Spectro-Temporal Pattern Recognition", IEEE 6th International Conference Intelligent Systems 2012 [Retrieved on Jun 24, 2014], Retrieved from the Internet: <ahref="http://ncs.ethz.ch/projects/evospike/publications/evolving-spiking-neural-networks-for-spatio-and-spectro-temporal-pattern-recognition-plenary-talk-ieee-is/view">http://ncs.ethz.ch/projects/evospike/publications/evolving-spiking-neural-networks-for-spatio-and-spectro-temporal-pattern-recognition-plenary-talk-ieee-is/view</a>.
Kazantsev, et al., "Active Spike Transmission in the Neuron Model With a Winding Threshold Maniford", 01/03112,205-211,7 pages.
Kenji Doya (2000), Reinforcement Learning in Continuous Time and Space, Neural Computation, 12:1. 219-245.
Kiefer (1952), Stochastic Estimation of the Maximum of a Regression Function, Annals of Mathematica[ Statistics 23, #3, 462-466.

(56) References Cited

OTHER PUBLICATIONS

Klampfl (2009), Spiking neurons can learn to solve information bottleneck problems and extract independent components, Neural Computation, 21(4), pp. 911-959.
Kleijnen et al., Optimization and sensitivity analysis of computer simulation models by the score function method Invited Review European Journal of Operational Research, Mar. 1995.
Klute et al., "Artificial Muscles: Actuators for Biorobotic Systems," The International Journal Robotics Research, 2002, vol. 21, pp. 295-309.
Larochelle et al., (2009), Exploring Strategies for Training Deep Neural Networks, J. of Machine Learning Research, v. 10, pp. 1-40.
Lars Buesing, Wolfgang Maass, "Simplified Rules and Theoretical Analysis for Information Bottleneck Optimization and PCA with Spiking Neurons", NIPS Proceedings, 2007, "http:I/papers.nips.cc/paper/3168-simplified-rules-and-theoretical-analysis-forinformation-bottleneck-optimization-and-pea-with-spiking-neurons", 2007, pp. 1-8.
Lazar., et al., "Consistent recovery of sensory stimuli encoded with MIMO neural circuits," Computational intelligence and neuroscience, 2009.
Legenstein, R., et al. (2008), .A learning theory for reward-modulated spike timingsdependent plasticity with application to biofeedback. PLoS Computational Biology. 4(10): 1-27.
Lendek Babushka Z.S., and De Schutter B. (2006) State Estimation under Uncertainty- . A Survey: Technical report 06-004 Deth Center for systems and Conrtol Delft University of Technology.
Lin, Long-Ji. "Self-improving reactive agents based on reinforcement learning, planning and teaching." Machine learning 8.3-4 (1992): 293-321.
Lyle N. Long and Ankur Gupta, "Biologically-Inspired Spiking Neural Networks with Hebbian Learning for Vision Processing", AIAA Paper No. 2008-0885, presented at AIAA 46th Aerospace Sciences Meeting, Reno NV Jan. 2008, pp. 1-17.
Masakazu et al, "Convolutional Spiking Neural Network Model for Robust Face Detection", Proceedings of the 9th International Conference on Neural Information Processing (ICONIP'02), vol. 2, 2002, pp. 660-664.
N Venkateswaran, B Harish, R Chidambareswaran, "A Novel Perspective into the Neuronal Encoding Along the Retinal Pathway Employing Time-Frequency Transformation: Part II—For Color", Brain Inspired Cognitive systems, 2004, pp. BIS4-31-BIS4-37.
Natalia C., et al., "Spike Timing-dependent Plasticity: a Hebbian Learning Rule," Annual Review of Neuroscience, 2008, vol. 31, pp. 25-46.
Nikolic, K., San Segundo Bello D.. Delbruck T, Liu, S.. and Roska, B. High-sensitivity silicon retina for robotics and prosthetics 2011.
Oja, Erkki (2008), Scholarpedia "Oja learning rule.".
Ojala et al., "Performance Evaluation of Texture Measures with Classification Based on Kullback Discrimination of Distributions" 1994 IEEE, pp. 582-585.
Ozuysal et al., "Fast Keypoint Recognition in len Lines of Code" CVPR 2007.
Ozuysal et al., "Fast Keypoint Recognition Using Random Ferns" IEEE Transactions on Pattern Analysis and Machine Intelligence, vol. 32, No. 3, Mar. 2010. pp. 448-461.
Paugam-Moisy, et al., "Computing with Spiking Neuron Networks" Handbook of Natural Computing, 40 pages Springer, Heidelberg (2009).
Pfister (2003), Optimal Hebbian Learning: A Probabilistic Point of View. In ICANN Proceedings. Springer, pp. 92-98.
Pfister (2006), Optimal Spike-Timing Dependent Plasticity for Precise Action Potential Firing in Supervised Learning, Neural computation ISSN 0899-7667, 18 (6).
Phenomenological models of synaptic plasticity based on spike timing Abigail Morrison Markus Diesmann Wulfram Gerstner Received: Jan. 16, 2008 / Accepted: Apr. 9, 2008 © The Author(s) 2008.
Ponulak, "Analysis of the Resume learning Process for Spiking Neural Networks,"International Journal of Applied Mathematics & Computer Science, 2008, vol. 18 (2), pp. 117-127.
Ponulak, F., (2005), ReSuMe—New supervised learning method for Spiking Neural Networks Technical Report, Institute of Control and Information Engineering, Poznan University of Technology.
Ponulak, F., Kasinski, A.: Supervised learning in spiking neural networks with ReSuMe: sequence learning, classification, and spike shifting. Neural Comp .22(2): 467-510..
Prokhorov, Danil V., and Lee A. Feldkamp. "Primitive adaptive critics." Neural Networks, 1997., International Conference on. vol. 4. IEEE, 1997.
Rafael Serrano-Gotarredona, Teresa Serrano-Gotarredona, Antonio Acosta-Jimenez, and Bernabe Linares-Barranco, "A Neuromorphic Cortical-Layer Microchip for Spike-Based Event Processing Vision Systems", Circuits and Systems 1: Regular Papers, IEEE Transactions on vol. 53, Issue: 12) Dec. 12, 2006. pp. 2548-2566.
Rebecca L. VislayMeltzer, Adam R. kampff, Florian Engert, "Spatiotemporal Specificity of neurol activity directs the modification of receptive fields in the developing retinotectal system", neuron 50, Apr. 6, 2006, pp. 101-114.
Reiman et al (1998). Sensitivity analysis for simulations via likelihood ratios. Oper Res 37, 830-844.
Reinforcement Learning in Intelligent Control: A Biologically-Inspired Approach to the Relearning Problem. Brendan D'Cruz May (1998).
Reinforcement Learning Through Modulation of Spike-Timing-Dependent Synaptic Plasticity, Razvan V. Florian Neural Computation 19, 1468-1502 (2007) Massachusetts Institute of Technology.
Robbins (1951), A Stochastic Approximation Method, Annals of Mathematical Statistics 22, #3, 400-407.
Rosenstein et al., (2002), Supervised learning combined with an actor-critic architecture, Technical Report 02-41, Department of Computer Science, University of Massachusetts, Amherst.
Rumelhart (1986), Learning internal representations by error propagation, Parallel distributed processing, vol. 1 (pp. 318-362), Cambridge, MA: MIT Press.
Rumelhart et a[., (1986), Learning representations by back-propagating errors, Nature 323 (6088) , pp. 533-536.
Schrauwen et al., "Improving SpikeProp: Enhancements to an Error-Backpropagation Rule for Spiking Neural Networks", ProsRISC Workshop, 2004, pp. 301-305.
Schreiber S., et al., "A New Correlation-based Measure of Spike Timing Reliability," Neurocomputing, 2003, vol. 52-54, pp. 925-931.
Seung. H. "Learning in spiking neural networks by reinforcement of stochastic synaptic transmission." Neuron vol. 40 No. 6 (2003): pp. 1063-1073.
Sinyavskiy, et al. (2010), Generalized Stochastic Spiking Neuron Model and Extended Spike Response Model in Spatial-Temporal Impulse Pattern Detection Task Optical Memory and Neural Networks (Information Optics) 2010 vol. 19 No. 4 pp. 300-309.
Sinyavskiy O.Yu., "Obuchenic s Podkrepleniem Spaikovoy Neiroiniy Seti v Zadache Upravleniya Agentom v Diskretnoy Virtualnoy Srede." Nelineinaya Dinamika, vol. 7 (24), 2011, pp. 859-875.
Steele P.M., et al., "Inhibitory Control of LTP and LTD: Stability of Synapse Strength," Journal of Neurophysiology, 1999, vol. 81 (4), pp. 1559-1566.
Stein. R.B..(1967).Some models of neural variability. Biophys. J.. 7:.37-68.
Supervised learning in Spiking Neural .Networks with ReSuMe Method. Filip Ponulak, Doctoral Dissertation Poznan, Poland 2006.
Sutton R.S. (1988). Learning to predict by the methods of temporal differences. Machine Learning 3(1), 9-44.
Tegner J., et al., "An Adaptive Spike-timing-dependent Plasticity Rule" Elsevier Science B.V., 2002.
Timothee Masquelier, "Learning Mechanisms to Account for the Speed, Selectivity and Invariance of Responses in the Visual Cortex", phD thesis published by Universite Toulouse III-Paul Sabatier, U.F. R. Sciences de la Vie et de la Terre, Feb. 15, 2008, pp. 1-192.

(56) References Cited

OTHER PUBLICATIONS

Tishby et al., (1999), The information bottleneck method, In Proceedings of the 37th Annual Allerton Conference on Communication, Control and Computing, B Hajek & RS Sreenivas, eds., pp. 368-377, University of Illinois.

Toyoizumi (2007), Optimality Model of Unsupervised Spike-Timing Dependent Plasticity: Synaptic Memory and Weigbt Distribution, Neural Computation, 19 (3).

Toyoizumi et al., (2005), Generalized Bienenstock-Cooper-Munro rule for spiking neurons that maximizes information transmission, Proc. Natl. Acad. Sci. USA, 102, (pp. 5239-5244).

Vasilaki, et al., "Learning flexible sensori-motor mappings in a complex network" Biol Cybern (2009) 100:147-158.

Vasilaki et al., "Spike-Based Reinforcement Learning in Continuous State and Action Space: When Policy Gradient Methods Fail" PLoS, vol. 5, Issue 12, Dec. 2009.

Visual Navigation with a Neural Network, by Hatsopoulos, Published 1991.

Wang, R. et al., A programmable axonal propagation delay circuit for time-delay spiking neural networks. Circuits and System (ISCAS), 2011 IEEE International Symposium on. May 15-18, 2011, pp. 869-872 [retrieved on Nov. 13, 2013]. [retrieved from ieeexplore.ieee.org].

Weaver (2001), The Optimal Reward Baseline for Gradient-Based Reinforcement Learning, UA1 01 Proceedings of the 17th Conference in Uncertainty in Artificial Intelligence (pp. 538-545). Morgan Kaufman Publishers.

Weber, C. et al. 'Robot docking with neural vision and reinforcement.' Knowledge-Based Systems vol. 17 No. 2 (2004): pp. 165-172.

Weber et al., (2009), Goal-Directed Feature Learning, In: Proc, International Joint Conference on Neural Networks, 3319 3326.

Werbos P.J. (1992), or Prokhorov D.V and Wunsch D.C. (1997) Adaptive Critic Designs, IEEE Trans Neural Networks, vol. 8. No. 5, pp. 997-1007.

Werbos P.J., Neurocontrol and Fuzzy Logic: Connections and Designs, International Journal of Approximate Reasoning, 1992, vol. 6 (2), pp: 185-219.

White, D. A., & Sofge, D. A. (Eds.). (1992): Handbook of intelligent control. Neural, fuzzy, and adaptive approaches. Van Nostrand Reinhold-New York.

Widrow B. Hoff. M.E. (1960) Adaptive Switching Circuits, IRE WESCON Convention Record 4: 96-104.

Widrow, Bernard, Narendra K. Gupta, and Sidhartha Maitra. "Punish/reward: Learning with a critic in adaptive threshold systems." Systems, Man and Cybernetics, IEEE Transactions on 5 (1973): 455-465.

Williams (1992), Simple Statistical Gradient-Following Algorithms for Connectionist Reinforcement Learning, Machine Learning 8, 229-256.

Wiskott, et al., "Slow Feature Analysis", 2002, 29 pages.

Wohns R.n. W., et al., Day Surgery for Anterior Cervical Microdiskectomy: Experience with 75 Cases, Jul. 11, 2002, pp. 1-3.

Xiaohui Xie and H. Sebastian Seung, "Learning in neural networks by reinforcement of irregular spiking", Physical Review E. vol. 69, letter 041909, 2004, pp. 1-10.

Yang Z., et al., "A Neuromorphic Depth-from-motion Vision Model with STDP Adaptation," IEEE Transactions on Neural Networks, 2006, vol. 17 (2), pp. 482-495.

Yi (2009), Stochastic search using the natural gradient, ICML '09 Proceedings of the 26th Annual International Conference on Machine Learning. New York, NY, USA.

Zhou, Computation of Optical Flow Usinga Neural Network, Published 1988.

\* cited by examiner

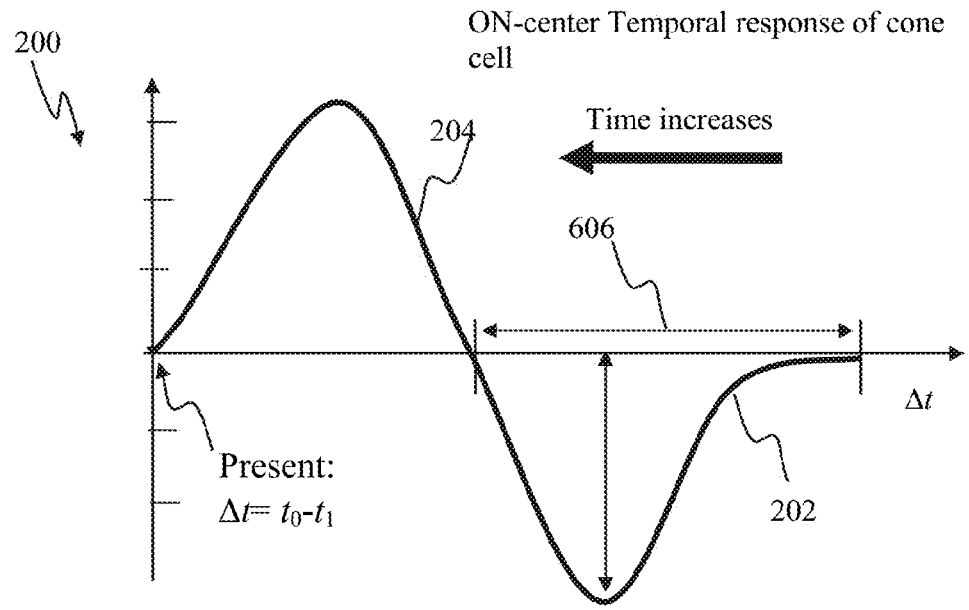
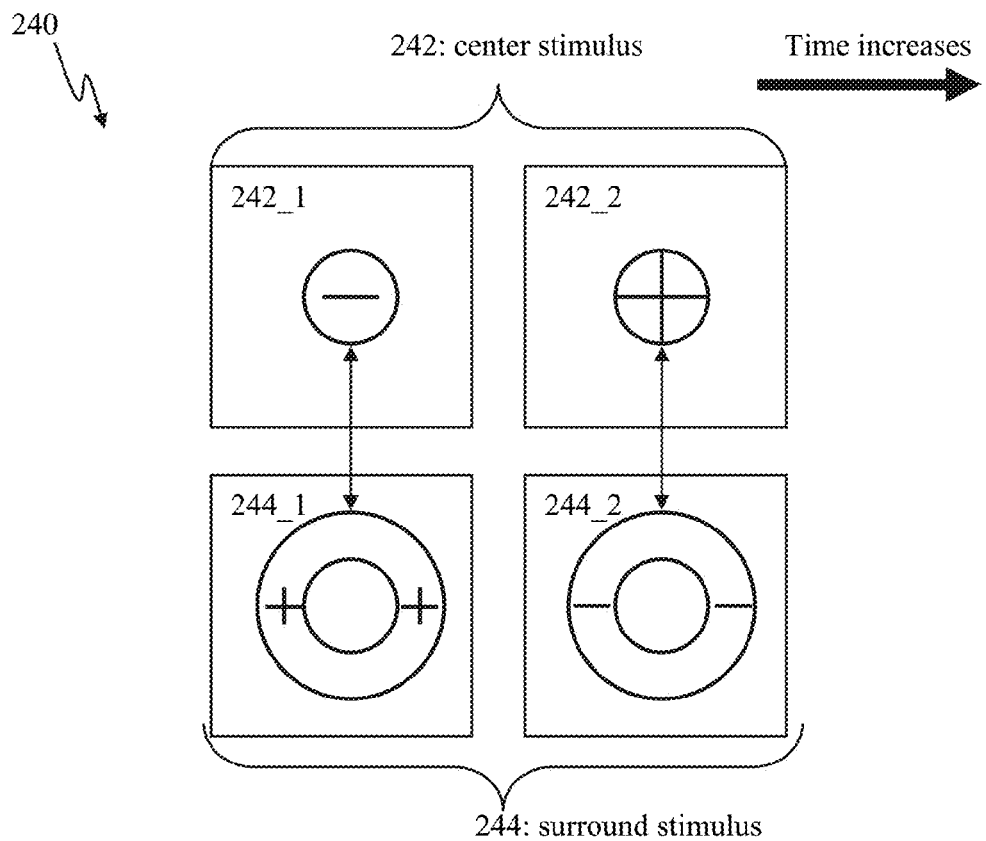
FIG. 2: (Prior Art)

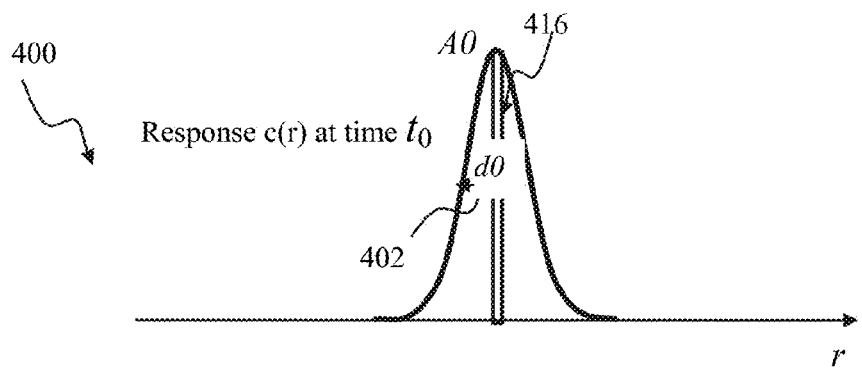
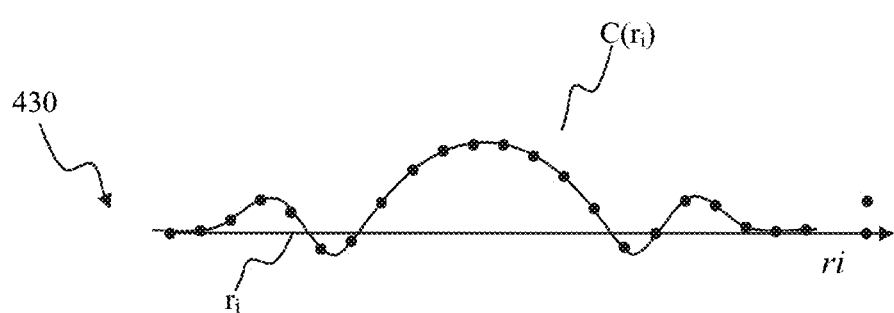
FIG. 4A
FIG. 4B

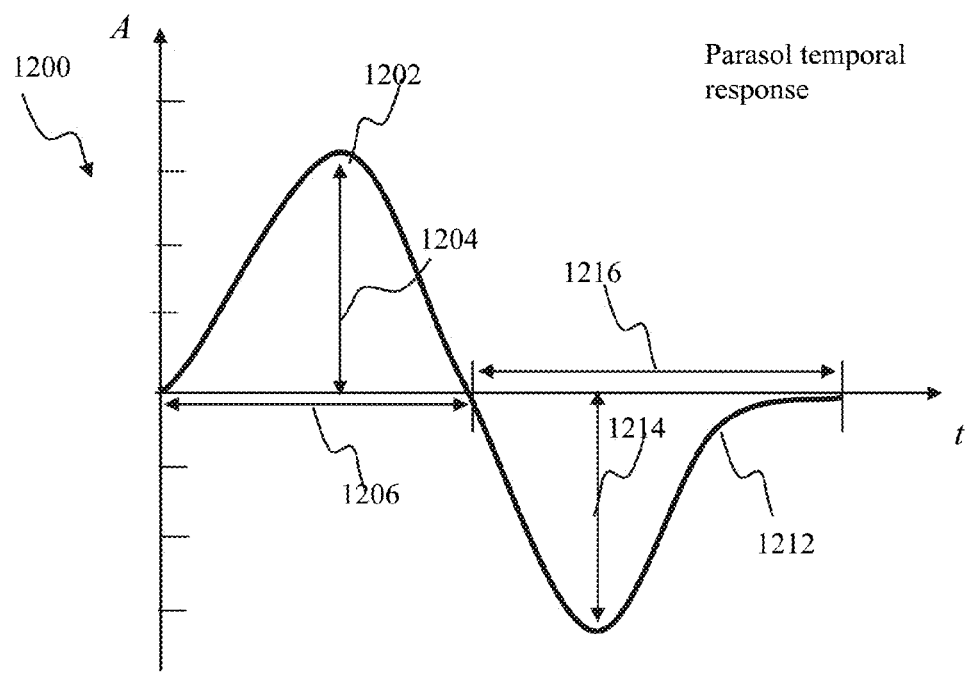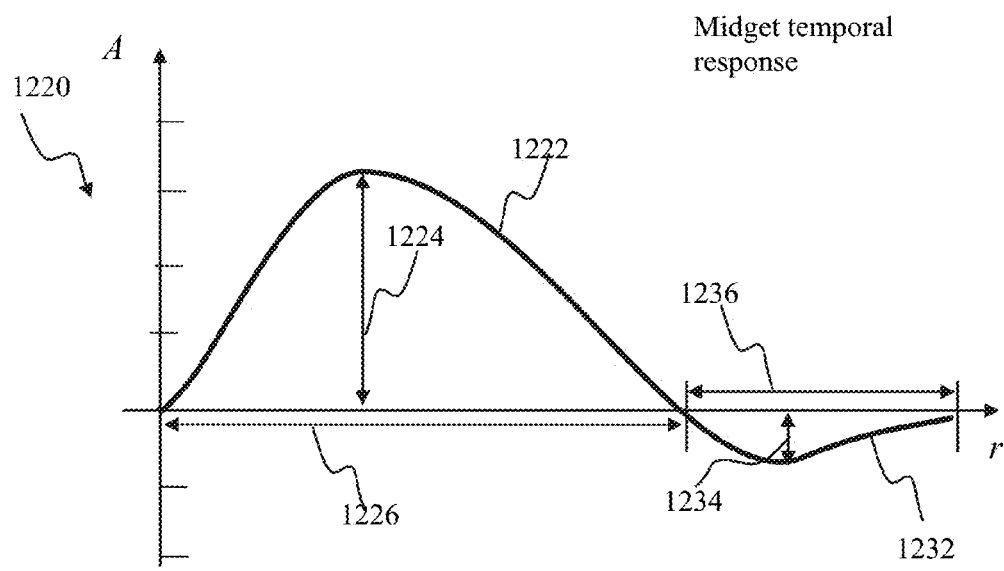
FIG. 12

RETINAL APPARATUS AND METHODS

COPYRIGHT

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND

1. Field of the Disclosure

The present innovation relates generally to artificial visual systems and more particularly in one exemplary aspect to computer apparatus and methods for implementing spatial encoding in artificial retina.

2. Description of Related Art

Various existing implementations of artificial retinal functionality aim at converting visual input (e.g., frames of pixels) to output signals of different representations, such as: spike latency, see for example, U.S. patent application Ser. No. 12/869,573, filed Aug. 26, 2010, entitled "SYSTEMS AND METHODS FOR INVARIANT PULSE LATENCY CODING", and U.S. patent application Ser. No. 12/869,583, filed Aug. 26, 2010, entitled "INVARIANT PULSE LATENCY CODING SYSTEMS AND METHODS"; polychronous spike trains, see for example, U.S. patent application Ser. No. 13/117,048, filed May 26, 2011, entitled "APPARATUS AND METHODS FOR POLYCHRONOUS ENCODING AND MULTIPLEXING IN NEURONAL PROSTHETIC DEVICES", each of the foregoing incorporated herein by reference in its entirety.

Artificial retinal apparatus (e.g., the apparatus described in U.S. patent application Ser. No. 13/152,119, Jun. 2, 2011, entitled "SENSORY INPUT PROCESSING APPARATUS AND METHODS", incorporated herein by reference in its entirety) attempt to mimic particular spatial characteristics (horizontal connectivity) of natural retina cone cells, such as two-dimensional "difference-of-Gaussians" (DoG) spatial filter profile, and a difference filter in the temporal domain. In order to improve response to contrast changes and facilitate detection of edges, existing artificial retina implementations implement difference-of-Gaussians" spatial filter profile in the ganglion later (RGCs). Typically, the centers of the RGCs are arranged spatially as a two-dimensional (2-D) or a 3-dimensional (3D) structure, such as a linear array, a rectangle, square, or honeycomb pattern. The spatial extents of the RGCs, in terms of the input image pixels, may overlap with multiple neighboring RGCs.

Most existing artificial retina implementations, such as the implementation illustrated in FIG. 1, comprise predetermined connectivity pattern between the output layer (e.g., the retinal ganglion cell layer 124 in FIG. 1) and the photoreceptive layer (e.g., the cone layer 114 in FIG. 1). In the implementation of FIG. 1, in order to achieve the desired spatial response (e.g., the difference-of-Gaussians) depicted by the curve 136, each retinal ganglion cell (e.g., the cell 124_1) may be pre-wired ('connected') to the respective cone cells (e.g., the cone cells within the broken line rectangle in FIG. 1) using connections 122 with or without preset delays. Such implementations have substantial shortcomings, as the pre-wiring of cones to neurons to form receptive fields of the latter leads to exuberant proliferation unnecessary connections, increases processing load thereby reducing performance of the processing apparatus, increases apparatus complexity and costs, and reduces flexibility. Furthermore, while the use of prewiring produces the desired DoG RGC spatial response, temporal response of natural RGCs may be not adequately reproduced as described below with respect to FIG. 2.

The plot 200 in FIG. 2 illustrates typical amplitude response of a natural cone cell as a function of input history $\Delta t = t_0 - t_1$, where $t_0$ corresponds to the time of a prior input (past), and $t_1$ corresponds to the time of current input (present). The response 200 comprises a negative value interval 202 and the positive value interval 204. It follows from configuration shown in FIG. 2 that the cones produce optimal response when a negative in-center stimulus is followed by a positive on-center stimulus.

Most implementations that employ pre-determined spatial response (e.g., DoG response 136 in FIG. 1) generate time-space separable responses, typically expressed as:

$$H(r,t) = (r)T(t) \quad \text{(Eqn. 1)}$$

While time-space separable response of, e.g., Eqn. 1 may be more straight forward to implement, such responses are sub-optimal with respect to detecting moving visual stimuli. In other words, the time-space separable configuration described by Eqn. 1 and illustrated in FIG. 2, responds most optimally to a stimulus frame that simultaneously comprises positive center component and negative surround component; or comprises negative center component and positive surround component, as shown by frame pairs (242_2, 244_2) and (242_1, 244_1), respectively, in FIG. 2.

However, it is often desirable, when constructing artificial retina implementations, to reproduce time-space non-separable response of the neuroretina, such as shown for example in FIG. 12, below. The non-separable response of the neuroretina allows to, inter alia, facilitate feature recognition that is based on changes of contrast within the stimulus with time. Space-time non-separable receptive fields are often beneficial for motion detection and direction selection in visual processing.

Accordingly, there is a salient need for apparatus and methods for implementing retinal cone connectivity that does not rely solely on pre-wired connectivity and which provides improved temporal and spatial response.

SUMMARY

The present disclosure satisfies the foregoing needs by providing, inter alia, apparatus and methods for implementing continuous spatial connectivity in artificial retina.

One aspect of the disclosure relates to a sensory processing system. The system may comprise an encoder apparatus. The encoder apparatus may comprise a plurality of sensing elements. Individual ones of the elements may be configured to receive sensory stimulus. The system may comprise a plurality of output nodes. Individual ones of the output nodes may be configured to generate an output based on the stimulus. The system may comprise a detector apparatus coupled to the encoder. Coupling individual nodes of the plurality of nodes to one and only one element of the plurality of elements via a single connection may be configured to cause generation of the output by the each node.

In some implementations, individual nodes may be characterized by a spatial sensitivity to the stimulus. The spatial sensitivity may be configured based on a summation of a plurality of responses from a subset of elements of the plurality of sensing elements. The plurality of responses may be characterized by one or more of: (1) a first Gaussian spatial distribution having a first width parameter and positive weights associated therewith or (2) a second Gaussian spatial distribution having a second width parameter and negative weights associated therewith. The first Gaussian distribution and the second Gaussian distributions may cooperate to effectuate difference of Gaussians (DoG) spatial response sensitivity to the stimulus by the node. The response sensitivity may be characterized by an effective width.

In some implementations, the effective width may be determined based on number of elements within the subset. The summed contribution may be configured to be communicated to the node via the single connection.

In some implementations, the stimulus may comprise an image. The output signal may comprise a plurality pulses configured to be communicated via the plurality of channels. At least one characteristic associated with the image may be encoded as a pattern of relative pulse latencies observable in pulses communicated through the plurality of channels. The pattern of relative pulse latencies may be insensitive to one or more of image contrast and image luminance.

In some implementations, the system may comprise a plurality of encoder apparatus coupled to the detector apparatus. The plurality of encoders may be configured to receive a plurality pixel streams. At least a portion of the plurality of pixel streams may comprise a representation of at least one other object. The plurality of encoders may be configured to encode the plurality pixel streams into a plurality of pulse streams thereby attaining a compression rate. The detector apparatus may be configured to generate at least on other detection signal based on matching at least one the pattern to a template associated with the object.

In some implementations, the processing may comprise compression of the image by a factor of at least 1000.

In some implementations, the sensory stimulus may comprise a stream of pixel values, which may comprise a representation of an object. The detector apparatus may be configured to generate a detection signal based on matching the pattern to a template associated with the object.

In some implementations, the object may be characterized by first linear dimension and second linear dimension. The second dimension may be greater than the first dimension. The sensory stimulus may comprise grating input associated with a displacement of the object in a direction of at least the first dimension.

In some implementations, a number of nodes may match a number of elements. Individual ones of the nodes may be configured to receive a plurality of responses signal from a subset of elements of the plurality of sensing elements via the single connection. Individual ones of the nodes may be characterized by a receptive field having difference of Gaussians (DoG) spatial response sensitivity to the stimulus associated therewith. An effective width of the distribution may be configured based on the plurality of responses.

In some implementations, the sensory processing system may comprise at least a portion of visual processing apparatus embodied in a communications apparatus. The communications apparatus may be configured to communicate at least a portion of the output via a remote link.

In some implementations, the communications apparatus may comprise a smart phone. The remote link may comprise a cellular wireless link.

In some implementations, the communications apparatus may comprise a security camera. The remote link may comprise one or both of a radio link or a wired network connection.

These and other objects, features, and characteristics of the system and/or method disclosed herein, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of "a", "an", and "the" include plural referents unless the context clearly dictates otherwise.

BRIEF DESCRIPTION OF THE DRAWINGS

FIG. 2 is a graphical illustration depicting temporal response of artificial retina of FIG. 1 according to prior art.

FIG. 4A is a graphical illustration of damped wave cone response to ON center stimulus in accordance with one or more implementations.

FIG. 4B is a graphical illustration of discrete retina response in accordance with one or more implementations.

FIG. 12 is a plot illustration temporal response of parasol unit and midget unit of the output layer of artificial retina apparatus according to one or more implementations.

All Figures disclosed herein are ® Copyright 2012 Brain Corporation. All rights reserved.

Figures 13A, 13B:
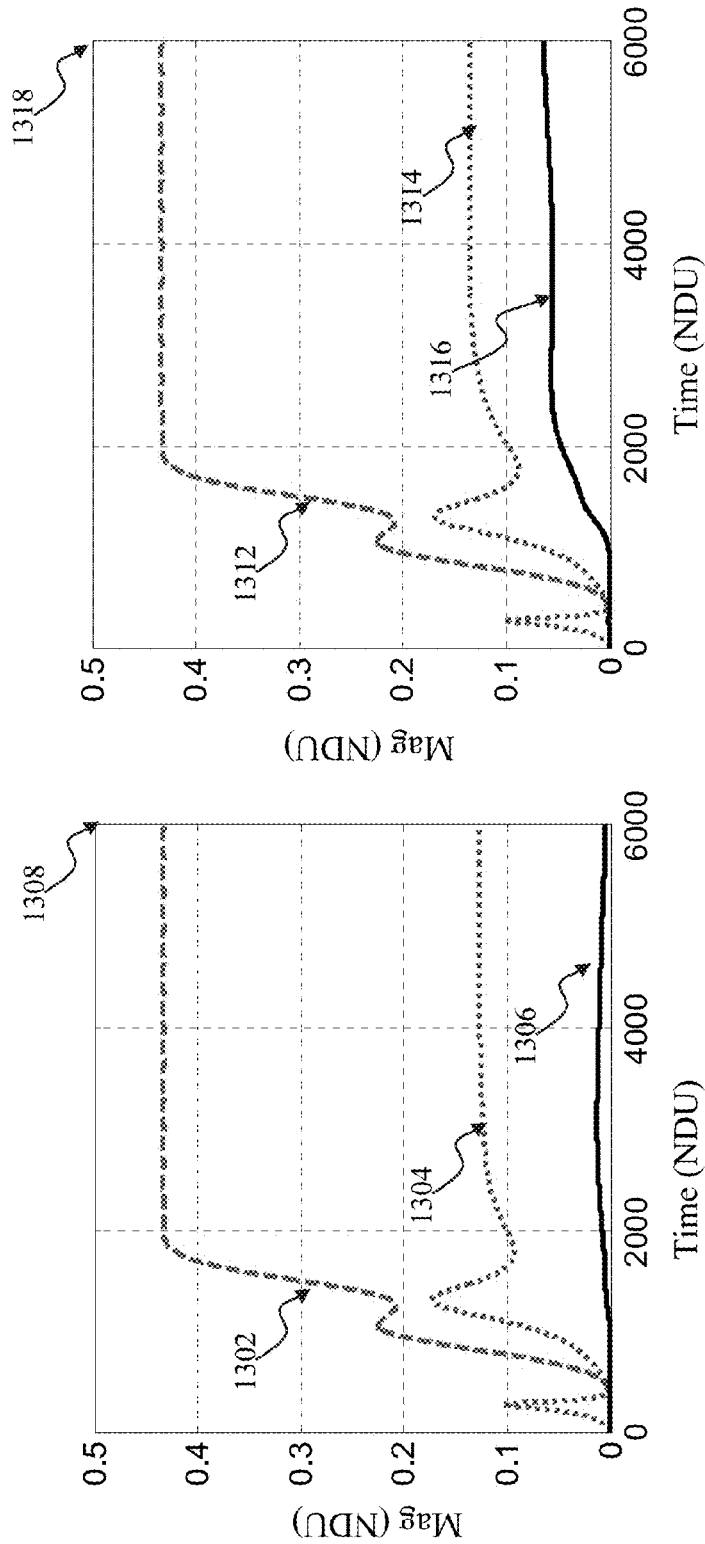
FIG. 13A is a plot illustrating response of artificial retina, comprising diffusively coupled cone layer, to incoherent motion in accordance with one or more implementations.
FIG. 13B is a plot illustrating response of artificial retina, comprising diffusively coupled cone layer, to coherent motion in accordance with one or more implementations.
Figure 14A:
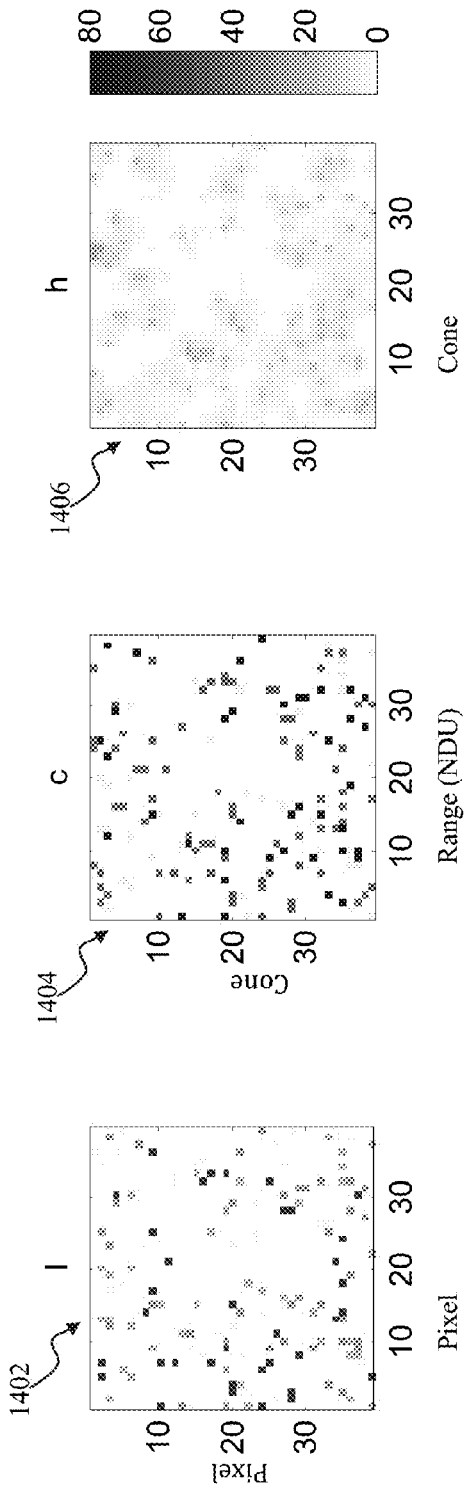

FIG. 14A is a distribution plot of input pixels and current and voltage responses thereof based on FIGS. 13A and 13B.

Figure 14B:
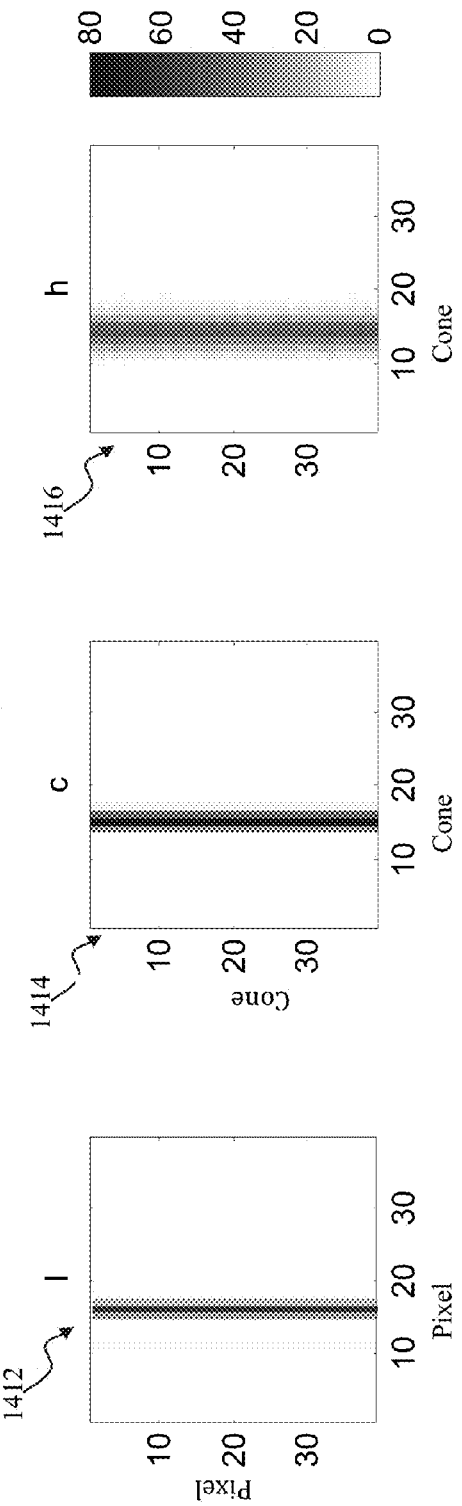

FIG. 14B is a distribution plot of an output of a photoreceptive layer responsive to coherent stimulus.

DETAILED DESCRIPTION

Implementations of the present disclosure will now be described in detail with reference to the drawings, which are provided as illustrative examples so as to enable those skilled in the art to practice the invention. Notably, the figures and examples below are not meant to limit the scope of the present invention to a single embodiment, but other embodiments are possible by way of interchange of or combination with some or all of the described or illustrated elements. Wherever convenient, the same reference numbers will be used throughout the drawings to refer to same or like parts.

Although the system(s) and/or method(s) of this disclosure have been described in detail for the purpose of illustration based on what is currently considered to be the most practical and preferred implementations, it is to be understood that such detail is solely for that purpose and that the disclosure is not limited to the disclosed implementations, but, on the contrary, is intended to cover modifications and equivalent arrangements that are within the spirit and scope of the appended claims. For example, it is to be understood that the present disclosure contemplates that, to the extent possible, one or more features of any implementation can be combined with one or more features of any other implementation In the present disclosure, an implementation showing a singular component should not be considered limiting; rather, the disclosure is intended to encompass other implementations including a plurality of the same component, and vice-versa, unless explicitly stated otherwise herein.

Further, the present disclosure encompasses present and future known equivalents to the components referred to herein by way of illustration.

As used herein, the term "bus" is meant generally to denote all types of interconnection or communication architecture that is used to access the synaptic and neuron memory. The "bus" could be optical, wireless, infrared and/or another type of communication medium. The exact topology of the bus could be for example standard "bus", hierarchical bus, network-on-chip, address-event-representation (AER) connection, and/or other type of communication topology used for accessing, e.g., different memories in pulse-based system.

As used herein, the terms "computer", "computing device", and "computerized device", include, but are not limited to, personal computers (PCs) and minicomputers, whether desktop, laptop, mainframe computers, workstations, servers, personal digital assistants (PDAs), handheld computers, embedded computers, programmable logic device, personal communicators, tablet computers, portable navigation aids, J2ME equipped devices, cellular telephones, smart phones, personal integrated communication or entertainment devices, and/or other devices capable of executing a set of instructions and processing an incoming data signal.

As used herein, the term "computer program" or "software" is meant to include any sequence or human or machine cognizable steps which perform a function. Such program may be rendered in virtually any programming language or environment including, for example, C/C++, C#, Fortran, COBOL, MATLAB™, PASCAL, Python, assembly language, markup languages (e.g., HTML, SGML, XML, VoXML), object-oriented environments such as the Common Object Request Broker Architecture (CORBA), Java™ (e.g., J2ME, Java Beans), Binary Runtime Environment (e.g., BREW), and/or other programming languages and/or environments.

As used herein, the terms "connection", "link", "transmission channel", "delay line", "wireless" means a causal link between any two or more entities (whether physical or logical/virtual), which enables information exchange between the entities.

As used herein, the term "memory" includes any type of integrated circuit or other storage device adapted for storing digital data including, without limitation, ROM, PROM, EEPROM, DRAM, Mobile DRAM, SDRAM, DDR/2 SDRAM, EDO/FPMS, RLDRAM, SRAM, "flash" memory (e.g., NAND/NOR), memristor memory, PSRAM, and/or other storage media.

As used herein, the terms "microprocessor" and "digital processor" are meant generally to include all types of digital processing devices including, without limitation, digital signal processors (DSPs), reduced instruction set computers (RISC), general-purpose (CISC) processors, microprocessors, gate arrays (e.g., field programmable gate arrays (FPGAs)), PLDs, reconfigurable computer fabrics (RCFs), array processors, secure microprocessors, application-specific integrated circuits (ASICs), and/or other digital processing devices. Such digital processors may be contained on a single unitary IC die, or distributed across multiple components.

As used herein, the term "network interface" refers to any signal, data, or software interface with a component, network or process including, without limitation, those of the FireWire (e.g., FW400, FW800), USB (e.g., USB2), Ethernet (e.g., 10/100, 10/100/1000 (e.g., Gigabit Ethernet), 10-Gig-E), MoCA, Coaxsys (e.g., TVnet™), radio frequency tuner (e.g., in-band or OOB, cable modem), Wi-Fi (e.g., 802.11), WiMAX (e.g., 802.16), PAN (e.g., 802.15), cellular (e.g., 3G, LTE/LTE-A/TD-LTE, GSM), IrDA families, and/or other network interfaces.

As used herein, the terms "pixel" and/or "photodetector" may generally include, without limitation, any type of photosensitive circuit and/or device adapted for converting light signal (e.g., photons) into electrical form (e.g., current and/or voltage) and/or digital representation.

As used herein, the terms "pulse", "spike", "burst of spikes", and "pulse train" are meant generally to refer to, without limitation, any type of a pulsed signal, e.g., a rapid change in some characteristic of a signal, e.g., amplitude, intensity, phase or frequency, from a baseline value to a higher or lower value, followed by a rapid return to the baseline value and may refer to any of a single spike, a burst of spikes, an electronic pulse, a pulse in voltage, a pulse in electrical current, a software representation of a pulse and/or burst of pulses, a software message representing a discrete pulsed event, and/or any other pulse and/or pulse type associated with a discrete information transmission system and/or mechanism.

As used herein, the terms "pulse latency", "absolute latency", and "latency" are meant generally to refer to, without limitation, a temporal delay and/or a spatial offset between an event (e.g., the onset of a stimulus, an initial pulse, and/or just a point in time) and a pulse.

As used herein, the terms "pulse group latency", or "pulse pattern latency" refer to, without limitation, an absolute latency of a group (pattern) of pulses that is expressed as a latency of the earliest pulse within the group.

As used herein, the terms "relative pulse latencies" refer to, without limitation, a latency pattern or distribution within a group (or pattern) of pulses that is referenced with respect to the pulse group latency.

As used herein, the term "pulse-code" is meant generally to denote, without limitation, information encoding into a patterns of pulses (or pulse latencies) along a single pulsed channel or relative pulse latencies along multiple channels.

As used herein, the term "synaptic channel", "connection", "link", "transmission channel", "delay line", and "communications channel" are meant generally to denote, without limitation, a link between any two or more entities (whether physical (wired or wireless), or logical/virtual) which enables information exchange between the entities, and is characterized by a one or more variables affecting the information exchange.

As used herein, the term "Wi-Fi" refers to, without limitation, any of the variants of IEEE-Std. 802.11, related standards including 802.11 a/b/g/n/s/v, and/or other wireless standards.

As used herein, the term "wireless" means any wireless signal, data, communication, or other interface including without limitation Wi-Fi, Bluetooth, 3G (e.g., 3GPP/3GPP2), HSDPA/HSUPA, TDMA, CDMA (e.g., IS-95A, WCDMA), FHSS, DSSS, GSM, PAN/802.15, WiMAX (e.g., 802.16), 802.20, narrowband/FDMA, OFDM, PCS/DCS, LTE/LTE-A/TD-LTE, analog cellular, CDPD, satellite systems, milli-meter wave or microwave systems, acoustic, infrared (e.g., IrDA), and/or other wireless interfaces.

Overview

Apparatus and methods for implementing artificial retina may be configured to enable faster response. In one implementation, the retinal apparatus may comprise input pixel layer, hidden cone photoreceptive layer, and an output neuronal layer. Individual cones of the photoreceptive layer may be configured to receive input stimulus from one or more pixels within the cone circle of confusion. The cone dynamic may be described using a diffusive state equation, characterized by two variables: $c(t)$ configured to represent cone membrane current and $h(t)$ configured to represent membrane voltage potential. In some implementations, lateral connectivity in the cone layer may be enabled via diffusion of the membrane potential $h(t)$. The state dynamics may be configured such that the membrane current $c(t)$ provides excitation to the membrane voltage $h(t)$, while $h(t)$ in turn inhibits $c(t)$, thereby creating a damped two-dimensional wave, propagating away from the excited cone in the horizontal plane (x,y). In some implementations, lateral connectivity may be effected via diffusion of the membrane current $c(t)$. Diffusive horizontal coupling of neighboring cones effectuates non separable spatiotemporal response that may be optimally configured to respond to spatial changes in spectral illuminance. In one or more implementations, such changes may comprise changes in brightness and or color. In one or more implementations, such stimulus may comprise contrast reversing grating stimulus. Hence, the diffusive horizontal coupling provides effective means of filtering coherently moving portion of the stimulus from ambient noise. Cone layer high-pass filtered output further facilitates contrast detection, by suppressing time-constant component of the input and reducing sensitivity of the retina to the static inputs.

The diffusive cone coupling methodology described herein advantageously facilitates object and edge detection, particularly moving edge detection, in part due to enhanced response of the cone layer to contrast changes.

Realizations of the innovation may be for example deployed in a hardware and/or software implementation of a neuromorphic computerized system.

Detailed descriptions of various implementations of the apparatus and methods of the disclosure are now provided. Although certain aspects of the innovation can best be understood in the context of artificial retina, the principles of the disclosure are not so limited and implementations of the disclosure may also be used for implementing visual processing in, for example, a robotic systems, surveillance cameras, and/or handheld communications devices. In one such implementation, a robotic system may include a processor embodied in an application specific integrated circuit, which can be adapted or configured for use in an embedded application (such as a prosthetic device).

Generalized Architecture of Artificial Retina

Figure 3:
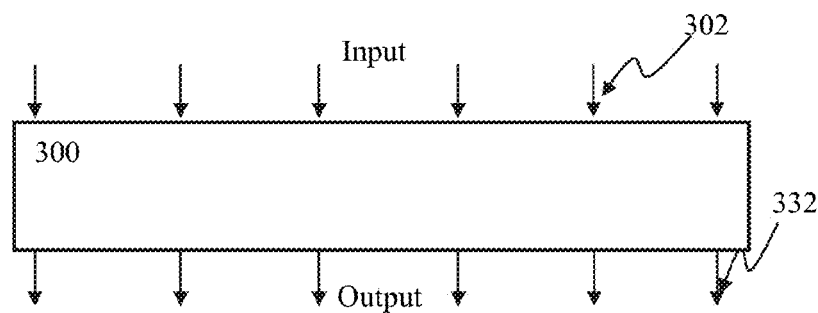
FIG. 3 is a block diagram illustrating artificial retina apparatus in accordance with one or more implementations.

One implementation of artificial retina is illustrated in FIG. 3. The retinal apparatus 310 may be configured to receive the visual input 302, and to encode the input 302 into output 332. In one or more implementations, the input may comprise light input, e.g., provided by a camera lens or natural light entering retinal implant. In one or more implementations, the input may comprise output of an array of charge coupled devices (CCD), or an active-pixel sensor (APS). In one or more implementations, the input may comprise a digital input stream of red, green blue RGB integer values, fixed-point or floating-point real values, refreshed at a suitable frame rate, e.g. 1-10000 Hz. It will be appreciated by those skilled in the art that the above digital stream image parameters are merely exemplary, and many other image representations (e.g., bitmap, luminance-chrominance (YUV, YCbCr), cyan-magenta-yellow and key (CMYK), grayscale, and/or other image representations) are equally applicable to, and useful with, the present disclosure. Furthermore, data frames corresponding to other (non-visual) signal modalities such as sonogram, radar, seismographs, or tomography images are equally compatible with the general architecture shown in FIG. 3.

Figure 3A:
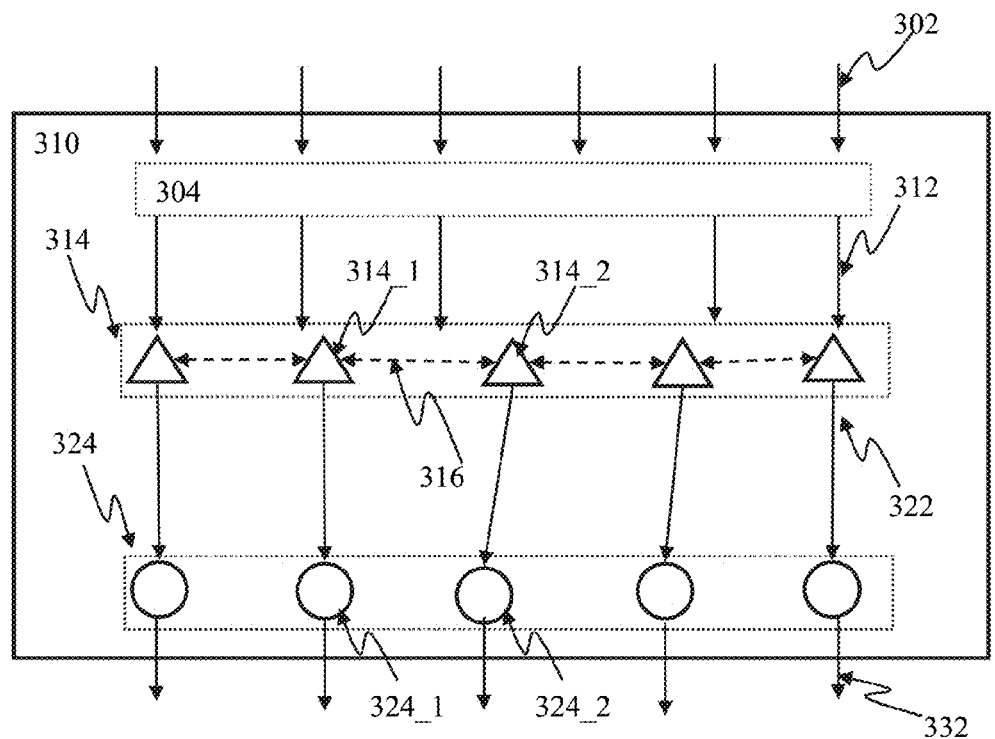
FIG. 3A is a block diagram illustrating artificial retina apparatus comprising a pixel layer, cone layer and neuronal output layer in accordance with one or more implementations.

Referring now to FIG. 3A, detail structure of the artificial retina apparatus 310 of FIG. 3 is illustrated in accordance with one implementation of the disclosure.

Pixel Layer

The apparatus 310 may comprise pixel layer 304, cone layer (hidden) 314 and neuron layer 324. In one or more implementations, the pixel layer may be configured to convert the visual input from the input color space to cone color space, denoted as (LMS). In one such implementation, the pixel layer converts the RGB pixel input into LMS cone color space according to the following linear transformation:

$$\begin{pmatrix} L \\ M \\ S \end{pmatrix} = \begin{pmatrix} 0.4158 & 0.4219 & 0.1623 \\ 0.1692 & 0.5359 & 0.2949 \\ 0.0132 & 0.0324 & 0.9544 \end{pmatrix} \begin{pmatrix} R \\ G \\ B \end{pmatrix}. \quad \text{(Eqn. 2)}$$

Pixels may be arranged, in some implementations, on a rectangular grid subtending a specified area of the visual field, as described below with respect to FIG. 3C. In one or more implementations, the overall number of pixels may be on the order of 100. In some implementations the pixel array may comprise $10^8$ pixels. In some implementations, the pixel array may comprise pixel density of 30-60 pixels per linear degree of visual field for retinal prosthetic applications. In some implementations of high-resolution object detection or and/long-focus telephoto lens image read-out the pixel density may be configured at 1000 pixels/degree.

Cone Layer

The cone layer 314 may comprise two-dimensional array of cones, individual ones being characterized by its type, denoting the wavelength of maximum selectivity, i.e., long (L), medium (M), and short (S). As used herein, the term 'cone' is meant generally to include, without limitation, any type of signal processing apparatus (software and/or hardware) capable of processing visual stimulus using diffusive coupling methodology of the disclosure. In some implementations, the cone may comprise a photoreceptor thereby enabling it to process light stimulus. In some implementations, the cone may be capable of interfacing to a photoreceptor (e.g., a pixel) and receive electrical (e.g., current and/or voltage) and/or digital input representation.

In some implementations, the cone layer may be described using the high-level neuromorphic description framework (HLND), described in detail in U.S. patent application Ser. No. 13/385,938, entitled "TAG-BASED APPARATUS AND METHODS FOR NEURAL NETWORKS", filed on Mar. 15, 2012, incorporated herein by reference in its entirety. In this implementation, the cone UNIT name is CoreCone for L, M, and S cones, and the TAG values for cone types may be L, M, and S, respectively. Individual cones may be associated with a unique type. In some implementations, aimed to mimic natural human retina, the cone layer 314 may comprise 10% of S-cones, 45% M-cones, and 45% L-cones. It will be appreciated by those skilled in the arts that the above composition may comprise one implementation and may be adjusted when constructing the retina apparatus for a particular application.

In some implementation, such as illustrated and described with respect to FIG. 6 below, the cones may be laid out on a hexagonal or randomly-shifted hexagonal grating, as follows: (i) the S-cones may be arranged quasi-regularly using a hexagonal grating with a larger lattice constant; (ii) the remaining cones (L-cones and M-cones) may be arranged at random within the two-dimensional extend corresponding to the pixel array size.

Hexagonal grid may be created and in some applications its nodes may be randomly shifted independently from one another by a random amount dr in x and y directions. In some implementations, this shift may be referred to as the position jitter, illustrated by broken line curve 610 in FIG. 6. Such position jitter may be used, for example, to effectuate stochastic sampling configured to implement anti-aliasing of the pixel image without additional computational load. In some implementations, the position jitter stochastic sampling may be augmented by a matched reconstruction filter.

The random displacement dr may be determined, in some realizations, using a normal distribution. In some implementations, position jitter may be obtained using Poisson distribution.

In some implementations, the s-cones may be disposed at some nodes of the grid using a semi-regular arrangement comprising a hexagonal grating with a larger lattice constant, compared to the hexagonal grid spacing.

In some implementations, the remaining locations of the hexagonal grid may be populated (at random) with L and M nodes. In one or more implementations, the proportion of M, L nodes may be selected at one to one; or two to one. As it will be appreciated by those skilled in the arts, any proportion of L, M, S cones may be selected, consistent with the application, such as, for example, 0 S, 50% L and 50% M in one implementation.

In some implementations, when the cone density is lower than the pixel density, individual cones may receive input from their nearest pixel. In one or more implementation, such as the layout 360 illustrated in FIG. 3C, individual cones (e.g., the M-cone 314_M) may receive input from pixels within a circle (denoted with the arrow 362 in FIG. 3C) of a certain radius r from the respective cone. Cones of different types (L,M,S) are depicted by triangles of different shading (black, white, gray, respectively) and are denoted as 314_L, 314_M, 314_S, respectively in FIG. 3C. The radius r of the circle 362 may be selected such that individual pixels are coupled to at least one cone, so that some of the pixel areas (e.g., the area denoted 344 in FIG. 3C) deliver input to more than one cone. In some implementations, the radius r may be selected based on diffractive properties of the lens.

In one or more implementations, the pixel contribution within individual circles (e.g., the circle 362) may be weighted according to a distribution (e.g., Gaussian, Bessel, cos-squared, weighted Parzen, and/or other distributions), where the weight is inversely proportional to the pixel distance from the cone. In some implementations, individual cones of one or more types (e.g., L,M,S) may be assigned the respective contribution using the transformation of Eqn. 2. It will be recognized by those skilled in the arts, that the cone-pixel configuration illustrated in FIG. 3C may comprise one implementation, and other configurations (e.g., where pixel cone densities are comparable and individual cones receive input from a single cone) may be compatible with the disclosure as long as no pixels remains un-sampled and no cones may be unconnected. In some implementations pixel to cone ratio, while in some implementations a single cone may be connected to 100 pixels.

Figure 3B:
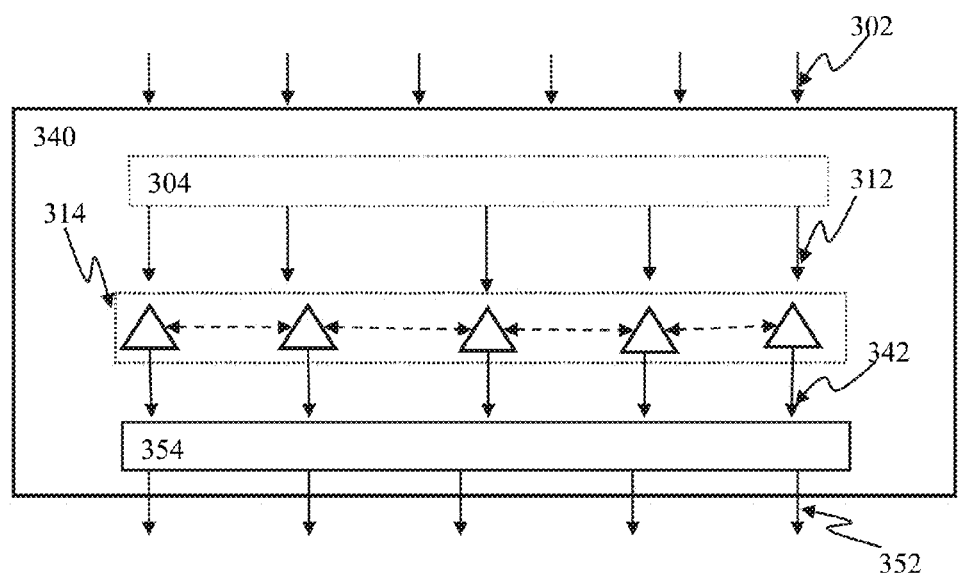
FIG. 3B is a block diagram illustrating artificial retina apparatus comprising a pixel layer and a cone layer, and signal conditioning output layer in accordance with one or more implementations.
Figure 3C:
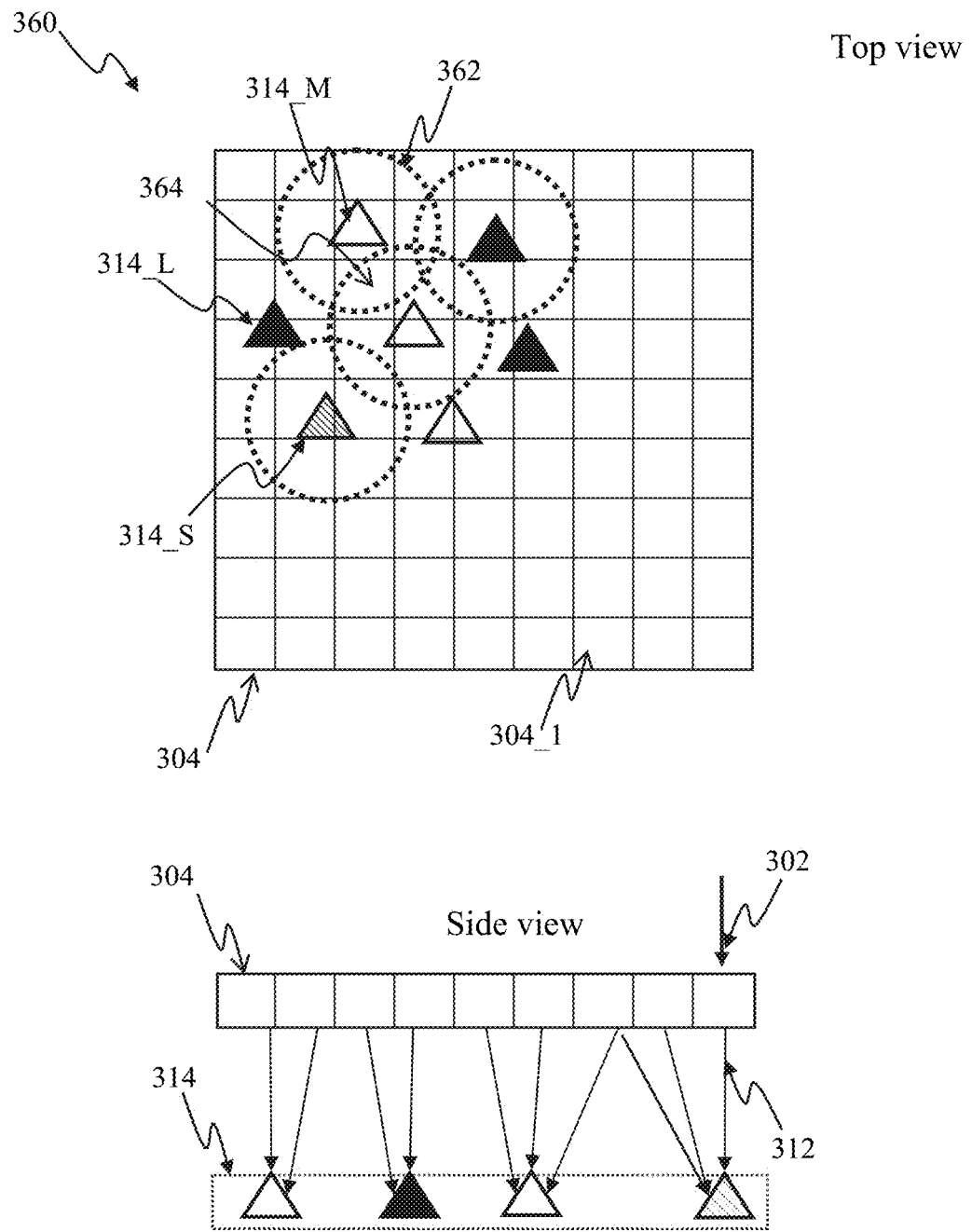
FIG. 3C is a graphical illustration depicting pixel layer and cone layer structure in accordance with one or more implementations.

Diffusive Lateral Connectivity:

In some implementations of the retinal apparatus, horizontal connectivity within the cone layer (e.g., the layer 314 of the apparatus 310) may be implemented using the diffusive approach. Dynamics of individual cones may be characterized by a pair of state variables: c(t), which may be interpreted as the cone membrane current; and h(t), which may be interpreted as the cone membrane potential. The equations governing the dynamics of the $i^{th}$ cone in response to pixel layer input I may be:

$$\frac{dc_i}{dt} = \frac{I - c_i}{\tau_c} - \alpha h_i; \quad I = \sum_{k=0}^{N} w_k I_k; \quad \text{(Eqn. 3)}$$

$$\frac{dh_i}{dt} = \frac{c_i}{\tau_h} + \sum_{j \neq i} D_{ij}(h_j - h_i), \quad \text{(Eqn. 4)}$$

where $D_{ij}$ is the coupling strength between the adjacent cones, I denotes the pixel input, comprising a weighted superposition of pixels within the circle of confusion of the cone (e.g., the circle 342 in FIG. 3C); $\tau_c$, $\tau_h$ are the time constants for the c, h variables, respectively.

In one or more implementations, the parameters D and/or $\tau_c$ may be used to configure spatial and/or temporal filtering of the input I(t) received by the cone layer, respectively. In one or more implementations, the parameter $\alpha$, and/or $\tau_h$ may be used to configure temporal decay and period of intrinsic oscillations of the cone layer output.

In some implementations, the parameter $\tau_c$ may be used to control damping (e.g., the non-diffusive portion); the parameter $\tau_h$ may be used to control the cone response time; $\alpha$ may be used to control the oscillation period and D may be used to control diffusion rate, and thereby the diffusive portion of the damping.

The diffusion coefficient and the time constants may be selected so that the traveling wave is sufficiently, but not overly, damped (for example, in one implementation, the amplitude does not decay more that 90% over a single oscillation). In some implementations, range of optimal stimuli velocity is between 0.1 and 10 deg/s. Damping may provide for a broad range of near optimal velocities rather than a single resonant one.

The output of the cone, operated according to the state model described by Eqn. 3-Eqn. 4 may be described as:

$$f_i = h_i - \tilde{h}_i, \quad \text{(Eqn. 5)}$$

which corresponds to a high-pass filtered membrane potential h(t). In where $\tilde{h}$ is a smoothed (low-pass filtered) membrane potential determined as:

$$\frac{d\tilde{h}_i}{dt} = \frac{h_i - \tilde{h}_i}{\tau_{bar}}, \quad \text{(Eqn. 6)}$$

where $1/\tau_{bar}$ is the cut-off frequency of the low-pass filter. In one or more implementations, the cut-off time constant $\tau_{bar}$ may be selected from the range between 0.1 s and 5 s.

In some implementations, Eqn. 3-Eqn. 4, in absence of the diffusion term $\Sigma_{j \neq i} D_{ij}(h_j - h_i)$, may realize a damped driven harmonic oscillator, which produces a biphasic graded temporal drive to the neuronal layer (e.g., the layer 324 in FIG. 3A). High-pass filtering introduced by the Eqn. 53-Eqn. 6 removes the constant asymptotic displacement of the damped oscillator under a time-constant component of the drive. This configuration may effectively remove sensitivity of the cone layer (and hence the retina apparatus) to static inputs. Furthermore, the connectivity described by Eqn. 5-Eqn. 6 may improve sensitivity of cones to coherent stimuli (e.g., moving edges) compared to random noise inputs. The coherent stimulus may be driving groups of cones in sync, while random noise inputs may be damped by the diffusion term. In addition, the diffusion term $\Sigma_{j \neq i} D_{ij}(h_j - h_i)$ in Eqn. 4 may couple the neighboring cones (e.g., the cones 314_1, 314_2, as denoted by the broken arrow 316 in FIG. 3A) to produce a damped traveling wave.

The state dynamics of Eqn. 3-Eqn. 4 may be configured such that current c(t) provides excitation to membrane voltage h(t), while h(t) in turn inhibits c(t), thereby creating a damped two-dimensional wave, propagating away from the excited cone in the horizontal plane (x,y). In some implementations, lateral connectivity may be effectuated via diffusion of the membrane voltage. In one or more implementations, different cone types may be characterized by a different sets of parameters of Eqn. 3-Eqn. 4.

Horizontal connections between the neighbor cones, caused by the diffusive coupling according to Eqn. 3-Eqn. 4, may introduce coupling between their membrane potential h. As a result, the stimulus delivered to one model cone may drive neighboring cones, ostensibly with some lag, thereby producing an outgoing damped wave of cone activity. An impulse response of such coupled cone may be described as a well-known damped harmonic oscillator. The spread of the stimulus energy due to horizontal connections and the damping of the propagating wave-like response due to the $$-\frac{c_i}{\tau_c}$$

term in the Eqn. 3 may cause decay of the cone impulse response. In some implementations, this decay may be below 10% of the original amplitude after the first oscillation cycle. Hence, the temporal response may be referred to as the biphasic response.

Temporal response of the surrounding cones (i.e., the contribution of the neighboring cones to the response of the stimulated cone) may also be characterized as biphasic. In some implementations, the neighboring cones respond to stimulus with a lag of order of 10-30 ms. This feature of the cone layer configured according to, for example, Eqn. 3-Eqn. 4 reproduces the delayed surround response of the RGCs in vertebrate retinas, and improves the sensitivity of the retina to coherently moving stimuli.

The horizontal connection strengths $D_{ij}$ between the neighboring cones in Eqn. 4, scale the diffusion term of the damped wave equation. The differential form of the diffusion term of Eqn. 3-Eqn. 4 may be expressed as $D\Delta h$, where $$\Delta = \frac{\partial^2}{\partial x^2} + \frac{\partial^2}{\partial y^2}$$

is the Laplace operator.

In one or more implementations, the cone layer diffusive coupling may be described using spatially continuous representation. Accordingly, the framework of Eqn. 3-Eqn. 6 may be expressed as follows: current c(r) and membrane potential h(r) dynamics as $$\frac{dc(r)}{dt} = \frac{I(r) - c(r)}{\tau_c} - \alpha h(r); I(r) = \sum_{k=0}^{N} w_k(r) I_k; \quad \text{(Eqn. 7)}$$

$$\frac{dh(r)}{dt} = \frac{c(r)}{\tau_h} + D\Delta h(r); \quad \text{(Eqn. 8)}$$

and the output f(r) as:

$$f(r) = h(r) - \tilde{h}(r), \quad \text{(Eqn. 9)}$$

where $\tilde{h}$ is a smoothed (low-pass filtered) membrane potential determined as:

$$\frac{d\tilde{h}(r)}{dt} = \frac{h(r) - \tilde{h}(r)}{\tau_{bar}}, \quad \text{(Eqn. 10)}$$

The finite-element approximation of $$D\frac{\partial^2 h}{\partial x^2}$$

may be expressed as $$D\left(\frac{h(x+dx) - h(x)}{dx^2} + \frac{h(x-dx) - h(x)}{dx^2}\right).$$

In other words, the connection strengths of the discrete process of Eqn. 3-Eqn. 6 may be expressed as:

$$D_{ij} \propto D/r_{ij}^2 \quad \text{(Eqn. 11)}$$

where:

$r_{ij}$ is the distance between the cones i and j along the cone layer; and

D is diffusion coefficient.

In some implementations, the diffusive connectivity framework of Eqn. 3-Eqn. 4 may be applied to the nearest neighbor cones. In one or more implementations, this connectivity may be applied to individual cones within a given radius $r_0$.

In some implementations, the cone-to-cone connections within the cone layer may be arranged using Delaunay-Voronoi (V-D) tessellation. In one variant, tessellation for individual types of cones (i.e., L,M,S cones) may be calculated separately and diffusive connectivity of Eqn. 3-Eqn. 4 may be applied to individual cones of one or more cone types. This procedure provides that: (i) i-cone to j-cone connections are reciprocal; (ii) $D_{ij} = D_{ji}$, and (iii) cones (except for those disposed on along the cone layer boundary, e.g., cone 314_L in FIG. 3C) are connected to neighboring cones. As a result, in absence of the external drive I, the state where all $h_i$ are zero is a stable fixed point of the system. In some implementations different diffusion parameters may be selected for different cone types (e.g., L, M, S). In one or more implementations, the same diffusion parameters may be selected for two or more cone types.

The diffusion-based coupling governs local dynamics of the cone excitation and enhances cone sensitivity to coherent motion of stimuli across the retina but not the sensitivity to local (not spatially coherent) variations in the input, as is graphically illustrated in FIGS. 4A-4C, below.

FIG. 4A presents graphical illustrations depicting responses of a cone, operated according to the dynamics of Eqn. 3-Eqn. 4, to on-center excitation, described with respect to, e.g., frame 242_2 in FIG. 2, supra. Panel 400 depicts initial cone response to excitation signal (i.e., the input I in Eqn. 3). The response 400 may be characterized by amplitude A0 and width d0, denoted as 402 in FIG. 4A. The Panels 410, 420 depict cone responses at time t1>t0, t2>t1, respectively. The responses 410, 420 may be characterized by progressively lower amplitudes A2<A1<A0 and increasing widths d2>d1>d0. While, the center lobe of response 410 is inverted with respect to curves 400, 420 (corresponding to a negative on-center response), the response 410 exhibits lower amplitude sidelobes 416 which provide positive response at a distance $r_1$ off center of the cone. Similarly, the response 420 may comprise the positive main lobe, negative sidelobes 424, and positive side-lobes located at distance $r_2$ from the cone center. It is noteworthy, that responses 400, 410, 420 shown in FIG. 4A may be interpreted as contributions from a plurality of individual point-like cones $C = \{c_1, c_2, \ldots, c_n\}$ disposed along the dimension $R = \{r_1, r_2, \ldots, r_n\}$. In one or more implementations comprising discrete cone layer, the response curve 430 shown in FIG. 4B may comprise an interpolated response of individual cone contributions $c(r_i)$.

This time course of the cone layer response models the response of the outer plexiform layer of retina by preferentially enhancing temporal gradients of the input stimuli (e.g., transitions from light to dark and vice versa), and enhancing the response to coherent moving edges. Indeed, when input space time course roughly matches the time course of c(r,t), the response is enhanced in a resonant fashion. Because of the diffusion and damping term of the equations by Eqn. 5-Eqn. 6, the response at time t2 in FIG. 4A is shallower and broader, compared to the initial stimulus 415. Hence, a broad range of spatial frequencies and drift velocities of input stimulus is amplified. It is noteworthy that unlike the outer plexiform layer of mammalian retina (which may be configured to rectify and modulate input signals), the approach described herein advantageously may comprise linear cone layer configured to produce positive responses for transition from dark to light and negative responses for transitions from light to dark. In some or more implementations of the disclosure, signal adaptation, rectification and spike generation may be realized in the neuron cell layer (e.g., the layer 324 of FIG. 3A.

Figure 4C:
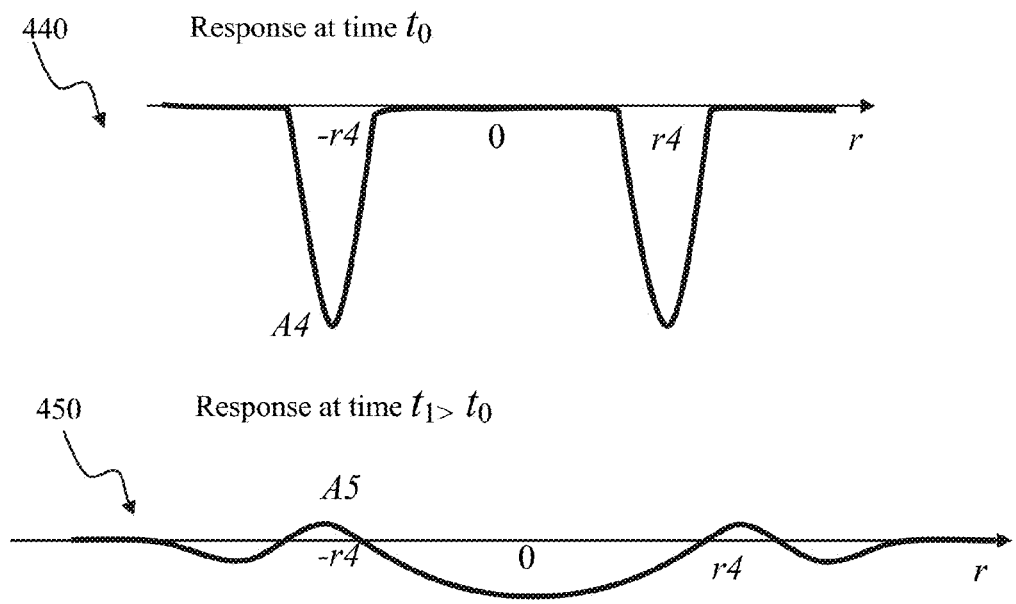
FIG. 4C is a graphical illustration of damped wave cone response to OFF center stimulus in accordance with one or more implementations.

Similarly, FIG. 4C, presents graphical illustrations depicting cone responses to surround excitation, described, with respect to FIG. 12, below. Panel 440 in FIG. 4C depicts initial cone response, to the off-center negative excitation signal, comprising two negative peaks of amplitude A4 centered at a distance r4 from the cone center. The panel 450 depicts cone responses at time t1>t0 and may be characterized by a positive response of lower amplitude A5<A4, centered at the same distance r4 from the cone center.

Figure 5A:
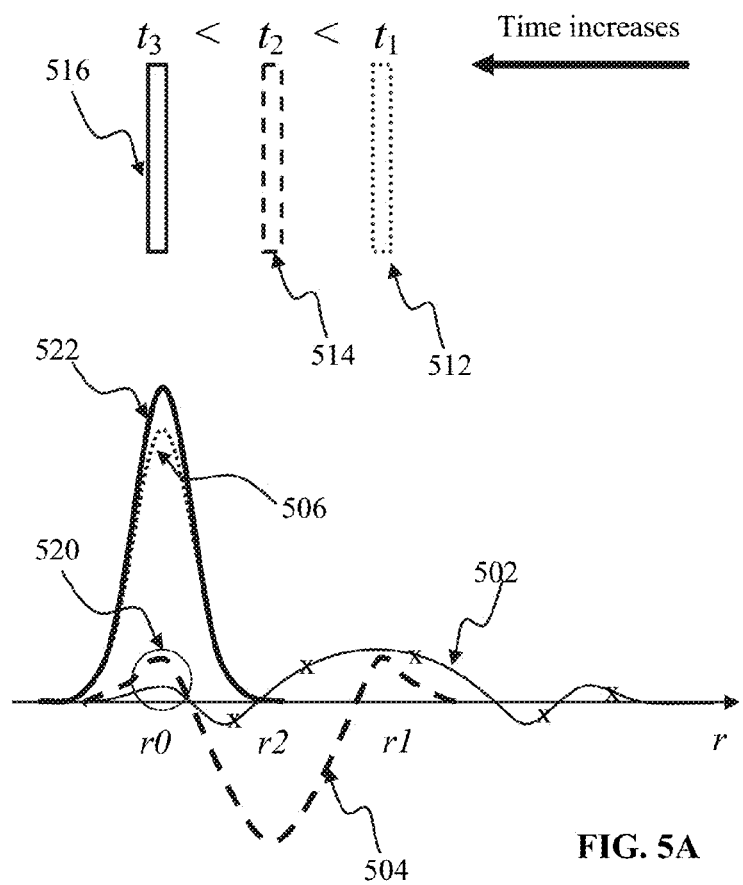
FIG. 5A is a plot illustrating coupled cone response to moving on-center stimulus in accordance with one or more implementations.

Furthermore, the wave-like horizontal propagation of a cone responses with time (illustrated, for example, by the curves 410, 420 in FIG. 4A) improve response of the cone layer, configured in accordance with the principles of the present innovation, to contrast changes that move across the pixel frame, as illustrated in FIG. 5. The solid curve 502 marked with 'x' in FIG. 5 depicts response of a cone, located at r1, to a stimulus (the bar 512) that was placed at the location r1 at time t1. Similarly, the broken curve 504 in FIG. 5A depicts response of a cone, at a location r2, to a stimulus (the bar 514) that was placed at the location r2 at time t2. When the cone located at r0, is exposed to the same stimulus (the bar at location 516), the cone response, denoted by a dotted line 506, may be aided by the positive peaks in the cone responses 502, 504, in the vicinity of r0, as indicated by the arrow 520. Hence, the combined response, 522 of the cone layer at the location r0 may be more likely to respond to, for example, a moving edge, due to 'horizontal coupling' to cones at nearby locations (e.g., r2, r3).

Figure 5B:
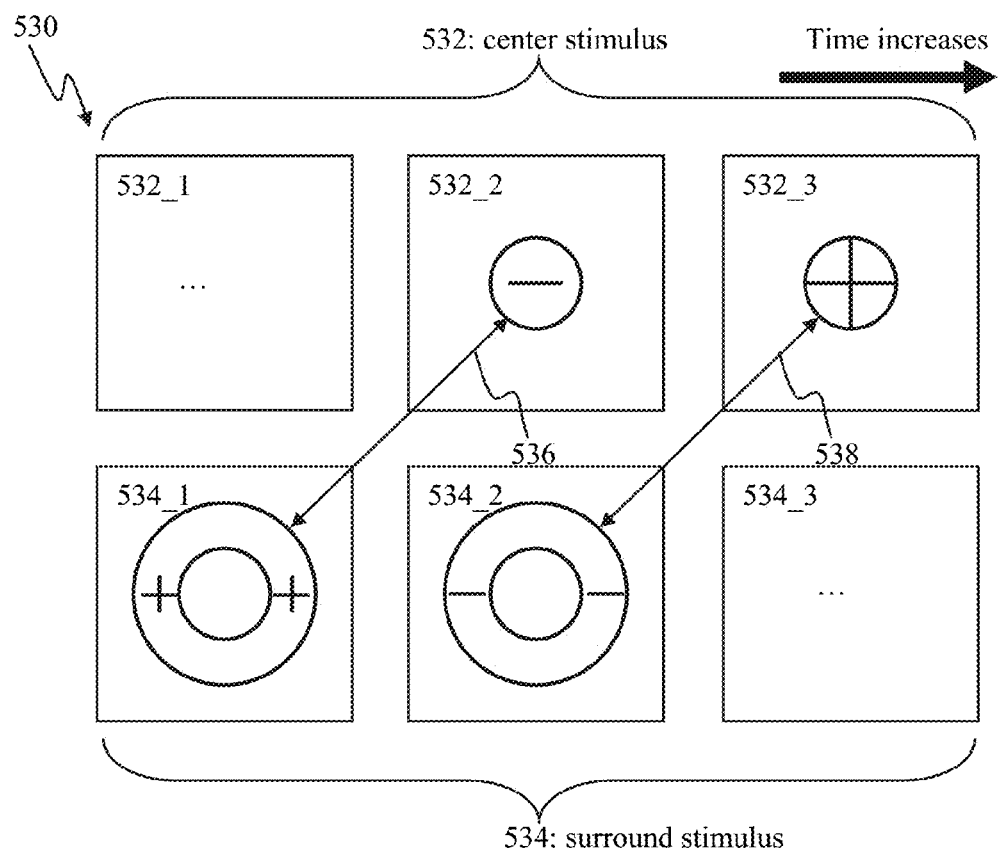
FIG. 5B is a graphical illustration depicting temporal response of diffusively coupled cone layer in accordance with one or more implementations.

FIG. 5B illustrates one realization of the cone layer spatiotemporal response, corresponding to the framework described with respect to Eqns. 3-6. The responses of diffusively coupled cone layer, such as shown and described with respect to FIG. 5A enable to obtain non-separable spatiotemporal response. Non-separable spatiotemporal responses are not subject to the constraint of Eqn. 1 and are advantageously configured to reproduce optimal neuroretinal response, as illustrated below.

FIG. 5B presents two groups of stimulus frames 530 comprising ON-center 532 and off-surround stimuli. This is diagrammatically shown by the circles marked with '−' an '+' in frames 532_2, 532_3 in FIG. 5B, respectively. Similarly, the optimal on-surround stimuli may comprise a positive stimulus followed by a negative stimulus, as illustrated by rings marked with '+' and '−' in frames 534_1, 534_2, respectively, in FIG. 5B. The cone responses, shown and described by curves 504, 506 in FIG. 5A supra, produce cone layer output such that negative off-surround response (e.g., frame 534_2) that is followed in time by the positive on-center response (frame 532_3) would reinforce one another (as shown by the curve 522 in FIG. 5A). In other words, optimal overall frame stimulus may comprise an on-surround (positive surround) stimulus followed by off-center (negative center) stimulus (e.g., frames 534_1, 532_2 in FIG. 5B); and/or an off-surround (negative surround) stimulus followed by on-center (positive center) stimulus (e.g., frames 534_2, 532_3 in FIG. 5B). Such time-space response H(r,t) is typically referred to as non-separable, as the temporal portion (i.e., frame-to-frame changes) is dependent on the spatial portion (center/surround) stimulus changes within the frame) The cone layer response to the stimulus of the frame pair 534_2, 532_3, denoted by the arrow 538, and/or frames 534_1, 532_2, denoted by the arrow 536 in FIG. 5B, is advantageously optimally approximates the neuroretina response.

Response Time Control Via Diffusive Lateral Connectivity

Response of diffusively coupled cones may be effected by implementing different diffusive realizations, as described in detail below.

In some implementations, system of two linear diffusion equations, governing membrane voltage h(t) and current c(t) o may be expressed as follows:

$$\frac{dc}{dt} = \frac{I-h}{\tau_c},$$ (Eqn. 12)

$$\frac{dh}{dt} = \frac{c-h}{\tau_h} + D\Delta h,$$ (Eqn. 13)

where D is the diffusion coefficient and $\tau_c$, $\tau_h$ may be used to control current and voltage parameters of the cone layer.

Implementation of Eqn. 12-Eqn. 13 enables to obtain faster cone voltage response (compared to the response provided by Eqn. 3-Eqn. 4, for the same value of parameters). The 'speed up' of the cone response of Eqn. 12-Eqn. 13 due, at least partly, simplified dynamics that enables faster computations at the expense of less precise control.

When parameters of methodology described by Eqn. 12-Eqn. 13 may be selected such that:

$$\frac{1}{\tau_h} >> D, h \approx c$$

And the cone layer may be characterized by strong responses (output f) and weak lateral inhibition, due to the weak diffusive coupling (the term $D\Delta h$).

In another implementation, membrane potential decay of Eqn. 13 may be expressed as:

$$\frac{dh_i}{dt} = \frac{I-h_i}{\tau_h} + D\Delta h,$$ (Eqn. 14)

where $\Delta$ is the Laplace operator. In one implementation, configured to impose low computational load, the output of the cone governed by Eqn. 14 may be expressed as:

$$f=I-h=-\tau D\Delta h.$$ (Eqn. 15)

Figure 7A:
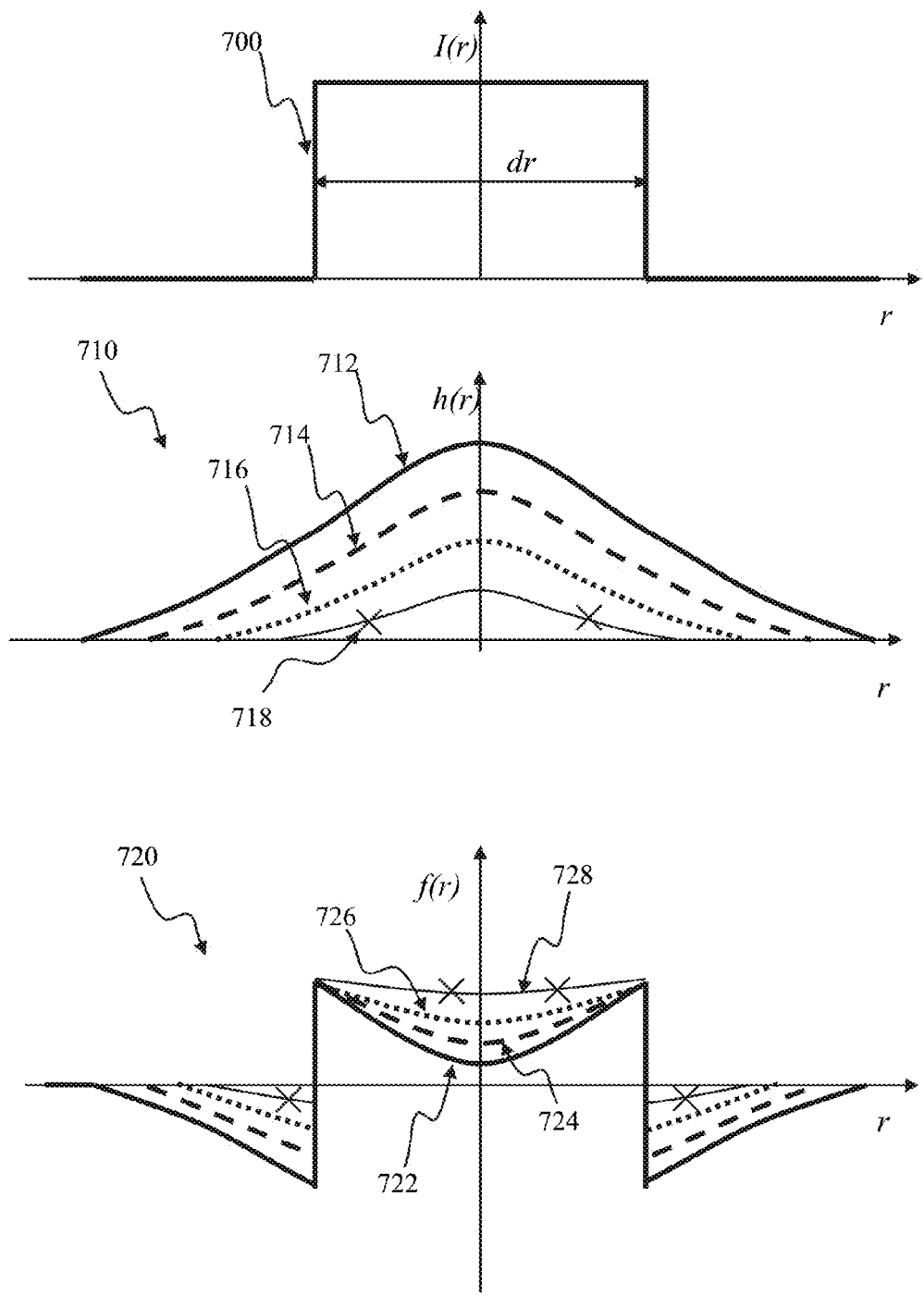
FIG. 7A is a graphical illustration of damped wave cone response to stimulus in accordance with one or more implementations.
Figure 7B:
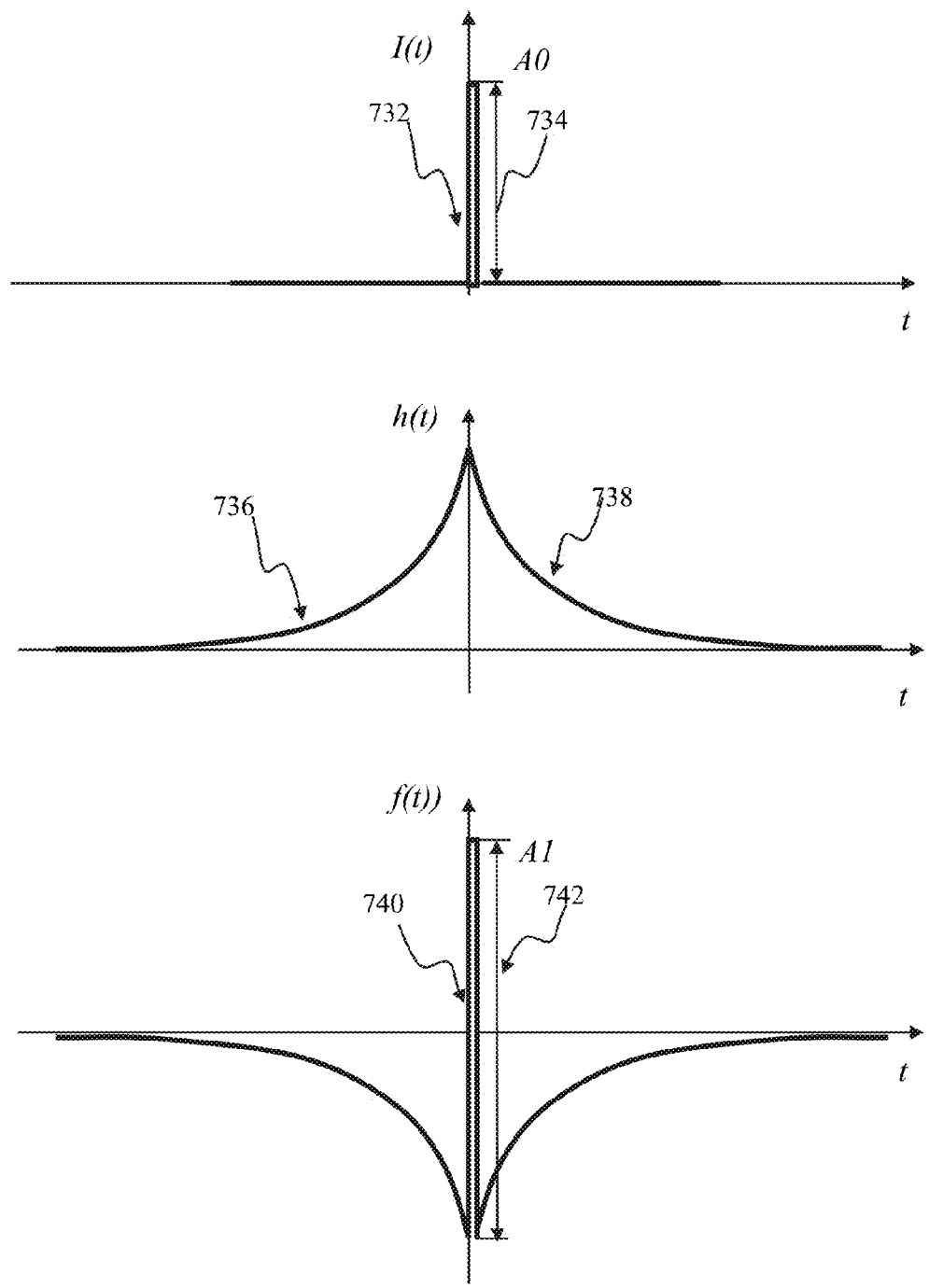
FIG. 7B is a graphical illustration of damped wave cone response to stimulus in accordance with one or more implementations.

FIGS. 7A-7B. illustrate response of a cone layer operated according to output Eqn. 14-Eqn. 15. As shown in FIG. 7A, a stimulus pulse of width dr (depicted by the curve 700) causes a membrane voltage h that decays and 'furls-in' (e.g., the spatial extend r of the non-zero voltage region becomes smaller) in time, as depicted by the curves 712, 714, 716, 718, respectively. The output response of the cone f(r), shown by the curve group 720 in FIG. 7B, illustrates greater initial response contrast, (e.g., the curve 722 in FIG. 7A), comprising negative-to-positive and positive-to-negative steps, that gradually decrease and flatten out with time.

FIG. 7B presents cone response to a stimulus 730 of a small spatial extent (corresponding to an edge), of an amplitude A0, denoted by the arrow 734. The input a stimulus 730 causes a membrane voltage h that spreads out to neighboring cones, illustrated by the curves 736, 738. The output response of the cone 740 shows a sharp edge and increased amplitude swing A1>A0, denoted by the arrow 742. Cone output, illustrated in FIGS. 7A, 7B, facilitates feature detection by the subsequent layers of visual processing apparatus.

In one or more implementations of the disclosure, one or more parameters of Eqn. 3-Eqn. 4 (i.e., diffusion coefficient D, coupling coefficient $\alpha$, and time constants $\tau_c$, $\tau_h$ may be varied to tune various characteristics of horizontal cone coupling thereby controlling, inter alia, cone response time, amplitude, decay rate, and/or frequency of damped oscillations (illustrated in FIG. 4A). The coupling coefficient $\alpha$, and time constants $\tau_c$, $\tau_n$ may be varied to tune various characteristics of horizontal cones. In some implementations, the parameter D may be set D=0.4, coupling coefficient $\alpha$=0.1, $\tau_c$=100 ms, $\tau_n$=300 ms, as described in detail with respect to FIG.>13A, below.

By way of illustration, when current time decay parameter $\tau_c$ is small ($\tau_c$<<1), the Eqn. 3 becomes:

$$c=I$$ (Eqn. 16)

so that the voltage state equation Eqn. 4 may be expressed as:

$$\frac{\partial h_i}{\partial t} = \frac{I - h_i}{\tau_h} + D\Delta h. \quad \text{(Eqn. 17)}$$

The output of the dynamic system may be then found as $$f = I - h \quad \text{(Eqn. 18)}$$

Figure 7C:
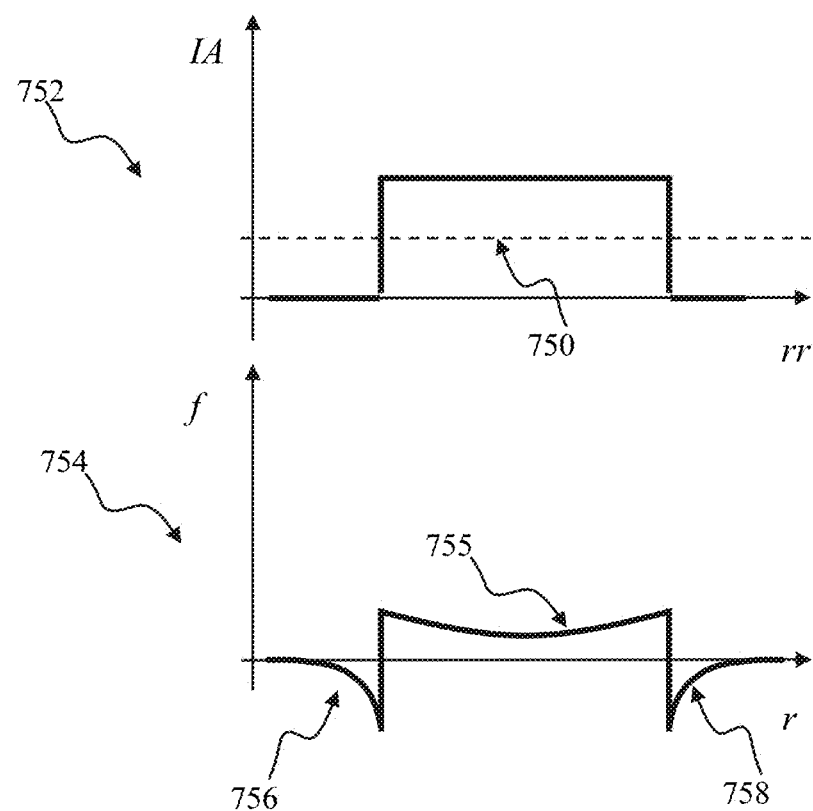
FIG. 7C is a graphical illustration of damped wave cone response to contrast stimulus in accordance with one or more implementations.

In other words, the output response of a cone of Eqn. 16-Eqn. 17 is equal to the input stimulus less the cone membrane voltage, as illustrated in FIG. 7C.

Cone layer responses illustrated in the implementations of FIGS. 7A-7C advantageously aid contrast detection by, at least partly, removing the average stimulus level (the background), depicted by the broken line 750 in FIG. 7C. Specifically, the unipolar step-like inputs (the curves 700, 732, 752) may be transformed by the diffusively coupled cone layer (depicted by the curve 754 in FIG. 7C) into bi-polar output f(t) comprising a positive portion 755 and negative portions 756, 758. The positive and the negative portions of the cone layer response may elicit excitatory and inhibitory responses in subsequent processing layer, for example, the neuron layer 324 of FIG. 3A and/or one (or more) neuron units 564 in FIG. 5C. The bi-polar output of the diffusively coupled cone layer advantageously does not require a separate mean layer removal mechanism. The bi-polar output of the diffusively coupled cone layer is therefore invariant to the absolute level of the input stimulus. The bi-polar output of the diffusively coupled cone layer is advantageously responsive to contrast changes (e.g., derivative of the stimulus).

Diffusive Cone Coupling Via Resistive Network

Figure 6:
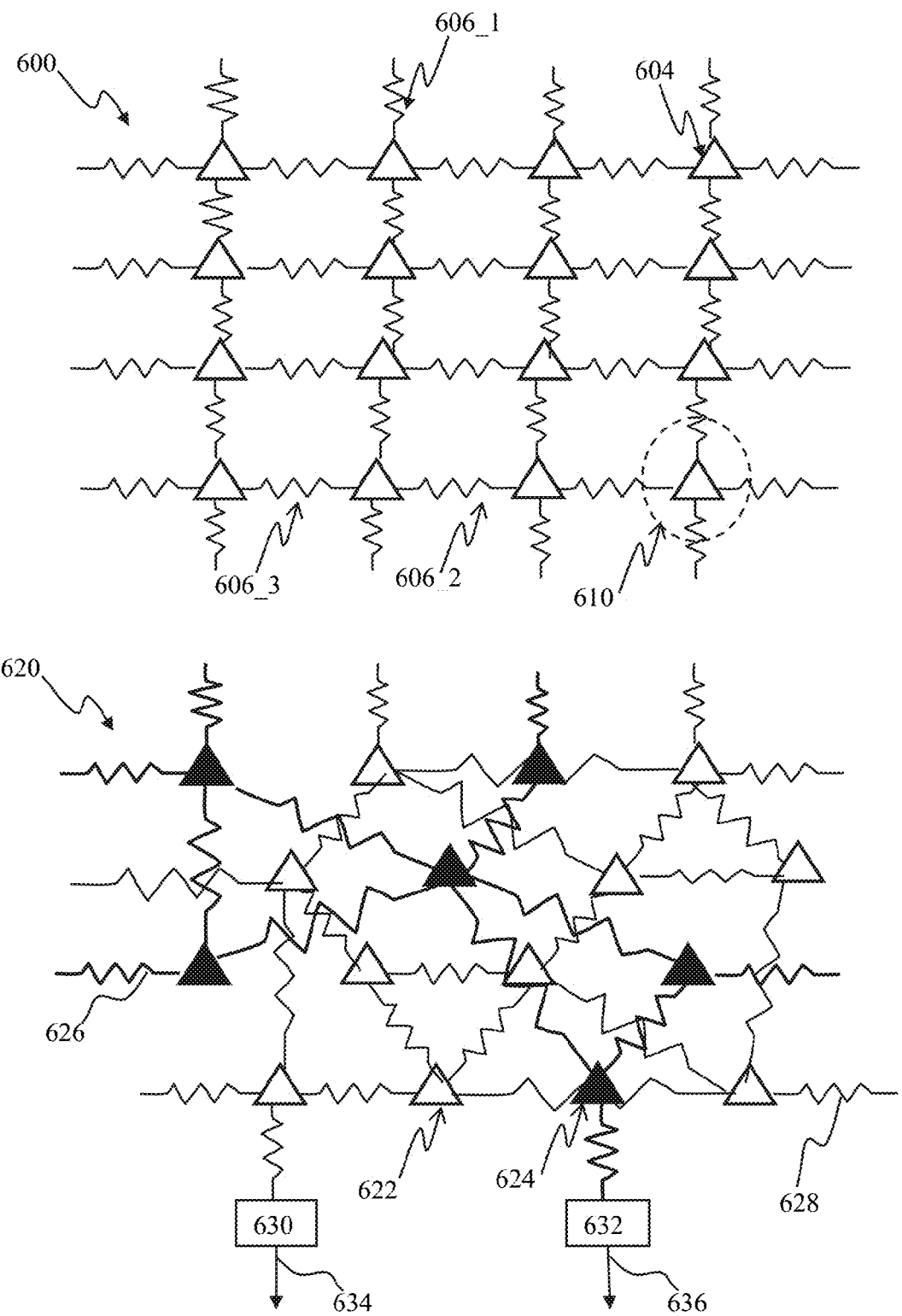
FIG. 6 is a graphical illustration depicting resistive network for effecting horizontal diffusive connectivity in photoreceptive layer of artificial retina apparatus, according to one or more implementations.

FIG. 6 illustrates one or more implementations of photoreceptive block of artificial retina apparatus comprising diffusive coupling framework, described, for example by Eqn. 3-Eqn. 4 above. The photoreceptive block shown in panel 600 may comprise a grid of photoreceptive cells 604 coupled by resistive network comprising resistors 602. A is appreciated by those skilled in the arts, the resistive network of panel 600 may comprise single type resistors, e.g., the resistors 606_1 of the same value.

In one or more implementations, resistor types and/or values may be configured to effectuate one or more diffusive process of Eqns. 3-14, described supra. Various applicable resistive network manufacturing technologies may be used with the resistive network of disclosure, such as, for example, discrete resistors, thick film, thin film, integrated resistors, integrated high value resistors, CMOS resistors via substrate etching. In one or more implementations, the resistive connections may be effectuated using exponential relationship between current and voltage (i.e., exponential conductance) between source and drain of a transistor. In some implementations, the resistive element may comprise bipolar junction transistor. In some implementations, the resistive element may comprise metal-oxide-semiconductor field-effect transistor (MOSFET).

In some implementations, locations of the grid may be jittered in the grid plane, as illustrated by broken line curve 610 in FIG. 6. Such position jitter may be used, for example, to effectuate stochastic sampling configured to implement anti-aliasing of the pixel image without additional computational load. In some implementations, the position jitter stochastic sampling may be augmented by a matched reconstruction filter.

The random displacement dr may be determined, in some realizations, using normal distribution. In some implementations, position jitter may be obtained using Poisson distribution. The use of position jitter may advantageously arise from a reduced tolerance associated with the integrated circuit manufacturing process, thereby reducing cost of processing apparatus.

In one or more implementations, the grid may comprise photoreceptors of two (or more) types as illustrated in the panel 620 of FIG. 6. The black triangles 624 denote first photoreceptors type (e.g., S-cones), while white triangles 624 denote second photoreceptors type (e.g., L-cones). As illustrated in panel 620 by the links 626, 628, the photoreceptors of individual types may be connected with one another independently from photoreceptors of another type (e.g., the photoreceptors 624, 622, respectively). In some implementations, the photoreceptor interconnect map may be constructed using Delaunay-Voronoi (V-D) tessellation.

In some implementations, output of the one or more photoreceptive grids (e.g., corresponding to the photoreceptors 624, 622 in FIG. 6) may be coupled to one or more output blocks 630, 632, configured to convert, for example, photoreceptor voltage signal into spiking output 634, 636.

In some implementations, the resistive network (such as shown in FIG. 6) may be utilized to form a smoothing filter, where recorded values of adjacent pixels may affect the center pixel. In digital computation, such filtering may be typically computationally expensive, while in a resistive network (such as shown in FIG. 6) the filtering may be performed natively on the imaging chip, without increasing computational load.

Output Block

In one or more implementations, the retinal apparatus (e.g., the apparatus 300 of FIG. 3) may comprise an output block (layer), configured to interface to the photoreceptive block and to convert the cone output for further use by, inter alia, by neuronal visual processing network or neuroretina.

Neuronal Output Block

In some implementations, the output block may comprise spiking neuron network, illustrated by broken line rectangle denoted 324 in FIG. 3A. The network 324 may comprise two unit types Parasol units (PU) and midget units (MU), configured to approximate behavior of natural retina RGC midget cells (PC) and parasol cells (MC), respectively. In one or more implementations, the units of individual types may be placed on a hexagonal grid. There may be approximately 9 times as many MUs compared to PUs, and the receptive fields of the MU may be accordingly smaller. In some implementations, the output network layer 324 may comprise only units of one type (either MU or PU).

In one or more implementations, additional unit type may be used to implement functionality supported by small bi-stratified cells (SBC) of neuroretina (SBCU). In some implementations, the neuron layer may be configured to comprise on- and off-SBCUs. In some implementations, the neuron layer may be configured to comprise blue-OFF center channel handled by the midget units and blue-ON center by the SBCUs.

In some implementations, the neuron units may be connected to the cone layer via connections (e.g., the connections 322 in FIG. 3A), as described in detail with respect to FIG. 5C, below.

Temporal response of parasol and midget units is illustrated in FIG. 12, according to one or more implementations. The parasol response, shown in panel 1200, may comprise positive 1202 and a negative lobe 1212. The MU response, illustrated by the panel 1220 in FIG. 12, also may comprise a positive 1222 and a negative 1232 lobes. However, the width of the positive lobe 1226 may be typically more than twice the width of the negative lobe 1236, while the maximum positive response amplitude 1224 may be substantially greater (2-5 times in some implementations) than the maximum negative response amplitude 1234. In one or more implementations, the PU may be characterized by a fast bi-phasic response, while MU may be characterized by a more sustained response.

In some implementations, the midget and parasol units may differ in their input connectivity and/or in the filtering of the input they receive from the model cone units. In some implementations, the tonic character of the MUs response may be effectuated by, at least partly, low-pass filtering their input. In one or more implementations, the tonic character of the midget unit response may be effectuated by higher sensitivity of the MUs to weaker stimuli that is achieved by renormalizing their input using input variance.

In one or more implementations, the parasol and the midgets units may be configured to comprise spatio temporal characteristics of a biological RGC layer. In some implementations, the MUs may be characterized by spatially smaller receptive fields, relative to the PUs. The spatial dimensions of the receptive fields of the midget units may be adjusted by controlling parameters of the diffusive process within the photoreceptive layer (e.g., Eqn. 12-Eqn. 13). The parasol units may be configured to comprise spatially larger receptive fields (compared to the MUs). In one implementation, such larger receptive fields may be effectuated by pooling responses from multiple units of the photoreceptive layer (e.g., the units 314 of FIG. 3A).

In some implementations, lateral connections between the RGCs may contribute to their response, particularly to the surround stimulation.

In some implementations, the prolonged (tonic) response of the MUs may be configured based on their time-integral properties, where the MU response may be configured based at least in part on a time integral of the MU input. The PUs may be configured to produce more brief (or phasic) response and may be more sensitive to rapid changes in brightness and less sensitive to slow or sustained changes, compared to the PUs. Time course of the PU response may be closely augmented by the time course of the cone response.

In some implementations, both PUs and MUs may be configured to implement center-surround opponency of their receptive field, as explained above. Such configuration of the midget and the parasol units, may be suited for detecting coherence in the input signal with the MUs being more sensitive to slower motion and the PUs being more sensitive to faster motion of objects in the visual scene.

In some implementations, the PUs may be configured to receive same strength input from L and M cones, whereas MUs may receive opposite input from L and M cones. Thus PUs may be sensitive primarily to changes in brightness. The MUs may be also sensitive to red vs. green chromaticity. In one or more implementations, the S-cone inputs (blue) may be either handled by a special class of MUs or by a different class of RGCs (small bi-stratified cells (SBCs)) altogether. In some implementations, yellow-blue chromaticity may be described as (L+M)/2 vs. S cone input opponency.

In one or more implementations, the spike generation mechanism used by the PUs and/or MUs may comprise log-encoding of spike latency as described, for example, in a co-owned U.S. patent application Ser. No. 12/869,573, entitled "SYSTEMS AND METHODS FOR INVARIANT PULSE LATENCY CODING", and co-owned U.S. patent application Ser. No. 12/869,583, filed Aug. 26, 2010, entitled "INVARIANT PULSE LATENCY CODING SYSTEMS AND METHODS", each of the foregoing incorporated herein in its entirety.

Output Signal Conditioning

In one or more implementations, the output block may comprise signal conditioning block (e.g., the block 354 in FIG. 3B) configured to convert the output of the photoreceptive block (e.g., cone membrane voltage h(t), shown in FIGS. 7A-7B below) into current output c(t), configured to stimulate, for example, neuroretinal cells (e.g., RGCs) in a retinal prosthetic applications. In some implementations, the current output may be utilized to interface to analog front end of image processing apparatus used in a robotic device, as described in detail below with respect to FIG. 10A.

Cone to Neuron Layer Connectivity

Figure 1:
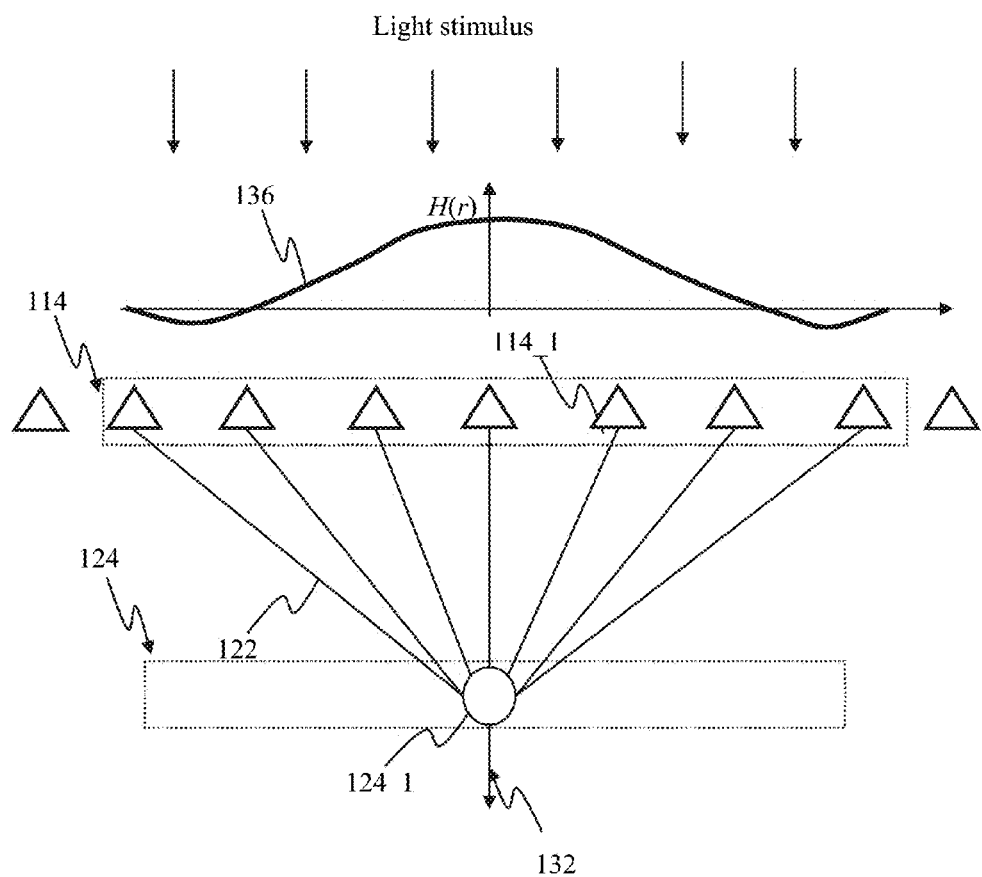
FIG. 1 is a graphical illustration depicting fixed connectivity of artificial retina according to prior art.

The output block of the retinal apparatus (e.g., the blocks 324, of FIG. 3A, and 354 of FIG. 3B) may be coupled to the photoreceptive block via connections 322, 342. Most existing implementations require multiple pre-determined cone to output (neuron) connections in order to obtain the desired spatial response (e.g., DoG) of the retinal apparatus, as illustrated in FIG. 1

Figure 5C:
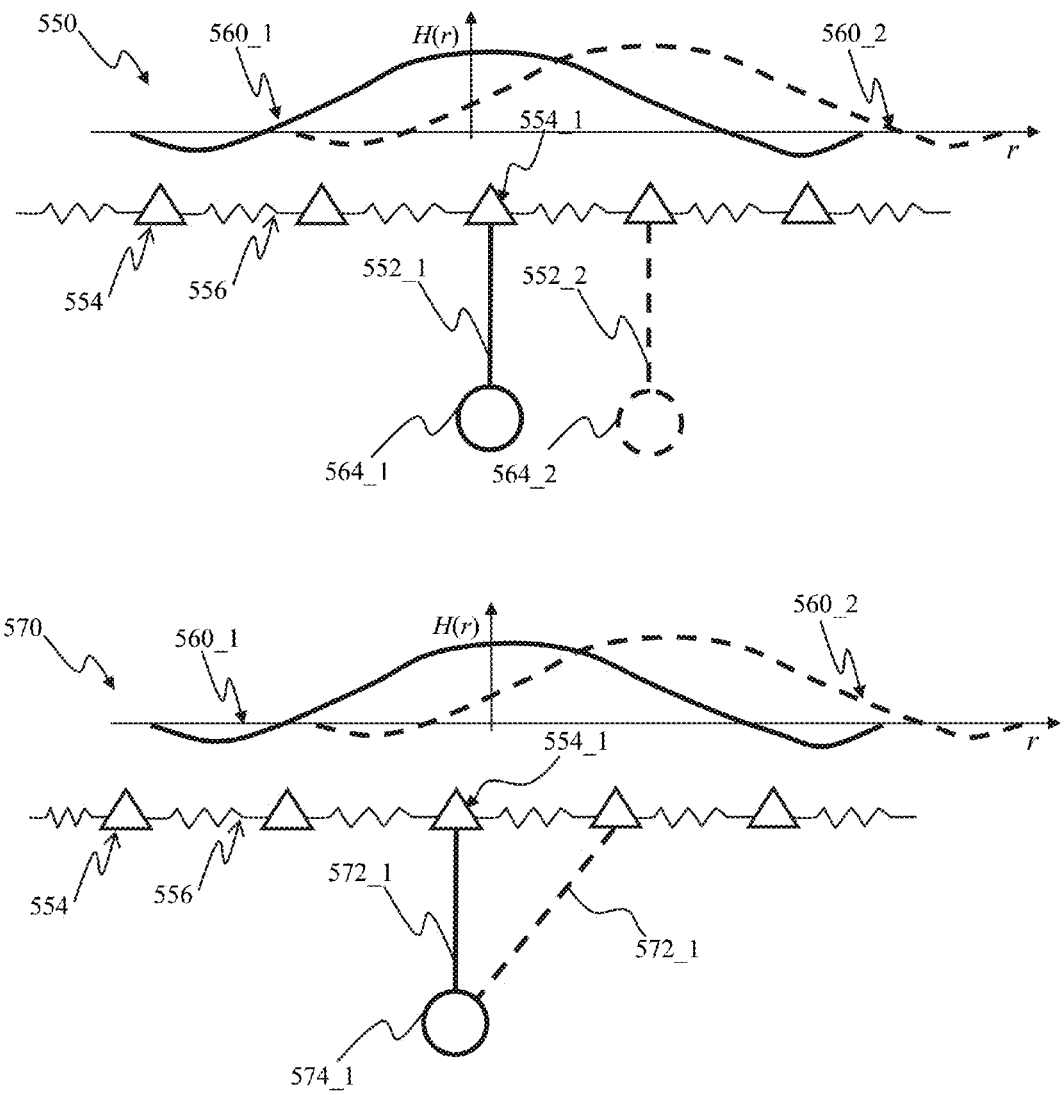
FIG. 5C is a graphical illustration depicting spatial difference-of-Gaussians response achieved in output layer of artificial retina apparatus, comprising diffusively coupled photoreceptive layer, according to one or more implementations.

The retinal apparatus of the disclosure, comprising diffusively coupled photoreceptive layer, described herein, advantageously enables to obtain, inter alia, DoG spatial response of the retinal apparatus using a single cone to output block connection, as illustrated with respect to FIG. 5C. As shown in FIG. 5C, the photoreceptive layer of the retina apparatus 550 may comprise several diffusively coupled cones (as denoted by the resistive links 556 in FIG. 5). One of the cones, e.g., the cone 554_1, may be coupled to the unit 564 of the output block. As described with respect to FIGS. 3A-3B, the output layer may comprise neuronal network and the unit 564_1 may comprise a spiking neuron, in some implementations. Diffusive cone coupling and cone to neuron connection 552_1 cooperate to cause generation of the DoG spatial retina response, depicted by the curve 560_1 in FIG. 5C. Coupling the photoreceptive block to the output block via a different connection (e.g., the connection 552-2 to the output unit 564_2 in FIG. 5C), may cause a different spatial retina response, depicted by the curve 560_2 in FIG. 5C. Retinal configuration illustrated in FIG. 5C, provides for the desired spatial response, with fewer connections, compared to the configuration of prior art, illustrated in FIG. 1. This, advantageously allows for construct less expensive and simpler implementations of the retinal apparatus while maintaining the desired response properties. In one or more implementations, the units 564 may comprise non-spiking neurons, configured to model bi-polar cells of neuroretina.

Diffusive coupling structure of the cone layer, advantageously allows for simplified connections between the cones. In one or more implementations, such simplified connectivity may be configured to reduce (or eliminate altogether) built-in (hard wired) delays presently used by the prior art. Hence, an apparatus utilizing diffusive connectivity of the present disclosure may reduce hardware complexity, and/or cost and improve performance and flexibility.

Exemplary Methods

Figure 8A:
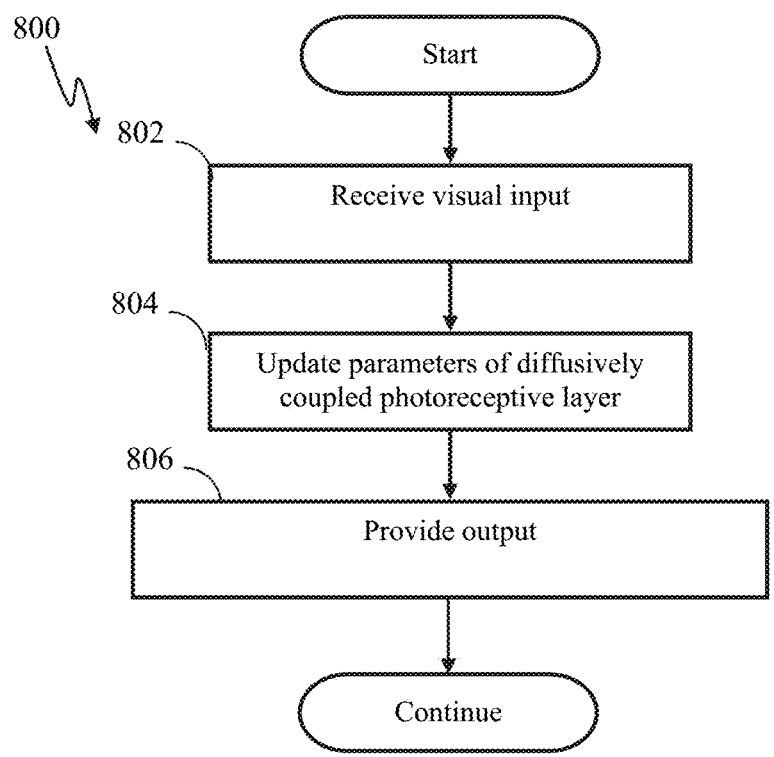
FIG. 8A is a logical flow diagram illustrating generalized method of increasing response of retinal apparatus due to diffusive cone coupling in accordance with one or more implementations.

Referring now to FIG. 8A exemplary method of increasing response of retinal apparatus of the disclosure due to diffusive cone coupling in accordance with one or more implementations is shown and described.

At step 802 of method 800 of FIG. 8A, visual input may be received by the photoreceptive layer. In one or more implementations, the photoreceptive layer may comprise diffusively coupled cone layer operable to any of the diffusion processes described above. In one or more implementations, such as, for example, artificial retinal prosthetic 1050 illustrated in FIG. 10B, described in detail below, the visual input may comprise ambient light stimulus 1052 captured through, inter alia, optics of an eye. In some implementations, such as, for example, encoding of light gathered by a lens 1064 in visual capturing device 1160 (e.g., telescope, motion or still camera, microscope, portable video recording device, smartphone), illustrated in FIG. 10B below, the visual input received at step 802 of method 800 may comprise ambient light stimulus 1062 captured by, inter alia, device lens 1064 or output of the imaging (CMOS/APS) array. In one or more implementations, such as, for example, retinal encoder 1076 configured for digitized visual input in a processing apparatus 1070 (e.g., portable video recording and communications device) described with respect to FIG. 10B, below, the visual input of FIG. 8 may comprise digitized frame pixel values (RGB, CMYK, grayscale) refreshed at suitable rate. In one or more implementations, the visual stimulus corresponds to an object (e.g., a bar that is darker or brighter relative to background) for a feature being present in the field of view associated the retinal apparatus.

At step 804, the dynamics of the photoreceptive layer retinal cone layer (e.g., the layer 314 of the apparatus 310) may be operated according to, for example, diffusion model governed by Eqn. 3-Eqn. 4 may be updated.

At step 806, the photoreceptive layer may provide output. In some implementations, the output response of the photoreceptive apparatus may be increased due to, at least in part, diffusive cone coupling, as described in detail with respect to FIG. 5, supra.

Figure 8B:
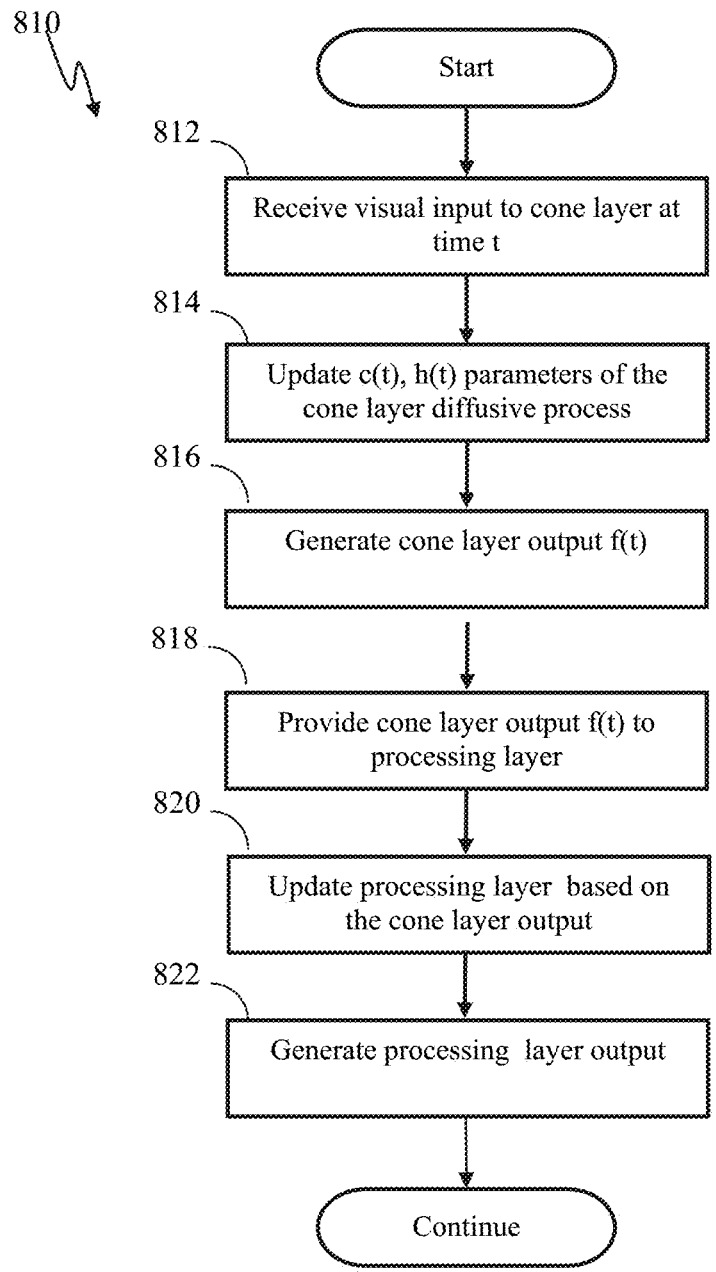
FIG. 8B is a logical flow diagram illustrating generalized method of visual input encoding using retinal apparatus comprising diffusively-coupled layer in accordance with one or more implementations.

FIG. 8B illustrates exemplary method of visual input encoding using retinal apparatus comprising diffusively-coupled layer in accordance with one or more implementations.

At step 812 of method 810, visual input may be received at time t. As described above with respect to FIG. 8A, visual input may comprise ambient light input, output of a CMOS imager array or digitized stream of pixels. In one or more implementations, the visual stimulus corresponds to an object (e.g., a letter that is darker or brighter relative to background) for a feature being present in the field of view associated the retinal apparatus.

At step 814, the dynamic parameters of the photoreceptive layer (e.g., the cone layer 314 of the apparatus 310 of FIG. 3) may be updated according to, for example, diffusion model governed by Eqn. 3-Eqn. 4. In some implementations, corresponding to retinal prosthetic, the cone response encodes the input using e.g., the response 522 in FIG. 5, which may be conditioned by the retinal output layer (e.g., layer 354 of FIG. 3B) and coupled to e.g., RGCs of the patient.

At step 816, the photoreceptive layer may generate output. In some implementations, the output response of the photoreceptive apparatus may be increased due to, at least in part, diffusive cone coupling, as described in detail with respect to FIG. 5, supra.

At step 818, the output of the photoreceptive layer may be provided to a processing layer. In some implementations, the processing layer may comprise neuron layer 324 of FIG. 3A and/or one (or more) neuron units 564 in FIG. 5C. In some implementations, the processing layer may comprise neuroretina RGC layer. In some implementations, the processing layer may comprise analog processing layer.

At step 820, the processing layer may be updated based on the output of the photoreceptive layer. In some implementations, the neuroretinal RGC cells may also provide lateral input to one another thereby facilitating feature detection.

In some implementations, corresponding to video capturing and encoding, the cone responses may be coupled to output layer comprising spiking neuron network (e.g., the layer 334 of FIG. 3B) and encoded into spikes using, for example, methodologies described in e.g., co-owned U.S. patent application Ser. No. 12/869,573, filed Aug. 26, 2010, entitled "SYSTEMS AND METHODS FOR INVARIANT PULSE LATENCY CODING", and U.S. patent application Ser. No. 12/869,583, filed Aug. 26, 2010, entitled "INVARIANT PULSE LATENCY CODING SYSTEMS AND METHODS"; polychronous spike trains, see for example, U.S. patent application Ser. No. 13/117,048, filed May 26, 2011, entitled "APPARATUS AND METHODS FOR POLYCHRONOUS ENCODING AND MULTIPLEXING IN NEURONAL PROSTHETIC DEVICES", incorporated supra. In some implementations, the output may be encoded using spike generation mechanism described, for example, in a co-pending and co-owned U.S. patent application Ser. No. 13/487,533, entitled "SPIKING NEURON NETWORK APPARATUS AND METHODS", filed Jun. 4, 2012, incorporated herein by reference in its entirety.

Figure 10A:
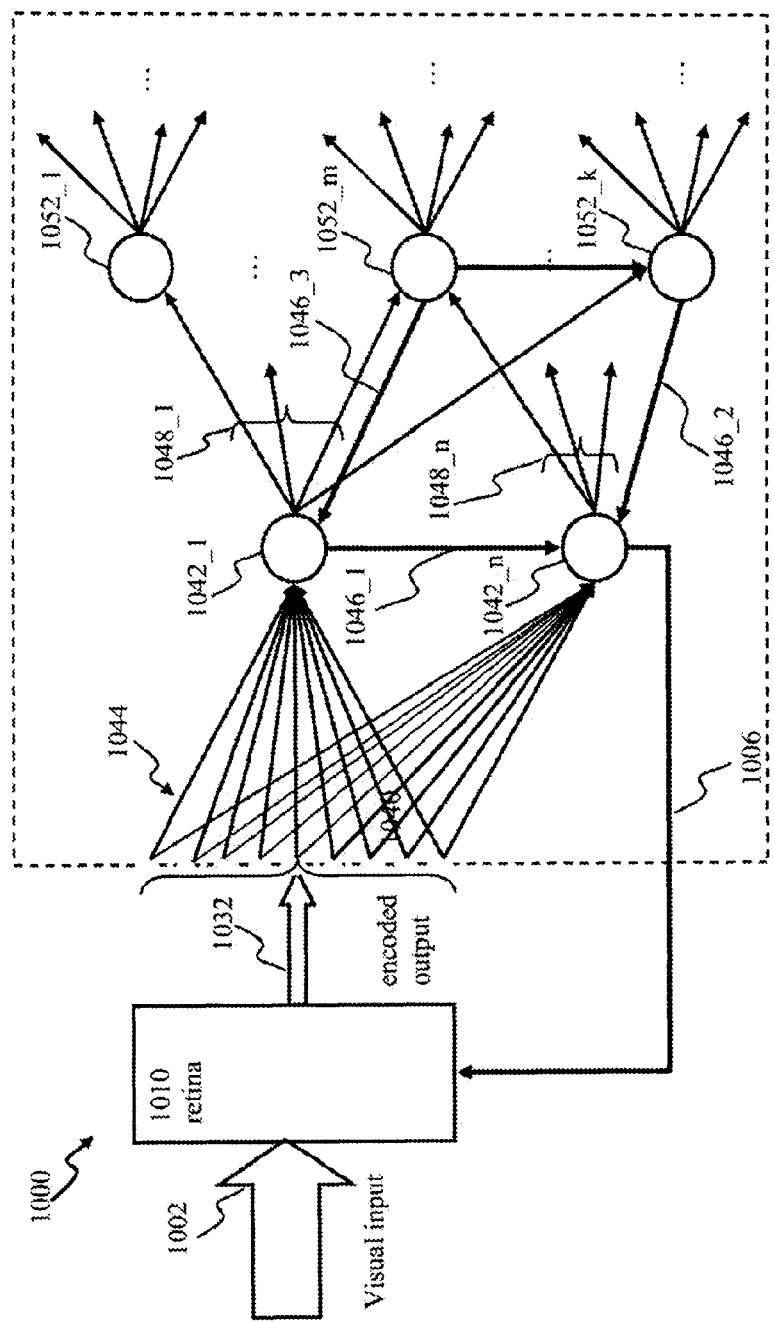
FIG. 10A is a block diagram illustrating visual processing apparatus comprising retinal encoder configured in accordance with one or more implementations.

At step 822, the encoded retinal output (e.g., spike stream) may be provided to, e.g., spiking network apparatus 1040 of FIG. 10A, for further processing.

At step 822, the processing layer may generate output. In some implementations, the output of the processing layer may comprise signal indicative of feature associated with the visual input. In some implementations, the processing layer output may comprise compressed visual input.

Figure 9A:
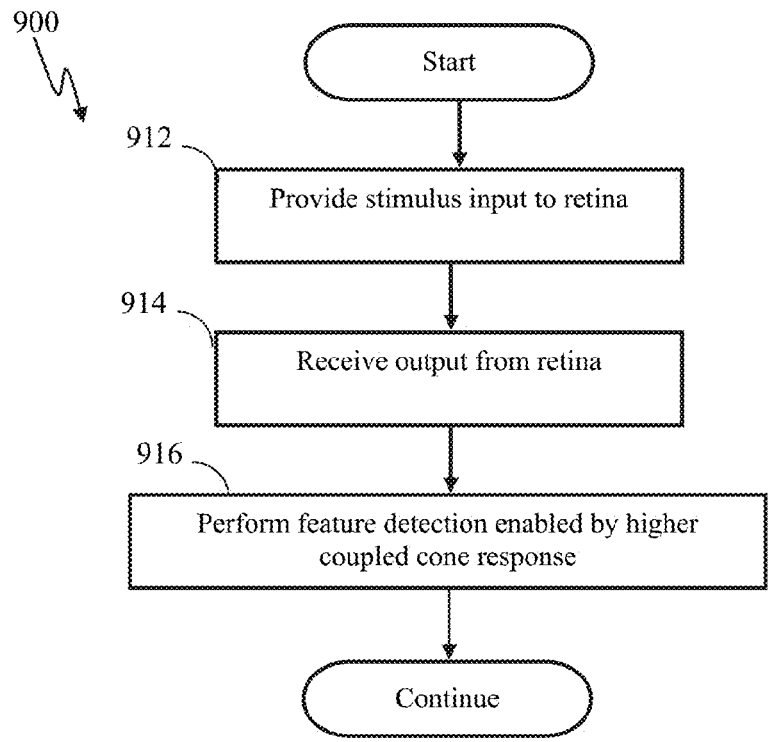
FIG. 9A is a logical flow diagram illustrating generalized method of feature detection using retinal apparatus comprising diffusively coupled cones in accordance with one or more implementations.

FIG. 9A is a logical flow diagram illustrating generalized method of feature detection using retinal apparatus comprising diffusively coupled cones in accordance with one or more implementations.

At step 912 of method 900, visual input may be provided to retinal apparatus (e.g., the apparatus 300 of FIG. 3). As described above with respect to FIG. 8A, visual input may comprise ambient light input, output of a CMPS imager array or digitized stream of pixels. In one or more implementations, the visual stimulus corresponds to an object (e.g., a letter that is darker or brighter relative to background) and/or a feature being present in the field of view associated the retinal apparatus.

At step 914, the retinal apparatus encodes the input into spikes or current pulses, as, for example, described with respect to FIGS. 8A and 8B, and the encoded retinal output (e.g., spike stream) is received, for example, by processing block 1040 of FIG. 10A.

At step 916, the processing block may perform feature detection using any applicable methodologies, such as, for example, described in U.S. patent application Ser. No. 13/152,119, filed Jun. 2, 2011, entitled "SENSORY INPUT PROCESSING APPARATUS AND METHODS". Feature detection may be advantageously enabled by, at least partly, higher coupled cone response to graded stimulus as illustrated in FIG. 5, supra.

Figure 9B:
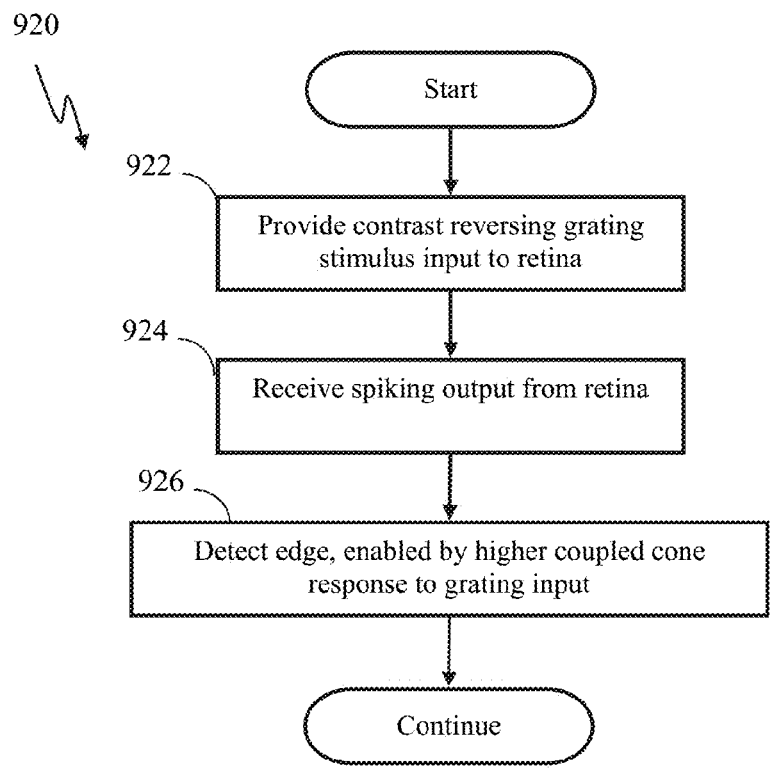
FIG. 9B is a logical flow diagram illustrating edge detection method using retinal apparatus comprising diffusively-coupled layer in accordance with one or more implementations.

FIG. 9B is a logical flow diagram illustrating edge detection method using retinal apparatus comprising diffusively-coupled layer in accordance with one or more implementations.

At step 922 of method 920, contrast reversing grating stimulus input may be provided to the retina apparatus (e.g., the apparatus 340 of FIG. 3B). In some implementations, this stimulus may comprise an object (a car, a bar, or a letter of different color/brightness relative to background) moving across retinal field of view.

At step 924, the retinal apparatus encodes the input into spikes or current pulses, as, for example, described with respect to FIGS. 8A and 8B, and the retinal output spike stream may be received by, for example, by processing block 1040 of FIG. 10A. In some implementations, the processing block may comprise processor of cellular telephone coupled to a video capturing device (e.g., camera) comprising artificial retinal apparatus of the disclosure. In one or more implementations, the processing block may be embodied in a remote server, coupled, for example, to several surveillance cameras equipped with the artificial retinal apparatus of the disclosure.

At step 926, the receiving apparatus encoded retinal output (e.g., spike stream) which may perform feature detection using any applicable methodologies, such as, for example, described in U.S. patent application Ser. No. 13/152,119, filed Jun. 2, 2011, entitled "SENSORY INPUT PROCESSING APPARATUS AND METHODS". Feature detection may be advantageously enabled by, at least partly, higher coupled cone response to graded stimulus as illustrated in FIG. 5, supra.

It will be appreciated by those skilled in the art that the methods described with respect to FIGS. 8A-9B may be also used to process inputs of various electromagnetic wavelengths, such as for example, visible, infrared, ultraviolet light, and/or combination thereof. Furthermore, the retinal encoder of the disclosure may be equally useful for encoding radio frequency (RF), magnetic, electric, or sound wave information.

Exemplary Apparatus

Various exemplary spiking network apparatus comprising diffusively coupled photoreceptive layer mechanism are described below with respect to FIGS. 10-11D.

Spiking Network Sensory Processing Apparatus

One apparatus for processing of visual information using artificial retinal approach described above is illustrated in FIG. 10A, according to one or more implementations. The processing apparatus 1000 may comprise retinal encoder 1010 (e.g., the encoder 310 of FIG. 3A, or encoder 340 of FIG. 3B) that may be configured to receive visual input signal 1002. In some implementations, such as, for example, artificial retinal prosthetic 1050 illustrated in FIG. 10B, described in detail below, this visual input may comprise ambient light stimulus 1052 captured through, inter alia, eye lens. In some implementations, such as, for example, encoding of light gathered by a lens 1064 in visual capturing device 1160 (e.g., telescope, motion or still camera), illustrated in FIG. 10A, this visual input may comprise ambient light stimulus 1062 captured by, inter alia, device lens 1064. In one or more implementations, such as, for example, retinal encoder 1076 configured for digitized visual input in a processing apparatus 1070 described with respect to FIG. 10B, the visual input 1002 of FIG. 10A may comprise digitized frame pixel values (RGB, CMYK, grayscale) refreshed at suitable rate.

Figure 10B:
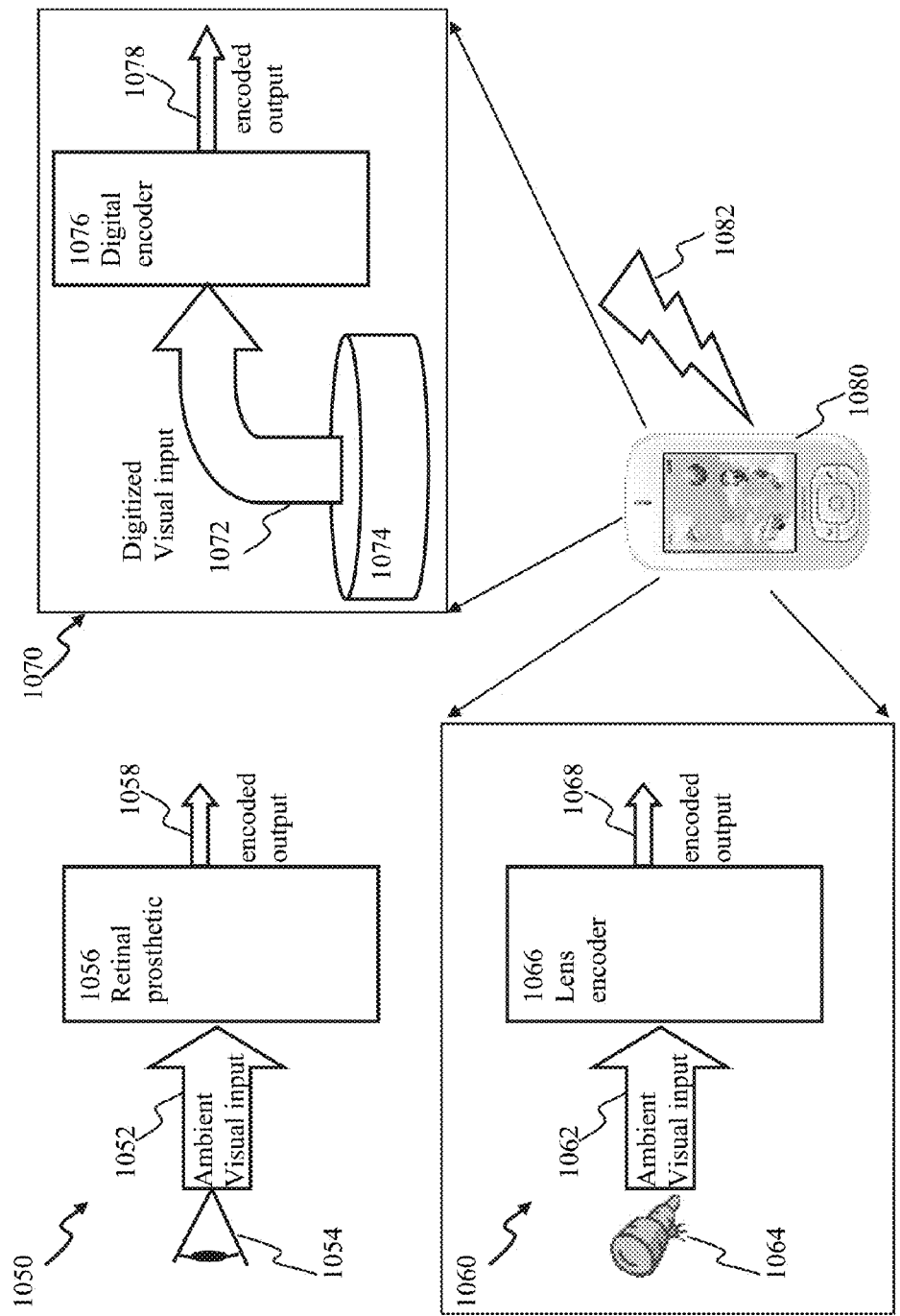
FIG. 10B is a block diagram illustrating retinal encoder of FIG. 10A configured for use in a prosthetic device adapted to process ambient visual signal; and/or processing of digitized visual signals in accordance with one or more implementations.

In some implementations, the input may comprise light gathered by a lens of a portable video communication device 1080 shown in FIG. 10B. In one implementation, the portable device may comprise a smartphone configured to process still and/or video images using diffusively coupled photoreceptive layer described in the resent disclosure. In some implementations, the processing may comprise image encoding and/or image compression, using for example processing neuron layer. In some implementations, encoding and/or compression image may be utilized to aid communication of video data via remote link (e.g., cellular, Bluetooth, WiFi, LTE, and/or other remote links), thereby reducing bandwidth demands on the link. In one or more implementations, compression of up to 1000 may be achieved using encoding methodology of the disclosure.

In some implementations, the input may comprise light gathered by a lens of an autonomous robotic device (e.g., a rover, an autonomous unmanned vehicle, and/or other robotic devices). In one implementation, the robotic device may comprise a camera configured to process still and/or video images using, inter alia, diffusively coupled photoreceptive layer described in the resent disclosure. In some implementations, the processing may comprise image encoding and/or image compression, using for example processing neuron layer. In some implementations, higher responsiveness of the diffusively coupled photoreceptive layer may advantageously be utilized in rover navigation and/or obstacle avoidance.

Returning now to FIG. 10A, the input 1002 may be received and encoded by the encoder 1010 using inter alia, horizontal cone connectivity architecture described in detail supra. In one or more implementations, the encoded output 1032 may be coupled to processing apparatus 1040, configured to perform further processing. In some implementations, the encoded output 1032 may be buffered/stored prior to processing. In some implementations, the processing apparatus 1040 may be embodied in a server that is remote from the encoder 1010.

In one implementation, illustrated in FIG. 10A, the processing apparatus 1040 may comprise a neural spiking network configured to detect an object and/or object features using, for example, context aided object recognition methodology. In this implementation, the encoder 1010 may comprise neuronal output layer (e.g., the layer 324 in FIG. 3). In one variant, the encoded signal 1044 may comprise a plurality of pulses (also referred to as a group of pulses), transmitted from the encoder 1010 via multiple connections (also referred to as transmission channels, communication channels, or synaptic connections) 1044 to one or more neuronal nodes (also referred to as the detectors) 1042 of the spiking network apparatus 1040.

In the implementation of FIG. 10A, different detectors of the same hierarchical layer may be denoted by a "_n" designator, such that e.g., the designator 1042_1 denotes the first detector of the layer 1042. Although only two detectors (1042_1, 1042_n) are shown in the embodiment of FIG. 10A for clarity, it is appreciated that the encoder can be coupled to any number of detector nodes that is compatible with the detection apparatus hardware and software limitations. Furthermore, a single detector node may be coupled to any practical number of encoders.

In one implementation, individual ones of the detectors 1042_1, 1042_n may contain logic (which may be implemented as a software code, hardware logic, or a combination of thereof) configured to recognize a predetermined pattern of pulses in the signal 1032, using any of the mechanisms described, for example, in the U.S. patent application Ser. No. 12/869,573, filed Aug. 26, 2010 and entitled "SYSTEMS AND METHODS FOR INVARIANT PULSE LATENCY CODING", U.S. patent application Ser. No. 12/869,583, filed Aug. 26, 2010, entitled "INVARIANT PULSE LATENCY CODING SYSTEMS AND METHODS", U.S. patent application Ser. No. 13/117,048, filed May 26, 2011 and entitled "APPARATUS AND METHODS FOR POLYCHRONOUS ENCODING AND MULTIPLEXING IN NEURONAL PROSTHETIC DEVICES", U.S. patent application Ser. No. 13/152,084, filed Jun. 2, 2011, entitled "APPARATUS AND METHODS FOR PULSE-CODE INVARIANT OBJECT RECOGNITION", to produce post-synaptic detection signals transmitted over communication channels 1048. In FIG. 10A, the designators 1048_1, 1048_n denote output of the detectors 1042_1, 1042_n, respectively.

In one implementation, the detection signals may be delivered to a next layer of the detectors 1052 (comprising detectors 1052_l, 1052_m, 1052_k) for recognition of complex object features and objects, similar to the description found in commonly owned U.S. patent application Ser. No. 13/152, 119, filed Jun. 2, 2011, entitled "SENSORY INPUT PROCESSING APPARATUS AND METHODS". In this implementation, subsequent layers of detectors may be configured to receive signals from the previous detector layer, and to detect more complex features and objects (as compared to the features detected by the preceding detector layer). For example, a bank of edge detectors may be followed by a bank of bar detectors, followed by a bank of corner detectors and so on, thereby enabling alphabet recognition by the apparatus.

Individual ones of the detectors within upstream detector layer 1042 generates detection signals on communication channels 1048_1, 1048_n (with appropriate latency) that propagate with different conduction delays to the detectors of the upper layer of detectors 1052. The detector cascade of the embodiment of FIG. 10A may contain any practical number of detector nodes and detector banks determined, inter alia, by the software/hardware resources of the detection apparatus and complexity of the objects being detected.

The sensory processing apparatus implementation illustrated in FIG. 10A further may comprise feedback connections 1006, 1046. In some variants, connections 1046 may be configured to communicate context information from a detector within the same hierarchy layer, also referred to as the lateral context illustrated by the connection 1046_1 in FIG. 10A. In another variant, connections 1046 may be configured to communicate context information from detectors within other hierarchy layer, also referred to as the context feedback illustrated by the connections 1046_2, 1046_3 in FIG. 10A. In another variant, connection 1006 may be configured to provide feedback to the encoder 1010 thereby facilitating sensory input encoding.

Ambient Visual Input Encoder

FIGS. 10A-B, illustrates some implementations of the retinal encoder 1010 of FIG. 10A useful for visual encoding application. The processing system 1050 may comprise retinal encoder 1056, adapted for use in a retinal prosthetic device. The encoder 1056 of the prosthetic device 1050 may be disposed in front of the eye retina so that it receives ambient light stimulus 1052 captured through, inter alia, optics of the eye. The encoder 1052 may encode input 1052, in accordance with any of the methodologies described supra. In this implementation, the encoder 1056 may be configured according, for example, to the encoder 340 of FIG. 3B, with the interface block 354 configured to implement current drive output 1058. The encoder output 1058 may be adapted to interface to natural RGCs (via, e.g., a plurality of stimulating electrodes, of the eye, and provides, current stimulus to RGC neurons using any of the available methodologies, such as, for example, described in U.S. patent application Ser. No. 13/117,048, filed May 26, 2011, entitled "APPARATUS AND METHODS FOR POLYCHRONOUS ENCODING AND MULTIPLEXING IN NEURONAL PROSTHETIC DEVICES", incorporated supra.

In some implementations, such as, for example, encoding of light gathered by a lens 1064 in visual capturing device 1160 (e.g., telescope, motion or still camera, microscope), illustrated in FIG. 10B, this visual input may comprise ambient light stimulus 1062 captured by, inter alia, device lens 1064.

In some implementations, the lens encoder 1066 of the video capturing device 1060 may be coupled to the output of the device imager (e.g., CCD, or an active-pixel sensor array) so that it receives and encode the input 1062, in accordance with the methodology described supra. In one or more implementations, the retinal encoder 1066 may comprise the pixel array, as illustrated, for example, in the encoder implementation 310 shown in FIG. 3.

The encoder 1066 may comprise neuronal output block (e.g., the block 324 of FIG. 3) configured to encode the cone layer output into spike timing output stream 1068. Such encoding may advantageously effect compression of visual information thereby reducing data processing and transmission load during subsequent data manipulation.

It will be appreciated by those skilled in the art that the encoder apparatus 1056, 1066 may be also used to process inputs of various electromagnetic wavelengths, such as for example, visible, infrared, ultraviolet light, and/or combination thereof. Furthermore, the retinal encoder of the disclosure may be equally useful for encoding radio frequency (RF), magnetic, electric, or sound wave information.

Digitized Visual Input Processing

In one or more implementations, such as, for example, the encoder apparatus 1076 configured for digitized visual input in a processing system 1070 described with respect to FIG. 10B, the visual input 1002 of FIG. 10A may comprise digitized frame pixel values (RGB, CMYK, grayscale) refreshed at suitable rate.

The encoder 1076 may comprise neuronal output block (e.g., the block 324 of FIG. 3) configured to encode the cone layer output into spike timing output stream 1078. Such encoding may advantageously effect compression of visual information thereby reducing data processing and transmission load during subsequent data manipulation.

In one or more implementations, the visual capturing device 1160 and/or processing apparatus 1070 may be embodied in a portable visual communications device 1080, such as smartphone, digital camera, security camera, and/or digital video recorder apparatus. The encoder apparatus 1066, 1076 may comprise diffusively coupled photoreceptive array configured using any of the methodologies described herein.

In some implementations the photoreceptive array may effectuate filtering operations, such as for example, described above with respect to FIG. 6. This filtering may be the first step in any video processing and image recognition algorithm, and one of the most costly in the imaging pipeline. Examples include: edge and motion detection, color patch detection, object tracking and recognition. Whether using spiking neural networks or traditional computer vision algorithm, filtering may be the first step.

In one or more implementations, the encoder apparatus 1066, 1076 may further comprise the spiking neuron output layer, configured to encode the photoreceptor output into a plurality of spikes. In some implementations the encoding may be used to compress visual input (e.g., 1062, 1072 in FIG. 10B) in order to reduce bandwidth that may be utilized for transmitting encoded output 1068, 1078 by the apparatus 1080 via wireless communications link.

Computerized Neuromorphic System

Figure 11A:
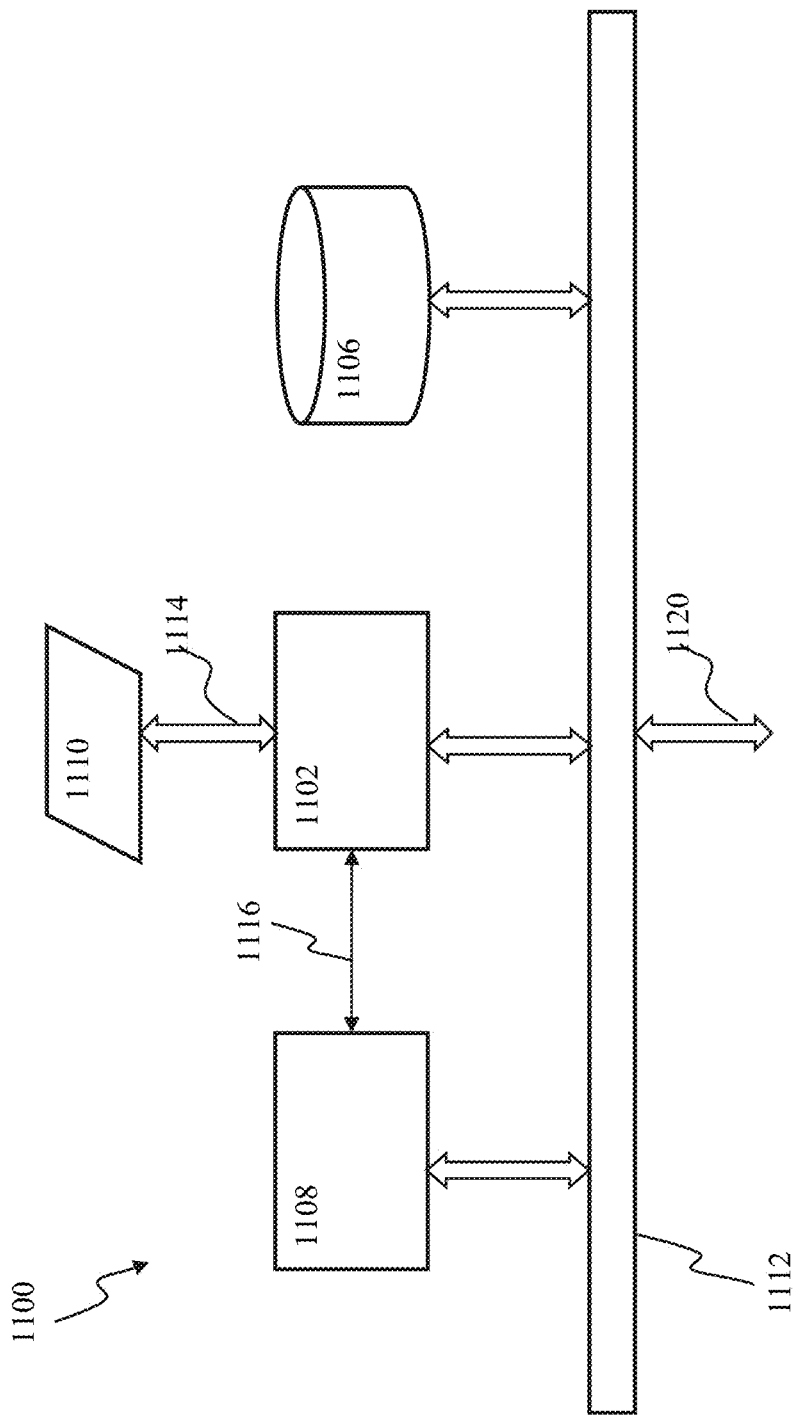
FIG. 11A is a block diagram illustrating computerized system useful with comprising diffusively coupled photoreceptive layer mechanism in accordance with one or more implementations.

One particular implementation of the computerized neuromorphic processing system, for use with artificial retina apparatus described supra, is illustrated in FIG. 11A. The computerized system 1100 of FIG. 11A may comprise an input device 1110, such as, for example, an image sensor, digital image interface, artificial retinal apparatus 310 of FIG. 3A, and/or other components. The input interface 1110 may be coupled to the processing block (e.g., a single or multi-processor block) via the input communication interface 1114. In some implementations, the interface 1114 may comprise wireless interface (e.g., cellular wireless, WiFI, Bluetooth, and/or other wireless interfaces) that enables data transfer to the processor 1102 from remote I/O interface 1100, e.g. One such implementation may comprise central processing apparatus coupled to one or more remote camera devices comprising artificial retina apparatus of the disclosure.

The system 1100 further may comprise a random access memory (RAM) 1108, configured to store neuronal states and connection parameters and to facilitate synaptic updates. In some implementations, synaptic updates may be performed according to the description provided in, for example, in U.S. patent application Ser. No. 13/239,255 filed Sep. 21, 2011, entitled "APPARATUS AND METHODS FOR SYNAPTIC UPDATE IN A PULSE-CODED NETWORK", incorporated by reference supra In some implementations the memory 1108 may be coupled to the processor 1102 via a direct connection (memory bus) 1116. In one or more implementations the memory 1108 may be coupled to the processor 1102 via a high-speed processor bus 1112). In some implementations, the memory 1108 may be embodies within the processor block 1102.

The system 1100 may further comprise a nonvolatile storage device 1106, comprising, inter alia, computer readable instructions configured to implement various aspects of spiking neuronal network operation (e.g., sensory input encoding, connection plasticity, operation model of neurons, and/or other aspects of spiking neuronal network operation). In one or more implementations, the nonvolatile storage 1106 may be used to store state information of the neurons and connections when, for example, saving/loading network state snapshot, or implementing context switching (e.g., saving current network configuration, which may comprise, inter alia, connection weights and update rules, neuronal states and learning rules, and/or other operations) for later use and loading previously stored network configuration.

In some implementations, the computerized apparatus 1100 may be coupled to one or more external processing/storage/input devices via an I/O interface 1120, such as a computer I/O bus (PCI-E), wired (e.g., Ethernet) or wireless (e.g., WiFi) network connection.

It will be appreciated by those skilled in the arts that various processing devices may be used with computerized system 1100, including but not limited to, a single core/multicore CPU, DSP, FPGA, GPU, ASIC, combinations thereof, and/or other processors. Various user input/output interfaces may be similarly applicable to embodiments of the invention including, for example, an LCD/LED monitor, touch-screen input and display device, speech input device, stylus, light pen, trackball, end the likes.

Figure 11B:
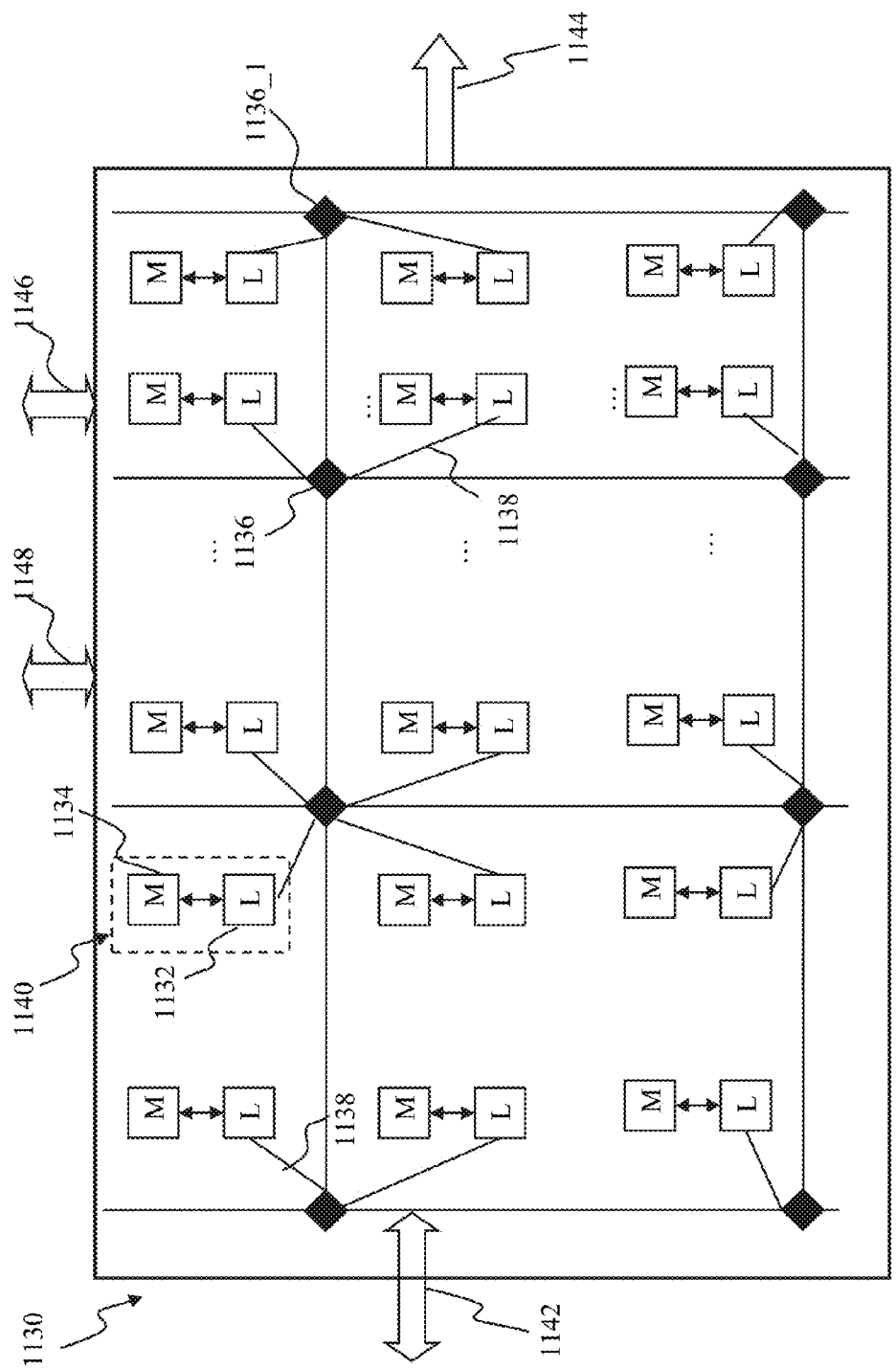
FIG. 11B is a block diagram illustrating neuromorphic computerized system useful with comprising diffusively coupled photoreceptive layer mechanism in accordance with one or more implementations.

FIG. 11B, illustrates one implementation of neuromorphic computerized system configured for use with artificial retina apparatus described supra. The neuromorphic processing system 1130 of FIG. 11B may comprise a plurality of processing blocks (micro-blocks) 1140, where individual micro cores may comprise logic block 1132 and memory block 1134, denoted by 'L' and 'M' rectangles, respectively, in FIG. 11B. The logic block 1132 may be configured to implement various aspects of retina, such as the dynamic model of Eqn. 3-Eqn. 4, layer to layer (e.g., the layer 304 to layer 314 and/or layer 314 to layer 324 in FIG. 3A) mapping, operate neurons of the output layer (e.g., the layer 324) or neurons 1042 of the processing block 1040. In some implementations, the logic block may implement connection updates (e.g., the connections 1044 in FIG. 10) and/or other tasks relevant to network operation. In some implementations, the update rules may comprise rules spike time dependent plasticity (STDP) updates The memory block may be configured to store, inter alia, neuronal state variables and connection parameters (e.g., weights, delays, I/O mapping) of connections 1138.

One or more micro-blocks 1140 may be interconnected via connections 1138 and routers 1136. In one or more implementations (not shown), the router 1136 may be embodied within the micro-block 1140. As it is appreciated by those skilled in the arts, the connection layout in FIG. 11B is exemplary and many other connection implementations (e.g., one to all, all to all, and/or other connection implementations) may be compatible with the disclosure.

The neuromorphic apparatus 1130 may be configured to receive input (e.g., visual input) via the interface 1142. In one or more implementations, applicable for example to interfacing with computerized spiking retina, or image array. The apparatus 1130 may, in some implementations, provide feedback information via the interface 1142 to facilitate encoding of the input signal.

The neuromorphic apparatus 1130 may be configured to provide output (e.g., an indication of recognized object or a feature, or a motor command, e.g., to zoom/pan the image array) via the interface 1144.

The apparatus 1130, in one or more implementations, may interface to external fast response memory (e.g., RAM) via high bandwidth memory interface 1148, thereby enabling storage of intermediate network operational parameters (e.g., spike timing, and/or other intermediate network operation parameters). In one or more implementations, the apparatus 1130 may also interface to external slower memory (e.g., flash, or magnetic (hard drive)) via lower bandwidth memory interface 1146, in order to facilitate program loading, operational mode changes, and retargeting, where network node and connection information for a current task may be saved for future use and flushed, and previously stored network configuration may be loaded in its place, as described for example in co-owned U.S. patent application Ser. No. 13/487,576, filed Jun. 4, 2012, entitled "DYNAMICALLY RECONFIGURABLE STOCHASTIC LEARNING APPARATUS AND METHODS", incorporated herein by reference in its entirety.

Figure 11C:
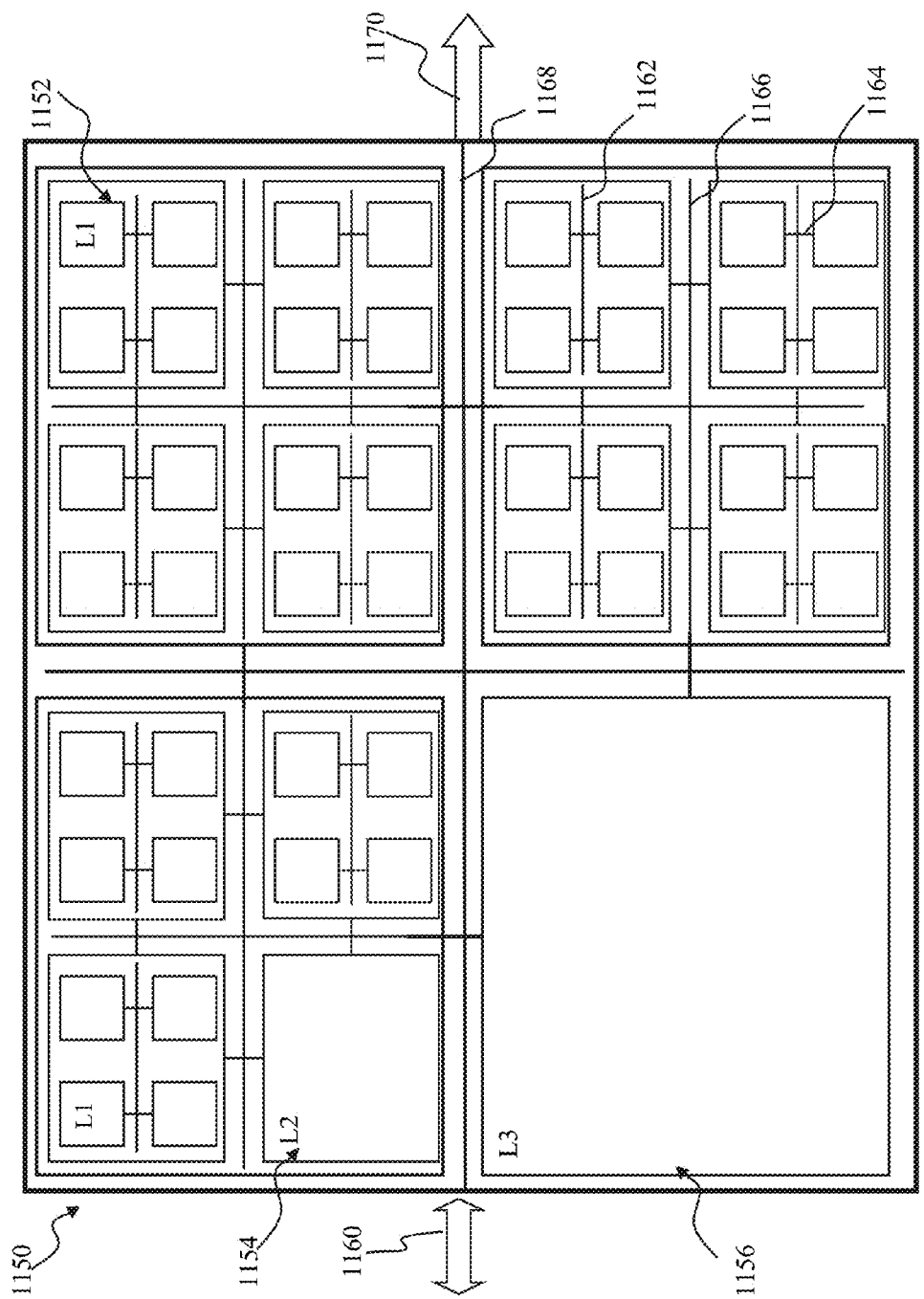
FIG. 11C is a block diagram illustrating hierarchical neuromorphic computerized system architecture useful with retinal encoder apparatus configured in accordance with one or more implementations.

FIG. 11C, illustrates one implementation of cell-based hierarchical neuromorphic system architecture configured to retinal encoding. The neuromorphic system 1150 of FIG. 11C may comprise a hierarchy of processing blocks (cells block) 1140. In some implementations, the lowest level L1 cell 1152 of the apparatus 1150 may comprise logic and memory and may be configured similar to the micro block 1140 of the apparatus shown in FIG. 11B, supra. A number of cell blocks 1052 may be arranges in a cluster 1154 and communicate with one another via local interconnects 1162, 1164. Individual ones of such clusters may form higher level cell, e.g., cell denoted L2 in FIG. 11C. Similarly several L2 level clusters may communicate with one another via a second level interconnect 1166 and form a super-cluster L3, denoted as 1156 in FIG. 11C. The super-clusters 1156 may communicate via a third level interconnect 1168 and may form a higher-level cluster, and so on. It will be appreciated by those skilled in the arts that hierarchical structure of the apparatus 1150, comprising four cells-per-level may comprise one exemplary implementation and other implementations may comprise more or fewer cells/level and/or fewer or more levels.

Different cell levels (e.g., L1, L2, L3) of the apparatus 1150 may be configured to perform functionality various levels of complexity. In one implementations, different L1 cells may process in parallel different portions of the visual input (e.g., encode different frame macro-blocks), with the L2, L3 cells performing progressively higher level functionality (e.g., edge detection, object detection). In some implementations, different L2, L3, cells may perform different aspects of operating, for example, a robot, with one or more L2/L3 cells processing visual data from a camera, and other L2/L3 cells operating motor control block for implementing lens motion what tracking an object or performing lens stabilization functions.

The neuromorphic apparatus 1150 may receive visual input (e.g., the input 1002 in FIG. 10) via the interface 1160. In one or more implementations, applicable for example to interfacing with computerized spiking retina, or image array, the apparatus 1150 may provide feedback information via the interface 1160 to facilitate encoding of the input signal.

The neuromorphic apparatus 1150 may provide output (e.g., an indication of recognized object or a feature, or a motor command, e.g., to zoom/pan the image array) via the interface 1170. In some implementations, the apparatus 1150 may perform the I/O functionality using single I/O block (e.g., the I/O 1160 of FIG. 11C).

The apparatus 1150, in one or more implementations, may interface to external fast response memory (e.g., RAM) via high bandwidth memory interface (not shown), thereby enabling storage of intermediate network operational parameters (e.g., spike timing, and/or other intermediate network operational parameters). In one or more implementations, the apparatus 1150 may also interface to a larger external memory (e.g., flash, or magnetic (hard drive)) via a lower bandwidth memory interface (not shown), in order to facilitate program loading, operational mode changes, and retargeting, where network node and connection information for a current task may be saved for future use and flushed, and previously stored network configuration may be loaded in its place, as described for example in co-owned U.S. patent application Ser. No. 13/487,576, filed Jun. 4, 2012, entitled "DYNAMICALLY RECONFIGURABLE STOCHASTIC LEARNING APPARATUS AND METHODS", incorporated supra.

Performance Results

FIGS. 13A through 14B present performance results obtained during simulation and testing by the Assignee hereof, of exemplary retinal encoding apparatus (e.g., the apparatus 310 of FIG. 3A) configured in accordance with the state dynamics described by Eqn. 3-Eqn. 4.

The retinal apparatus 310 used in the simulations may be configured as follows: the input layer may comprise a square array of 40×40 pixels (the layer 303 in FIG. 3A); the photoreceptive layer may comprise 40×40 cones of the same type (L), thereby effectuating one to one connection map 312 between the pixel and the photoreceptive layer. The output layer 324 of the retinal encoder used in the simulations may comprise spiking neural network. The network may be operated using iterative approach (steps) where cone layer and neuron layer responses may be updated at predetermined intervals. In some implementations, the update interval may be configured at 1 ms.

The cone layer used in the simulations may be configured as follows:

1600 cones arranged in 40×40 square grid with d=0.1 deg cone-to-cone spacing;

the diffusion parameter is selected D=0.4 deg$^2$/s;

the current and voltage decay timescales are: $\tau_c$=0.1 s, $\tau_h$=0.3 s; and damping parameter $\alpha=1/\tau_c$=10 Hz.

In some implementations, vertically oriented Gabor pattern I(x,y,t) input stimulus was used in the simulations:

$$I(y, t) = 1000 \ \exp\left(-\frac{(x-x_0)^2}{0.04}\right)\sin(10(x-x_0)) \quad \text{(Eqn. 19)}$$

The stimulus of Eqn. 19 was moved horizontally (in some implementations) with the speed of v=3 deg/s along the line $x_0$=−0.3+vt [deg]. The simulation run comprised 6000 steps at 1×10$^{-4}$ s interval covering to the time span between 0 and 0.6 s.

At the beginning of a given simulation, the value of the averaging parameter $\tau_{bar}$ may be configured on the order of $\tau_{bar}^{(0)}$=0.002 s. During simulations, the averaging parameter may be adjusted at individual iterations and reaches its appropriate value, which is $\tau_{bar}^{(\infty)}$=0.2 s in some implementations. Such configuration facilitates rapid adaptation of the retinal output f(t) during the beginning stages of simulation, and prevent silence or exuberant activity during the first several seconds (1-2 s in some implementations) from the onset of new stimulus.

FIGS. 13A-13B show response of the retina photoreceptive block, comprising an array of 40×40 diffusively coupled cones, to incoherent and coherent stimulus, respectively. The responses energies $\bar{c}(t)$, $\bar{h}(t)$ may be determined as:

$$\bar{c}(t) = \Sigma_i^N c_i^2(t) \quad \text{(Eqn. 20)}$$

$$\bar{h}(t) = \Sigma_i^N h_i^2(t) \quad \text{(Eqn. 21)}$$

where $c_i(t)$, $h_i(t)$ are the individual cone responses described by Eqn. 3-Eqn. 4, respectively. In FIGS. 13A-13B, the total stimulus, described by Eqn. 3, may comprise the same total energy, as depicted by the broken curves 1302, 1312. As seen from comparing broken curves denoted 1304, 1314 in FIGS. 13A-13B, the photoreceptive layer produces similar membrane current response energy $\bar{c}(t)$ to incoherent and coherent stimulus as it is dominated by the local input $I_i(t)$. However, membrane voltage $\bar{h}(t)$ of diffusively coupled cone layer responds substantially stronger (3-4 times) to coherent stimulus (curve 1306 in FIG. 13B) as compared to the incoherent stimulus (the curve 1306 in FIG. 13A). The result observed in FIG. 13B may be achieved partly due to horizontal connections $D_{ij}(h_j-h_i)$. In a coherent stimulus the input may be similar to nearby cones and/or follows the damped wave of h(x,t). This the term $D_{ij}(h_j-h_i)$ may be reinforced by the nearby cones that counteract effects of attenuation. For incoherent stimulus, the term $D_{ij}(h_j-h_i)$ may be relatively large due to a transiently large difference between h of the nearby cones. This leads to a stronger attenuation of the voltage parameter h(t) compared to the coherent stimulus.

FIGS. 14A-14B illustrate spatial response of the diffusively coupled cone array to incoherent and coherent stimulus, respectively. The data shown in FIGS. 14A-14B, correspond to the time instant denoted by the arrows 1308, 1318 in FIGS. 13A, 13B, respectively. Similarly to experiments described with respect to FIGS. 13A-13B, the total stimulus for FIGS. 14A-14B, may comprise the same total energy. Panel 1402 in FIG. 14A shows random distribution of input pixels over the 40×40 pixel grid. Panels 1404, 1406 in FIG. 14A depict cone current c(y) and voltage h(t) response, respectively to incoherent stimulus 1402, illustrating low-amplitude smeared (due to diffusion) cone voltage output of incoherent stimulus.

Contrast this with the output of the photoreceptive layer responsive to coherent stimulus depicted in panel 1412 of FIG. 14B. The current response c(t) shown in panel 1414 and voltage response h(t) shown in panel 1416 show consistent coherent cone response of greater magnitude, compared to data shown in the panel 1406.

Exemplary Uses and Applications of Certain Aspects of the Disclosure

Various aspects of the disclosure may advantageously be applied to design and operation of apparatus configured to process visual data.

Results presented in FIGS. 13A-14B confirm improved response of the diffusively coupled photoreceptive layer to coherent stimulus, which advantageously may facilitate object recognition (e.g., edge detection in panel 1416 of FIG. 14B). In one or more implementations, such coherent stimulus may comprise moving, rotating, looming, and/or receding object, and/or color or luminance feature (e.g., a stripe of a different color on a car roof, and/or other color or luminance features), and/or other coherent stimulus. The result observed in FIG. 13B may be achieved partly due to horizontal connections between adjacent cones.

In some implementations, diffusive coupling structure of the cone layer may allow for simplified connections between the cones. In one or more implementations, such simplified connectivity may be configured to reduce (or eliminate altogether) built-in (hard wired) delays presently used by the prior art. Hence, an apparatus utilizing diffusive connectivity of the present disclosure may reduce hardware complexity, and/or cost and improve performance and flexibility.

In some implementations, horizontal diffusive cone connectivity described herein advantageously enables the use of a single connection between a neuron unit and a cone in order to cause generation of the DoG spatial retina response, depicted by the curve 560_1 in FIG. 5C. Coupling the photoreceptive block to the output block via a different connection (e.g., the connection 552-2 to the output unit 564_2 in FIG. 5C), may cause a different spatial retina response, such as depicted by the curve 560_2 in FIG. 5C. Retinal configuration illustrated in FIG. 5C, provides for the desired spatial response, with fewer connections, compared to the configuration of prior art, illustrated in FIG. 1, where several connection may be required in order to obtain the DoG response. While in the prior art implementations, the DoG filters may be applied to the input image, the DoG property of the retinal apparatus of the disclosure emerges through dynamical interaction within the cone layer.

The principles described herein may be combined with other mechanism of data encoding in neural networks, as described in, for example, co-owned and co-pending U.S. patent application Ser. No. 13/152,084 entitled "APPARATUS AND METHODS FOR PULSE-CODE INVARIANT OBJECT RECOGNITION", filed Jun. 2, 2011, co-owned and co-pending U.S. patent application Ser. No. 13/152,119, Jun. 2, 2011, entitled "SENSORY INPUT PROCESSING APPARATUS AND METHODS", and co-owned U.S. patent application Ser. No. 13/152,105 filed on Jun. 2, 2011, and entitled "APPARATUS AND METHODS FOR TEMPORALLY PROXIMATE OBJECT RECOGNITION", incorporated, supra.

Exemplary implementations of the present innovation may be useful in a variety of applications including without limitation visual prosthetics, autonomous and robotic apparatus, and other electromechanical devices requiring video processing functionality. Examples of such robotic devices may include one or more of manufacturing robots (e.g., automotive), military robots, medical robots (e.g. processing of microscopy, x-ray, ultrasonography, tomography), and/or other types of robotic devices. Examples of autonomous vehicles may include one or more of rovers, unmanned air vehicles, underwater vehicles, smart appliances (e.g. ROOMBA®), and/or other autonomous vehicles.

Implementations of the principles of the disclosure may be applicable to video data processing (e.g., compression) in a wide variety of stationary and portable video devices, such as, for example, smart phones, portable communication devices, notebook, netbook and tablet computers, surveillance camera systems, and practically any other computerized device configured to process vision data Implementations of the principles of the disclosure may be further applicable to a wide assortment of applications including computer human interaction (e.g., recognition of gestures, voice, posture, face, and/or other computer human interactions), controlling processes (e.g., an industrial robot, autonomous and/or other vehicles, and/or other processes), augmented reality applications, organization of information (e.g., for indexing databases of images and image sequences), access control (e.g., opening a door based on a gesture, opening an access way based on detection of an authorized person), detecting events (e.g., for visual surveillance or people or animal counting, tracking), data input, financial transactions (payment processing based on recognition of a person or a special payment symbol), and/or other applications.

The disclosure can be used to simplify tasks related to motion estimation, such as where an image sequence may be processed to produce an estimate of the object position and velocity either at individual points in the image or in the 3D scene, or even of the camera that produces the images. Examples of such tasks may include: ego motion, i.e., determining the three-dimensional rigid motion (rotation and translation) of the camera from an image sequence produced by the camera; following the movements of a set of interest points or objects (e.g., vehicles or humans) in the image sequence and with respect to the image plane; and/or other tasks.

In another approach, portions of the object recognition system may be embodied in a remote server, comprising a computer readable apparatus storing computer executable instructions configured to perform pattern recognition in data streams for various applications, such as scientific, geophysical exploration, surveillance, navigation, data mining (e.g., content-based image retrieval), and/or other applications. Myriad other applications exist that will be recognized by those of ordinary skill given the present disclosure.

Although the system(s) and/or method(s) of this disclosure have been described in detail for the purpose of illustration based on what is currently considered to be the most practical and preferred implementations, it is to be understood that such detail is solely for that purpose and that the disclosure is not limited to the disclosed implementations, but, on the contrary, is intended to cover modifications and equivalent arrangements that are within the spirit and scope of the appended claims. For example, it is to be understood that the present disclosure contemplates that, to the extent possible, one or more features of any implementation can be combined with one or more features of any other implementation.

What is claimed:

1. A sensory processing system, comprising:
    an encoder apparatus comprising:
        a plurality of sensing elements, each of said plurality of sensing elements being configured to receive one or more sensory stimulus; and
        a plurality of output nodes, each configured to generate an output based on said one or more sensory stimulus; and
    a detector apparatus coupled to said encoder apparatus;
    wherein:
        a coupling of each output node of said plurality of output nodes to one and only one sensing element of said plurality of sensing elements via a single connection is configured to cause a generation of said output by said each output node;

said each output node is characterized by a spatial sensitivity to said one or more sensory stimulus, said spatial sensitivity being configured based on a summation of a plurality of responses from a subset of elements of said plurality of sensing elements;

said plurality of responses is characterized by:
- a first Gaussian spatial distribution having a first width parameter and positive weights associated therewith; and
- a second Gaussian spatial distribution having a second width parameter and negative weights associated therewith; and
- said first Gaussian distribution and said second Gaussian distributions cooperate to effectuate a difference of Gaussians (DoG) spatial response sensitivity to said one or more sensory stimulus by said output node, said response sensitivity being characterized by an effective width.

2. The system of claim 1, wherein:
said effective width is determined based on number of elements within said subset; and
said summation is configured to be communicated to said output node via said single connection.

3. The system of claim 2, wherein:
said one or more sensory stimulus comprises an image;
said output comprises a plurality pulses configured to be communicated via a plurality of channels;
at least one characteristic associated with said image is encoded as a pattern of relative pulse latencies observable in pulses communicated through said plurality of channels; and
said pattern of relative pulse latencies is insensitive to one or more of image contrast and image luminance.

4. The system of claim 3, further comprising a plurality of encoder apparatus coupled to said detector apparatus;
wherein said plurality of encoders is configured to:
receive a plurality pixel streams, at least a portion of said plurality of pixel streams comprising a representation of at least one other object; and
encode said plurality of pixel streams into a plurality of pulse streams thereby attaining a compression rate; and
wherein said detector apparatus is configured to generate at least one other detection signal based on a match of at least said pattern to a template associated with said at least one other object.

5. The system of claim 3, wherein said processing comprises compression of said image by a factor of at least 1000.

6. The system of claim 3, wherein said one or more sensory stimulus comprises a stream of pixel values, comprising a representation of an object; and
wherein said detector apparatus is configured to generate a detection signal based on matching said pattern to a template associated with said object.

7. The system of claim 6, wherein:
said object is characterized by a first linear dimension and a second linear dimension, said second dimension being greater than said first dimension; and
said one or more sensory stimulus comprises a grating input associated with a displacement of said object in a direction of at least said first dimension.

8. The system of claim 1, wherein:
a number of said plurality of output nodes matches a number of said plurality of sensing elements;

each of said plurality of output nodes is configured to receive a plurality of responses signal from a subset of elements of said plurality of sensing elements via said single connection;

each of said plurality of output nodes is characterized by a receptive field having a difference of Gaussians (DoG) spatial response sensitivity to said one or more sensory stimulus associated therewith; and said effective width of said DoG spatial response sensitivity is configured based on said plurality of responses.

9. A sensory processing system, comprising:
an encoder apparatus comprising:
a plurality of sensing elements, each of said plurality of sensing elements being configured to receive one or more sensory stimulus; and
a plurality of output nodes, each configured to generate an output based on said one or more sensory stimulus; and
a detector apparatus coupled to said encoder apparatus;
wherein:
a coupling of each output node of said plurality of output nodes to one and only one sensing element of said plurality of sensing elements via a single connection is configured to cause a generation of said output by said each output node;
a number of said plurality of output nodes matches a number of said plurality of sensing elements;
each of said plurality of output nodes is configured to receive a plurality of responses signal from a subset of elements of said plurality of sensing elements via said single connection;
each of said plurality of output nodes is characterized by a receptive field having a difference of Gaussians (DoG) spatial response sensitivity to said one or more sensory stimulus associated therewith; and
an effective width of said DoG spatial response sensitivity is configured based on said plurality of responses.

10. The system of claim 9, wherein said sensory processing system comprises at least a portion of a visual processing apparatus embodied in a communications apparatus configured to communicate at least a portion of said output via a remote link.

11. The system of claim 10, wherein:
said communications apparatus comprises a smart phone; and
said remote link comprises a cellular wireless link.

12. The system of claim 11, wherein:
said communications apparatus comprises a security camera; and
said remote link comprises either a radio link or a wired network connection.

13. The system of claim 9, wherein:
said each output node is characterized by a spatial sensitivity to said one or more sensory stimulus, said spatial sensitivity being configured based on a summation of a plurality of responses from a subset of elements of said plurality of sensing elements;
said plurality of responses is characterized by:
a first Gaussian spatial distribution having a first width parameter and positive weights associated therewith; and
a second Gaussian spatial distribution having a second width parameter and negative weights associated therewith; and
said first Gaussian distribution and said second Gaussian distributions cooperate to effectuate a difference of Gaussians (DoG) spatial response sensitivity to said one or more sensory stimulus by said output node, said response sensitivity being characterized by said effective width.

14. A sensory processing apparatus, comprising:
an encoder apparatus comprising:
  a plurality of sensing elements, each configured to receive one or more sensory stimulus; and
  a plurality of output nodes, each configured to generate an output based on said stimulus;
a detector apparatus coupled to said encoder apparatus; and
at least a portion of a visual processing apparatus embodied in a communications apparatus configured to communicate at least a portion of said output via a remote link;
wherein:
  a coupling of each output node of said plurality of output nodes to one and only one sensing element of said plurality of sensing elements via a single connection is configured to cause a generation of said output by said each output node;
  said each output node is characterized by a spatial sensitivity to said one or more sensory stimulus, said spatial sensitivity being configured based on a summation of a plurality of responses from a subset of elements of said plurality of sensing elements;
  said plurality of responses is characterized by:
    a first Gaussian spatial distribution having a first width parameter and positive weights associated therewith; and
    a second Gaussian spatial distribution having a second width parameter and negative weights associated therewith; and
  said first Gaussian distribution and said second Gaussian distributions cooperate to effectuate a difference of Gaussians (DoG) spatial response sensitivity to said one or more sensory stimulus by said output node, said response sensitivity being characterized by an effective width.

15. The apparatus of claim 14, wherein:
said effective width is determined based on number of elements within said subset; and
said summation is configured to be communicated to said output node via said single connection.

16. The apparatus of claim 15, wherein:
said one or more sensory stimulus comprises an image;
said output comprises a plurality pulses configured to be communicated via a plurality of channels;
at least one characteristic associated with said image is encoded as a pattern of relative pulse latencies observable in pulses communicated through said plurality of channels; and
said pattern of relative pulse latencies is insensitive to one or more of image contrast and image luminance.

17. The apparatus of claim 16, further comprising a plurality of encoder apparatus coupled to said detector apparatus;
wherein said plurality of encoders is configured to:
  receive a plurality pixel streams, at least a portion of said plurality of pixel streams comprising a representation of at least one other object; and
  encode said plurality of pixel streams into a plurality of pulse streams, thereby attaining a compression rate; and
wherein said detector apparatus is configured to generate at least one other detection signal based on a match of at least said pattern to a template associated with said at least one other object.

18. The apparatus of claim 16, wherein said processing comprises compression of said image by a factor of at least 1000.

19. The apparatus of claim 16, wherein said one or more sensory stimulus comprises a stream of pixel values comprising a representation of an object; and
wherein said detector apparatus is configured to generate a detection signal based on matching said pattern to a template associated with said object.

20. The apparatus of claim 19, wherein:
said object is characterized by a first linear dimension and a second linear dimension, said second dimension being greater than said first dimension, and
said one or more sensory stimulus comprises a grating input associated with a displacement of said object in a direction of at least said first dimension.

21. The apparatus of claim 14, wherein:
a number of said plurality of output nodes matches a number of said plurality of sensing elements;
each of said plurality of output nodes is configured to receive a plurality of responses signal from a subset of elements of said plurality of sensing elements via said single connection;
each of said plurality of output nodes is characterized by a receptive field having a difference of Gaussians (DoG) spatial response sensitivity to said one or more sensory stimulus associated therewith; and
said effective width of said DoG spatial response sensitivity is configured based on said plurality of responses.

22. The apparatus of claim 14, wherein:
said communications apparatus comprises a smart phone; and
said remote link comprises a cellular wireless link.

23. The apparatus of claim 22, wherein:
said communications apparatus comprises a security camera; and
said remote link comprises either a radio link or a wired network connection.

* * * * *